United States Patent
Huang et al.

(10) Patent No.: US 11,637,101 B2
(45) Date of Patent: Apr. 25, 2023

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Wang-Chun Huang, Kaohsiung (TW); Hou-Yu Chen, Hsinchu County (TW); Kuan-Lun Cheng, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 237 days.

(21) Appl. No.: 17/115,679

(22) Filed: Dec. 8, 2020

(65) Prior Publication Data
US 2021/0375857 A1 Dec. 2, 2021

Related U.S. Application Data

(60) Provisional application No. 63/029,918, filed on May 26, 2020.

(51) Int. Cl.
*H01L 27/088* (2006.01)
*H01L 29/06* (2006.01)
(Continued)

(52) U.S. Cl.
CPC .... *H01L 27/088* (2013.01); *H01L 21/823475* (2013.01); *H01L 21/823481* (2013.01);
(Continued)

(58) Field of Classification Search
CPC ......... H01L 21/02603; H01L 21/76895; H01L 21/76897; H01L 21/823475;
(Continued)

(56) References Cited

U.S. PATENT DOCUMENTS 9,209,247 B2   12/2015 Colinge et al.
9,236,267 B2   1/2016  De et al.
(Continued)

FOREIGN PATENT DOCUMENTS

TW   201724270 A   7/2017
TW   201801323 A   1/2018
(Continued)

*Primary Examiner* — David C Spalla
(74) *Attorney, Agent, or Firm* — Maschoff Brennan

(57) ABSTRACT

A semiconductor device includes a gate structure, a source/drain epitaxial structure, a front-side interconnection structure, a backside via, an isolation material, and a sidewall spacer. The source/drain epitaxial structure is on a side of the gate structure. The front-side interconnection structure is on a front-side of the source/drain epitaxial structure. The backside via is connected to a backside of the source/drain epitaxial structure. The isolation material is on a side of the backside via and in contact with the gate structure. The sidewall spacer is sandwiched between the backside via and the isolation material. A height of the isolation material is greater than a height of the sidewall spacer.

20 Claims, 52 Drawing Sheets

(51) Int. Cl.
*H01L 29/786* (2006.01)
*H01L 29/423* (2006.01)
*H01L 21/8234* (2006.01)

(52) U.S. Cl.
CPC .... *H01L 29/0665* (2013.01); *H01L 29/42392* (2013.01); *H01L 29/78618* (2013.01); *H01L 29/78696* (2013.01)

(58) Field of Classification Search
CPC ......... H01L 21/823481; H01L 23/5226; H01L 23/535; H01L 27/088; H01L 29/0665; H01L 29/0669; H01L 29/0673; H01L 29/66439; H01L 29/775; H01L 29/78618; H01L 29/78696
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,546,936 B2 * | 1/2020 | Radens ............ H01L 29/78696 |
| 2018/0248012 A1 | 8/2018 | Morrow et al. |
| 2019/0067091 A1 | 2/2019 | Morrow et al. |
| 2019/0221649 A1 | 7/2019 | Glass et al. |
| 2020/0294998 A1 * | 9/2020 | Li ..................... H01L 23/53295 |
| 2021/0272904 A1 * | 9/2021 | Komuro ................ H01L 29/775 |
| 2022/0045056 A1 * | 2/2022 | Wang .................. H01L 27/0207 |
| 2022/0139911 A1 * | 5/2022 | Wei ..................... H01L 27/0886 257/365 |

FOREIGN PATENT DOCUMENTS

| | | |
|---|---|---|
| TW | 201814841 A | 4/2018 |
| TW | 202101705 A | 1/2021 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 63/029,918, filed May 26, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
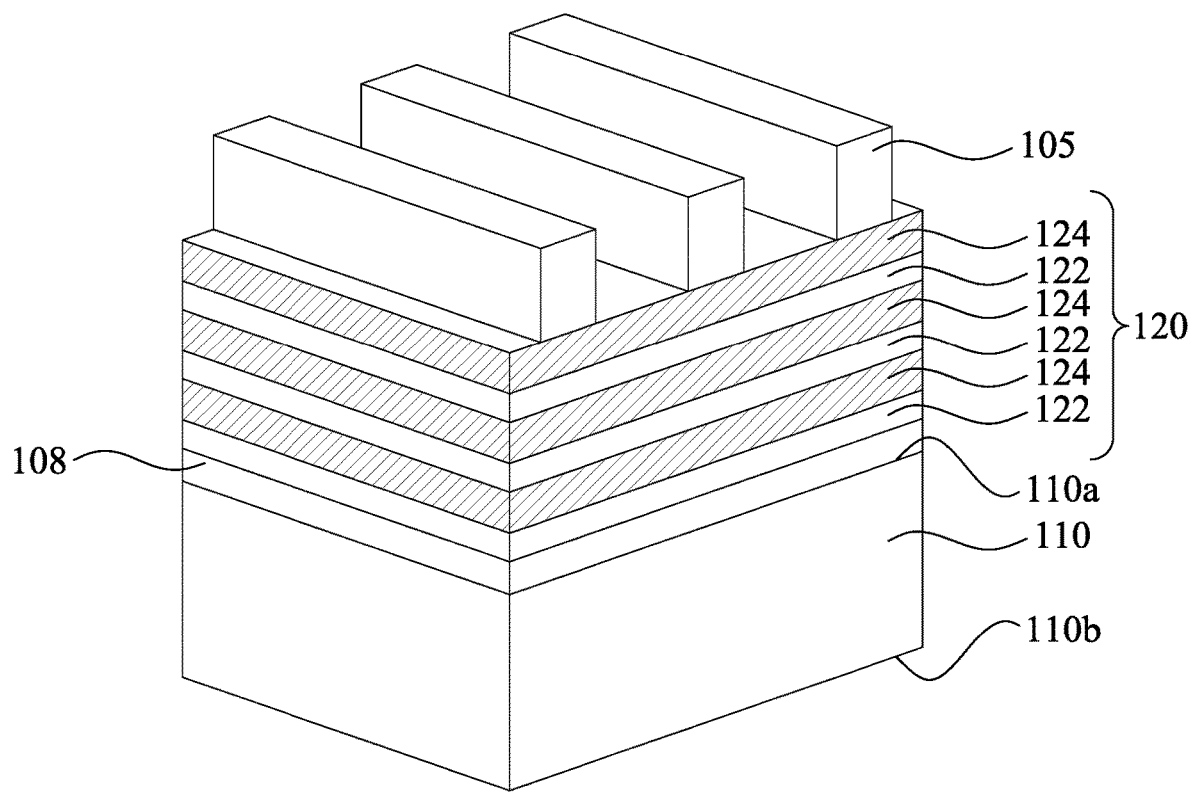
FIGS. 1-20E illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to GAA devices including an enlarged backside via for improving the electrical performance of the backside via. The GAA devices presented herein include a p-type GAA device or an n-type GAA device. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure. For example, some embodiments as described herein may also be applied to FinFET devices, Omega-gate (Ω-gate) devices, and/or Pi-gate (π-gate) devices.

FIGS. 1-20E illustrate a method for manufacturing a semiconductor device at various stages in accordance with some embodiments of the present disclosure. In some embodiments, the semiconductor device shown in FIGS. 1-20E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110, which may be a part of a wafer, is provided. The substrate 110 has a front-side 110a and a backside 110b opposite to the front-side 110a. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A first sacrificial layer 108 is formed on the front-side 110a of the substrate 110. The first sacrificial layer 108 may be epitaxially grown on the substrate 110, such that the first sacrificial layer 108 forms a crystalline layer. The first sacrificial layer 108 and the substrate 110 have different or the same materials and/or components. In some embodiments, the first sacrificial layer 108 is made of silicon germanium (SiGe) or silicon. In some embodiments, the first sacrificial layer 108 is omitted.

A semiconductor stack 120 is formed on the first sacrificial layer 108 through epitaxy, such that the semiconductor stack 120 forms crystalline layers. The semiconductor stack 120 includes first semiconductor layers 122 and second semiconductor layers 124 stacked alternately. The first semiconductor layers 122 and the second semiconductor layers 124 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 122 and the second semiconductor layers 124 are made of Si, a Si compound, SiGe, Ge or a Ge compound. In FIG. 1, three layers of the first semiconductor layer 122 and three layers of the second semiconductor layer 124 are disposed. However, the number of the layers are not limited to three, and may be as small as 1 (each layer) and in some embodiments, 2, or 4-10 layers of each of the first and second semiconductor layers are formed. By adjusting the numbers of the stacked layers, a driving current of the GAA FET device can be adjusted.

In some embodiments, the first semiconductor layers 122 can be SiGe layers having a germanium atomic percentage greater than zero. In some embodiments, the germanium percentage of the first semiconductor layers 122 is in the range between about 15 percent and about 100 percent. In some embodiments, the thickness of the first semiconductor layers 122 is in the range between about 3 nm and about 20 nm.

In some embodiments, the second semiconductor layers 124 may be pure silicon layers that are free from germanium. The second semiconductor layers 124 may also be substantially pure silicon layers, for example, with a germanium atomic percentage lower than about 1 percent. Furthermore, the second semiconductor layers 124 may be intrinsic, which are not doped with p-type and n-type impurities. In some embodiments, the thickness of the second semiconductor layers 124 is in the range between about 3 nm and about 60 nm.

A patterned hard mask 105 is formed over the semiconductor stack 120. In some embodiments, the patterned hard mask 105 is formed of silicon nitride, silicon oxynitride, silicon carbide, silicon carbo-nitride, or the like. The patterned hard mask 105 covers a portion of the semiconductor stack 120 while leaves another portion of the semiconductor stack 120 uncovered.

Figure 2:
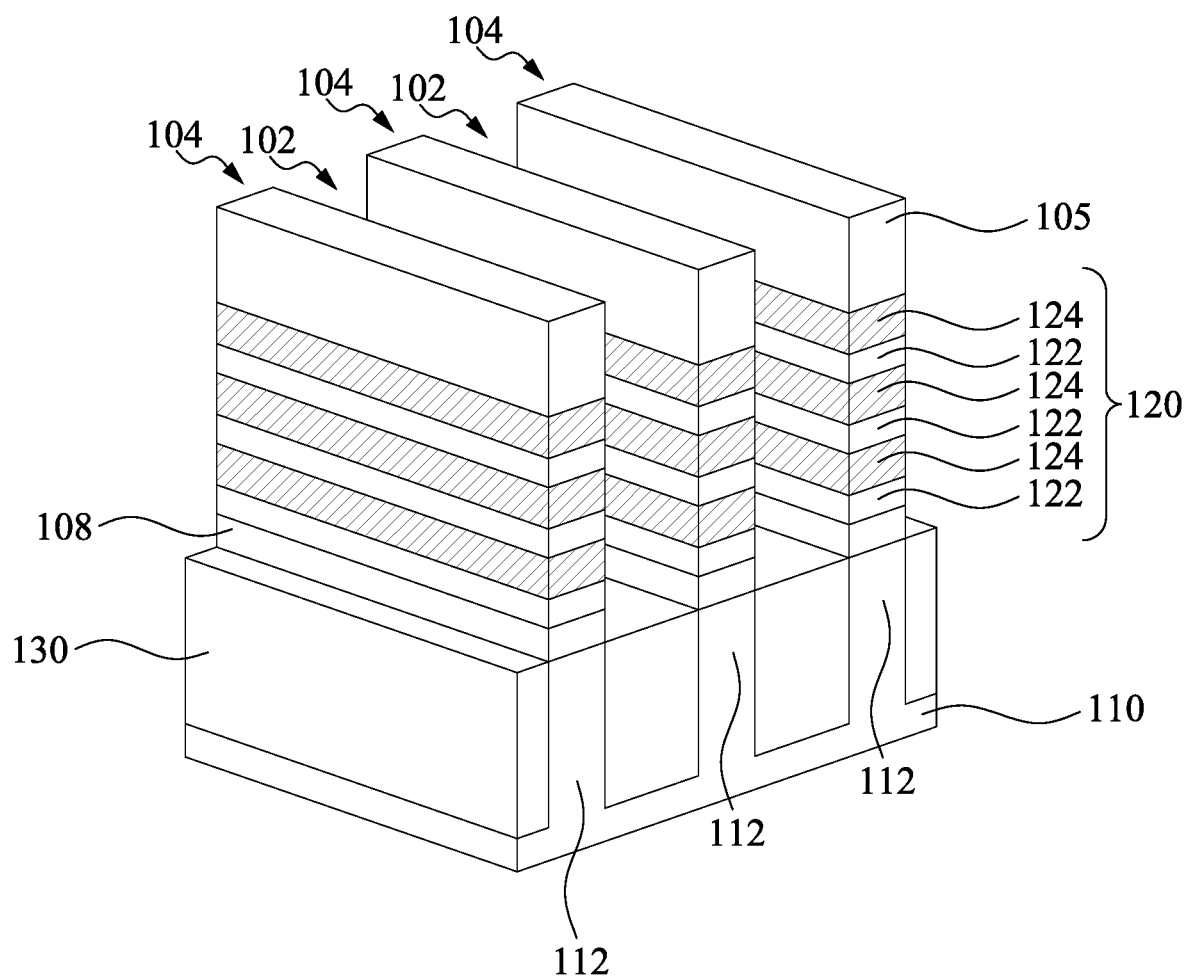

Reference is made to FIG. 2. The semiconductor stack 120, the first sacrificial layer 108, and the substrate 110 of FIG. 1 are patterned using the patterned hard mask 105 as a mask to form trenches 102. Accordingly, a plurality of semiconductor strips 104 are formed. The trenches 102 extend into the substrate 110, and have lengthwise directions substantially parallel to each other. The trenches 102 form base portions 112 in the substrate 110, where the base portions 112 protrude from the substrate 110, and the semiconductor strips 104 are respectively formed above the base portions 112 of the substrate 110. The remaining portions of the semiconductor stack 120 and the sacrificial layer 108 are accordingly referred to as the semiconductor strips 104 alternatively.

Isolation structures 130, which may be shallow trench isolation (STI) regions, are formed in the trenches 102. The formation may include filling the trenches 102 with a dielectric layer(s), for example, using flowable chemical vapor deposition (FCVD), and performing a chemical mechanical polish (CMP) to level the top surface of the dielectric material with the top surface of the hard mask 105. The isolation structures 130 are then recessed. The top surface of the resulting isolation structures 130 may be level with the bottom surface of the first sacrificial layer 108, or may be at an intermediate level between the top surface and the bottom surface of the first sacrificial layer 108.

Figure 3:
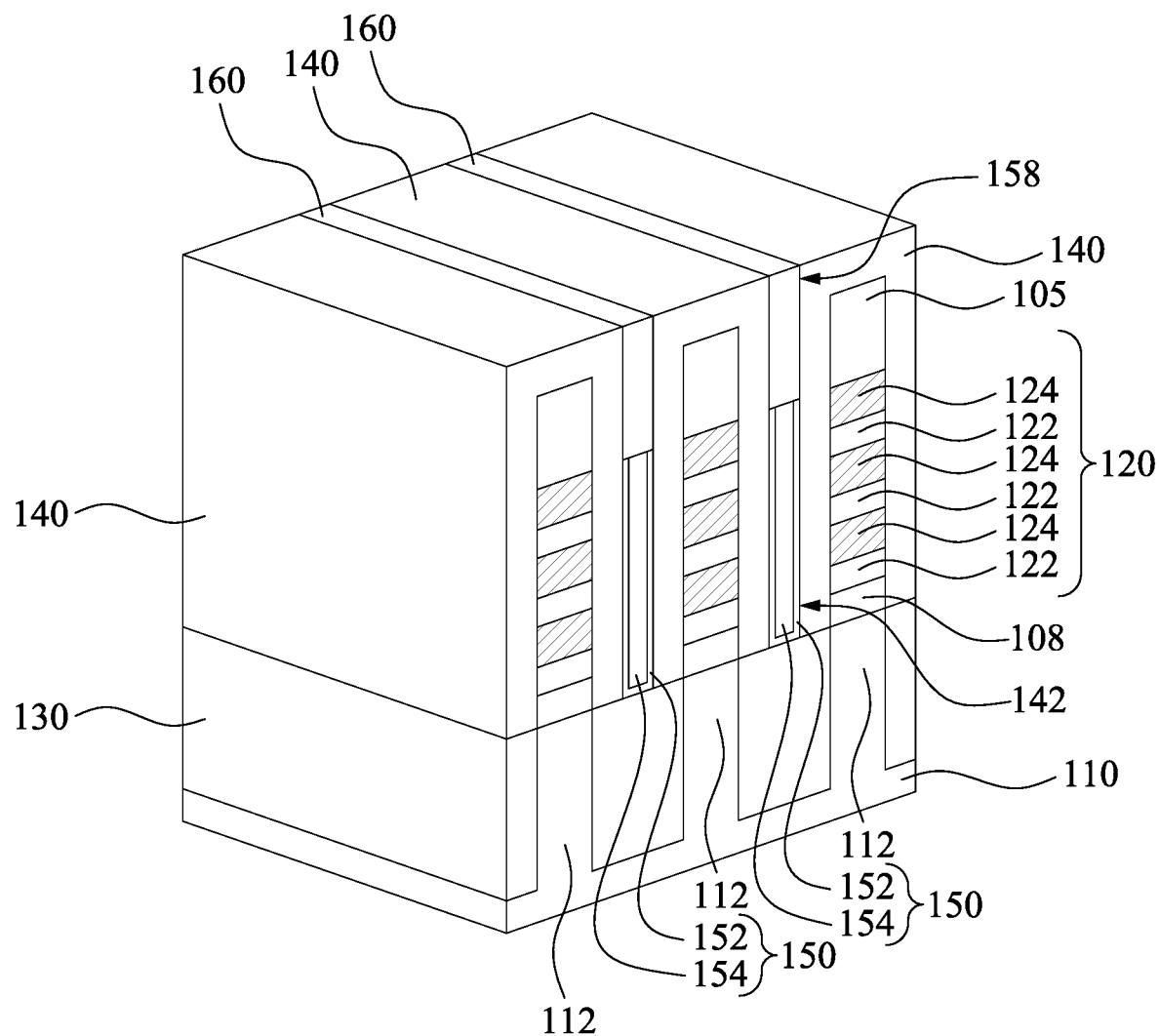

Reference is made to FIG. 3. Second sacrificial layers 140 are formed above the isolation structures 130 and respectively cover the semiconductor strips 104. In some embodiments, the second sacrificial layers 140 are made of semiconductor materials, such as SiGe or other suitable materials. In some other embodiments, the second sacrificial layers 140 may be dielectric materials. The second sacrificial layers 140 are separated from each other, such that trenches 142 are formed therebetween.

A plurality of dummy fin structures 150 are respectively formed in the trenches 142. In some embodiments, a dielectric layer is conformally formed above the second sacrificial layers 140, and a filling material is filled in the trenches 142. A planarization (e.g., CMP) process is then performed to remove excess portions of the dielectric layer and the filling material to form the dummy fin structures 150 respectively in the trenches 142. As such, each of the dummy fin structures 150 includes a dielectric layer 152 and a dummy fin 154 above the dielectric layer 152. In some embodiments, the dielectric layer 152 is deposited with an ALD process or other suitable processes. In some embodiments, the dielectric layer 152 and the dummy fin 154 include silicon nitride, silicon oxide, silicon oxynitride, SiCN, SiCON, SiOC, or other suitable materials. For example, the dielectric layer 152 includes silicon nitride, and the dummy fin 154 includes silicon dioxide.

Subsequently, the dummy fin structures 150 are recessed to form recesses 158 thereon. In some embodiments, multiple etching processes are performed to recess the dummy fin structures 150. The etching processes include dry etching process, wet etching process, or combinations thereof. Mask layers 160 are then respectively formed in the recesses 158. In some embodiments, the mask layers 160 are formed of silicon nitride, silicon oxynitride, silicon carbide, silicon carbo-nitride, or the like. For example, a mask material is formed above the second sacrificial layers 140 and the dummy fin structures 150, and a planarization (e.g., CMP) process is performed to remove excess portion of the mask material to form the mask layers 160.

Figure 4:
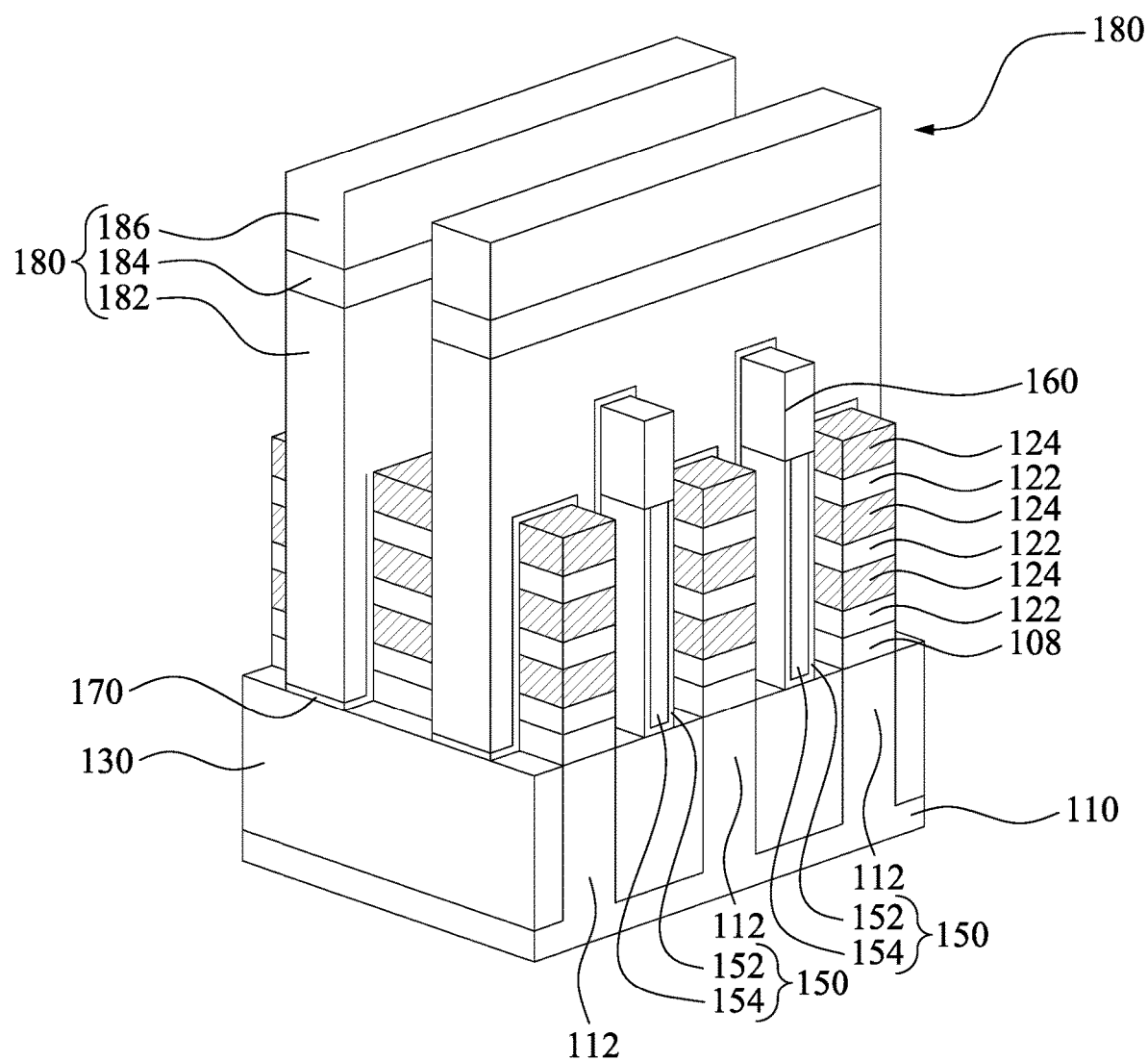

Reference is made to FIG. 4. The second sacrificial layers 140 and the patterned hard masks 105 are removed, and a sacrificial gate dielectric layer 170 is conformally formed above the mask layers 160, the dummy fin structures 150, and the first and second semiconductor layers 122 and 124. In some embodiments, the sacrificial gate dielectric layer 170 includes silicon dioxide, silicon nitride, a high-κ dielectric material or other suitable material. In various examples, the sacrificial gate dielectric layer 170 is deposited by an ALD process, a CVD process, a subatmospheric CVD (SACVD) process, a flowable CVD process, a PVD process, or other suitable process. By way of example, the sacrificial gate dielectric layer 170 may be used to prevent damage to the first and second semiconductor layers 122 and 124 by subsequent processing (e.g., subsequent formation of the dummy gate structure).

Subsequently, dummy gate structures 180 are formed above the sacrificial gate dielectric layer 170. Each of the dummy gate structures 180 includes a dummy gate layer 182, a pad layer 184 formed over the dummy gate layer 182, and a mask layer 186 formed over the pad layer 184. In some embodiments, a dummy gate material (not shown) may be formed over the sacrificial gate dielectric layer 170, and the pad layer 184 and the mask layer 186 are formed over the dummy gate material. The dummy gate material is then patterned using the pad layer 184 and the mask layer 186 as masks to form the dummy gate layer 182. As such, the dummy gate layer 182, the pad layer 184, and the mask layer 186 are referred to as the dummy gate structure 180. In some embodiments, the dummy gate layer 182 may be made of polycrystalline-silicon (poly-Si), poly-crystalline silicon-germanium (poly-SiGe), or other suitable materials. The pad layer 184 may be made of silicon nitride or other suitable materials, and the mask layer 186 may be made of silicon dioxide or other suitable materials.

Figure 5:
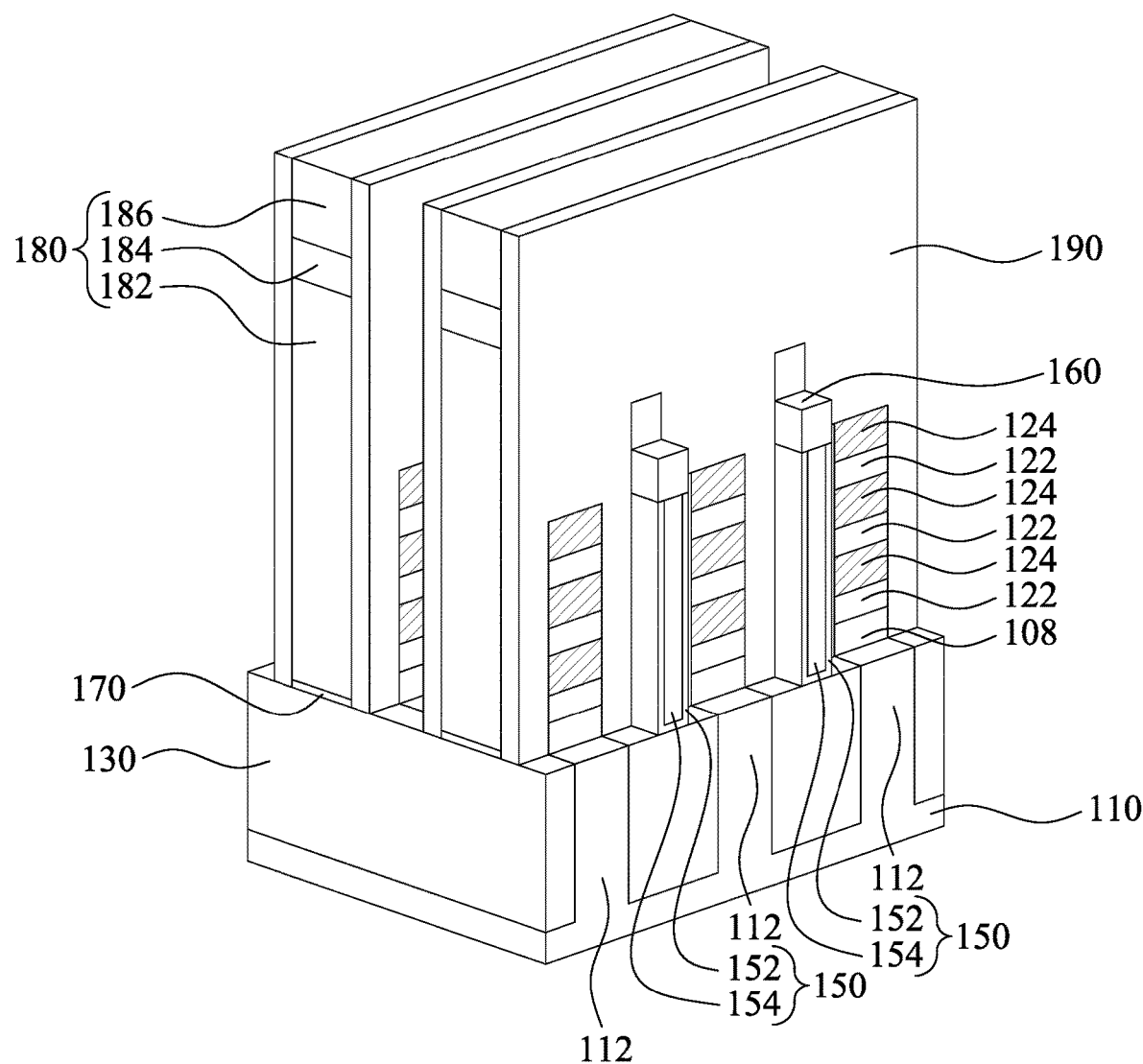

Reference is made to FIG. 5. Gate spacers 190 are respectively formed on sidewalls of the dummy gate structures 180. The gate spacers 190 may include a seal spacer and a main spacer (not shown). The gate spacers 190 include one or more dielectric materials, such as silicon oxide, silicon nitride, silicon oxynitride, SiCN, SiCxOyNz, or combinations thereof. The seal spacers are formed on sidewalls of the dummy gate structures 180 and the main spacers are formed on the seal spacers. The gate spacers 190 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 190 may include blanket forming spacer layers, and then performing etching operations to remove the horizontal portions of the spacer layers. The remaining vertical portions of the gate spacer layers form the gate spacers 190.

Subsequently, the first and second semiconductor layers 122 and 124 and the first sacrificial layers 108 are further patterned using the dummy gate structure 180 and the gate spacers 190 as masks, such that portions of the base portions 112 of the substrate 110 are exposed. During this etching process, the mask layers 160 may be recessed at the areas not covered by the dummy gate structure 180 or the gate spacers 190. In some embodiments, the patterning process is performed with an anisotropic dry etch process. In some embodiments, the dry etch process etches the first and second semiconductor layers 122 and 124 and the first sacrificial layers 108 (e.g., Si and SiGe) much faster than etching the mask layers 160 (e.g., metal oxides, SiON, and SiOCN). Due to this etch selectivity, the dry etch process patterns the first and second semiconductor layers 122 and 124 and the first sacrificial layers 108 vertically without complete etching the mask layers 160. In FIG. 5, portions of the mask layers 160 covered by the dummy gate structure 180 or the gate spacers 190 has a height greater than a height of the recessed portion of the mask layers 160.

Figure 6:
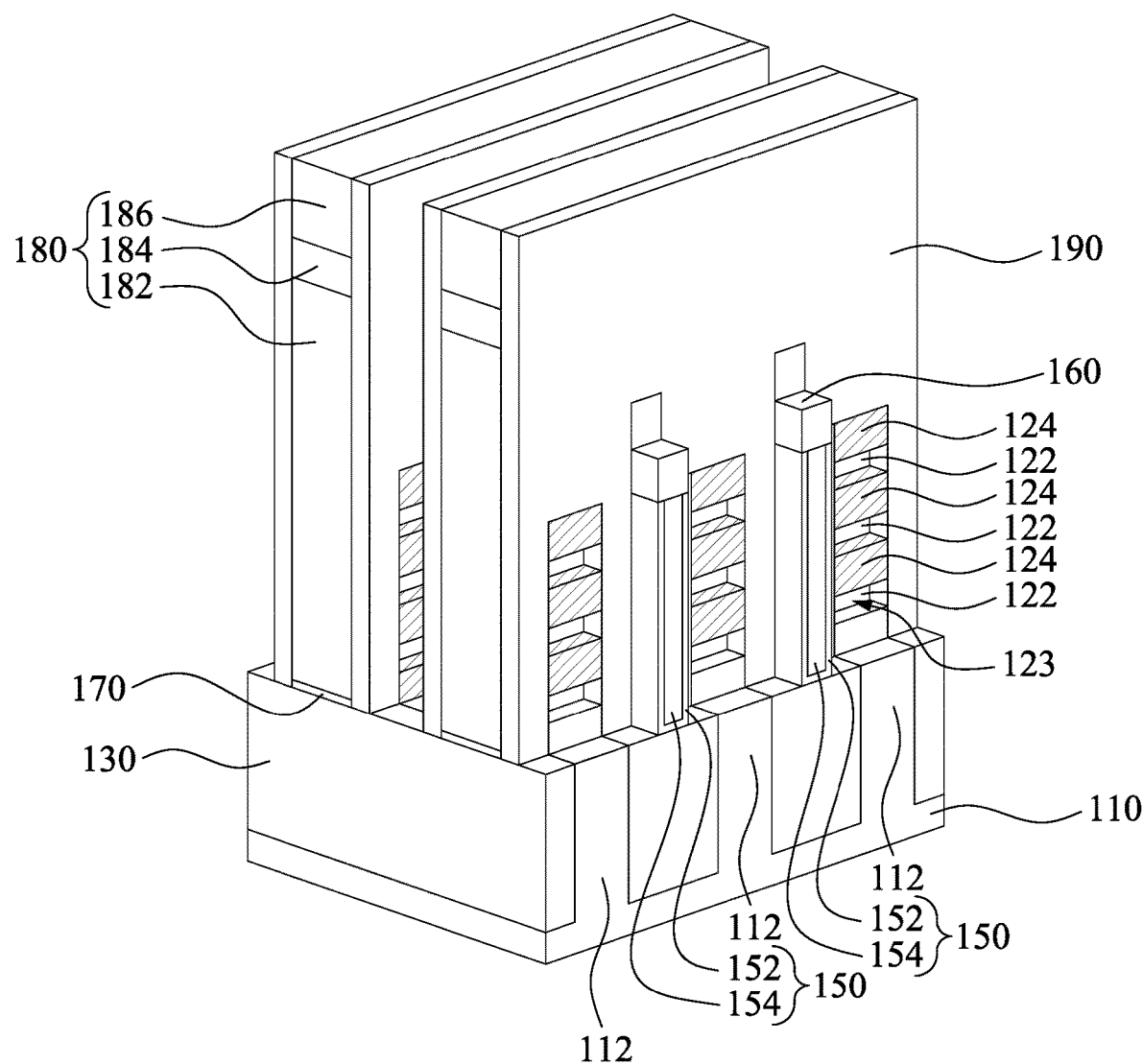

Reference is made to FIG. 6. The first semiconductor layers 122 are horizontally recessed (etched) so that edges of the first semiconductor layers 122 are located substantially below the gate spacers 190 and recesses 123 are formed. The etching of the first semiconductor layers 122 includes wet etching and/or dry etching.

Figure 7:
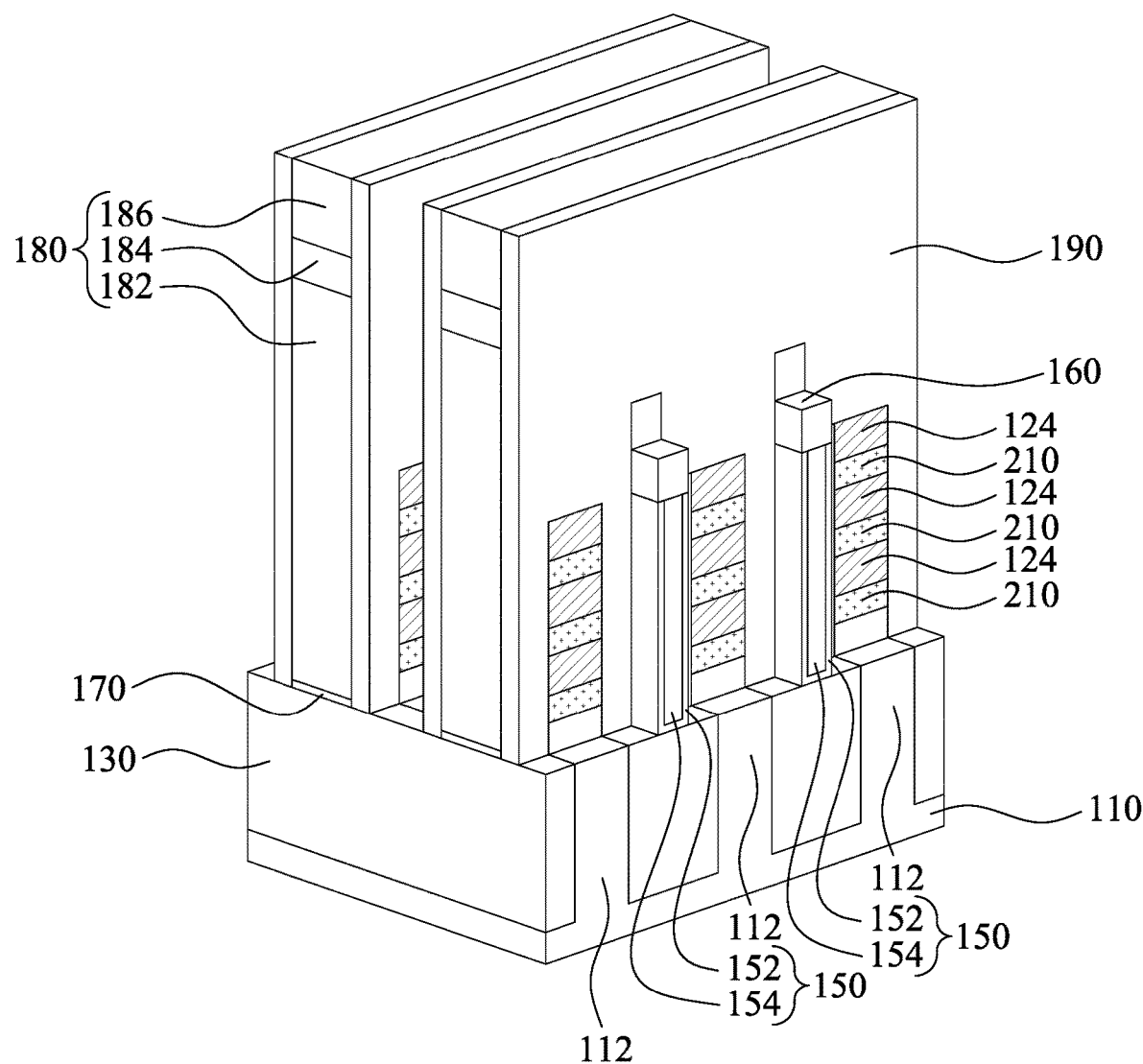

Reference is made to FIG. 7. Inner spacers 210 are respectively formed in the recesses 123 (see FIG. 6) of the first semiconductor layers 122. For example, a dielectric material layer is formed over the structure of FIG. 6, and one or more etching operations are performed to form the inner spacers 210. In some embodiments, the inner spacers 210 includes a silicon nitride-based material, such as SiN, SiON, SiOCN or SiCN and combinations thereof and is different from the material of the gate spacers 190. In some embodiments, the inner spacers 210 are silicon nitride. The inner spacers 210 may fully fill the recesses 123 as shown in FIG. 7. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

Figure 8A:
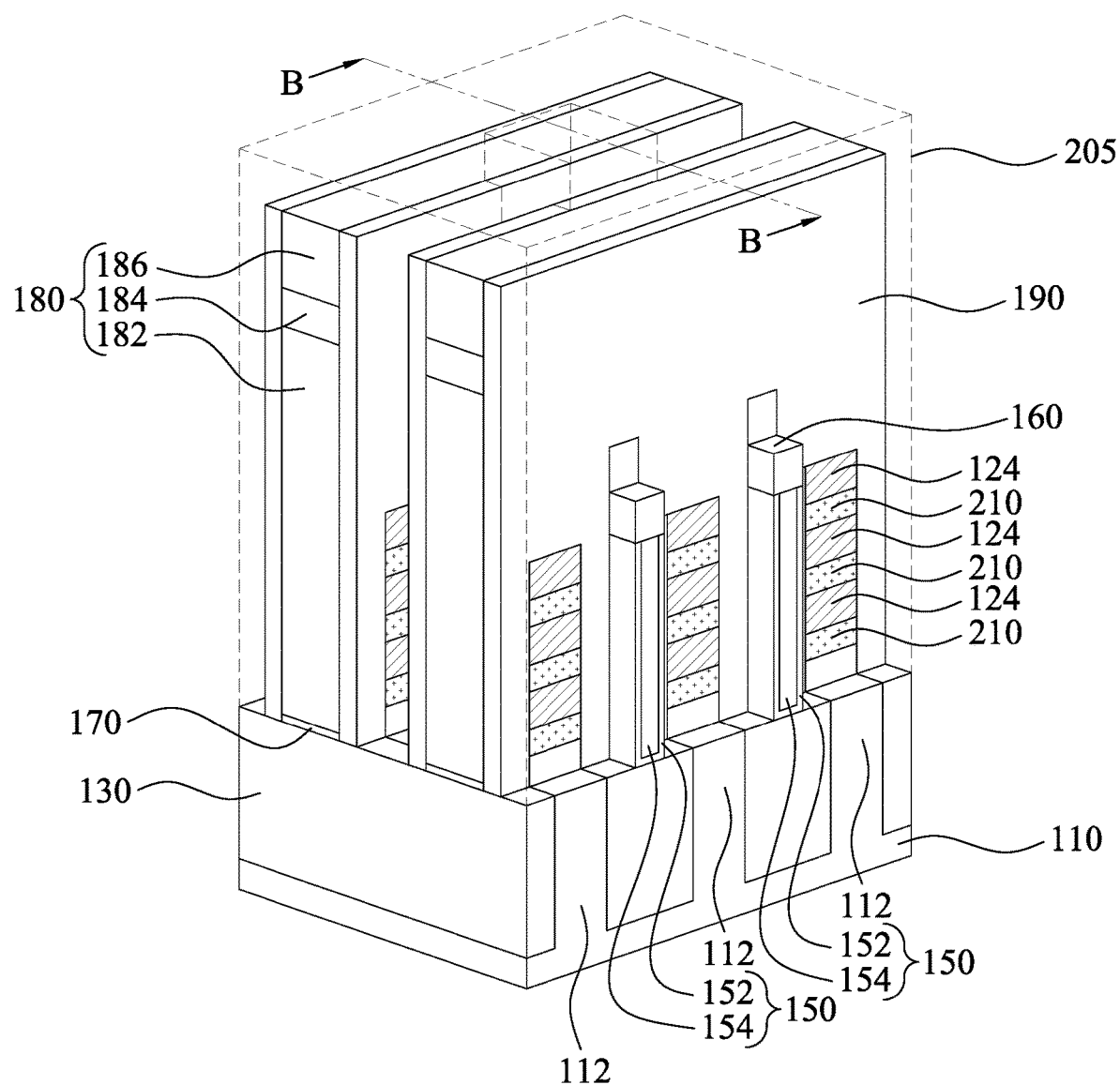
Figure 8B:
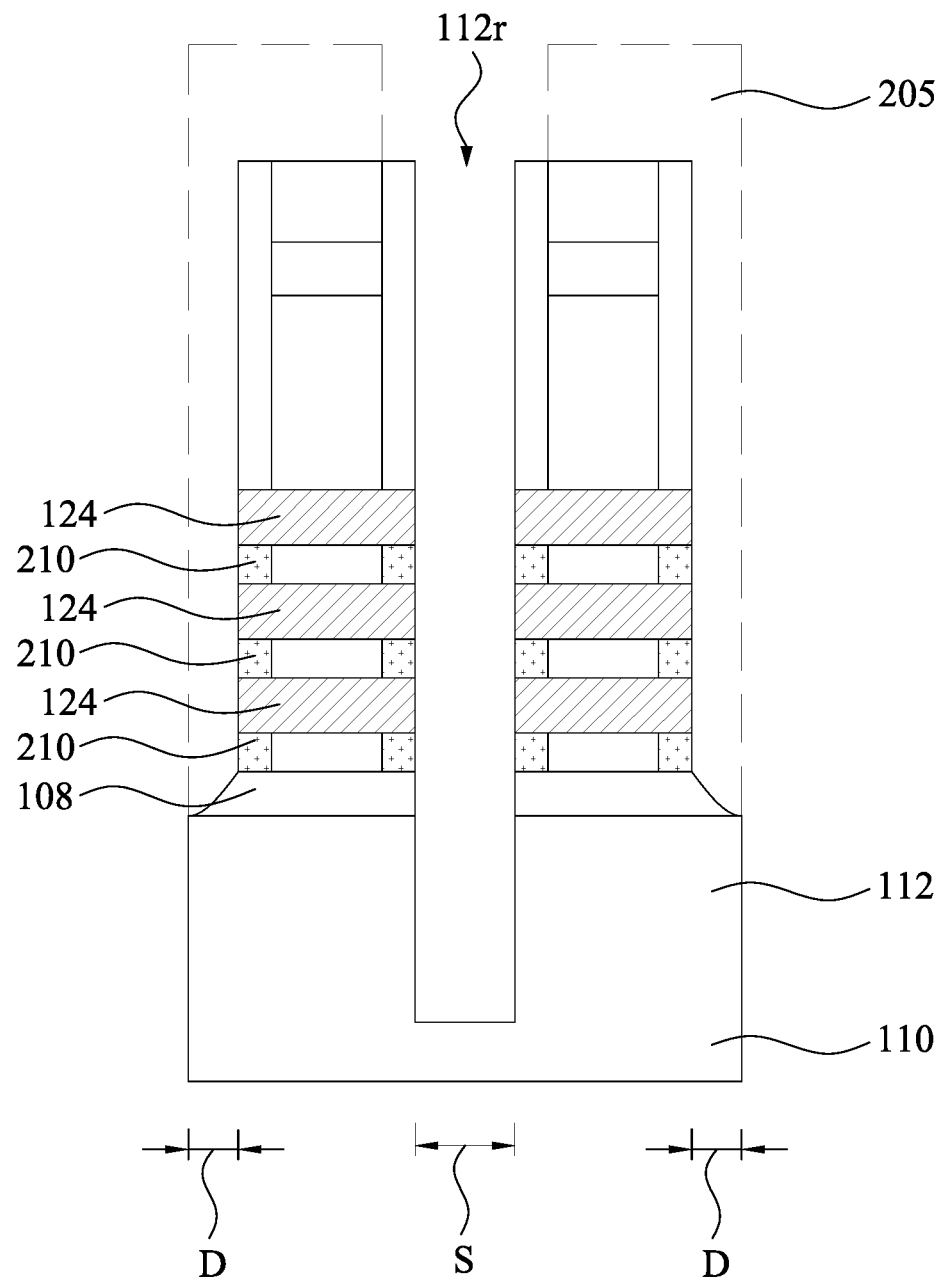

Reference is made to FIGS. 8A and 8B, where FIG. 8B is a cross-sectional view taken along line B-B in FIG. 8A. A mask layer 205 is formed above the structure of FIG. 7. For clarity, the mask layer 205 is illustrated with dashed lines. The mask layer 205 is formed to cover drain regions D of the base portion 112 but not cover at least one source region S of the base portion 112, and then the source region(s) S of the base portion 112 are recessed, resulting in at least one source-region recess 112r in the base portion 112. In some embodiments, the mask layer 205 may be a photoresist mask formed by suitable photolithography process. For example, the photolithography process may include spin-on coating a photoresist layer over the structure as illustrated in FIG. 7, performing post-exposure bake processes, and developing the photoresist layer to form the mask layer 205. In some embodiments, patterning the resist to form the patterned mask element may be performed using an electron beam (e-beam) lithography process or an extreme ultraviolet (EUV) lithography process.

Once the mask layer 205 is formed, the source-region recess 112r can be formed in the source region S using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 9A:
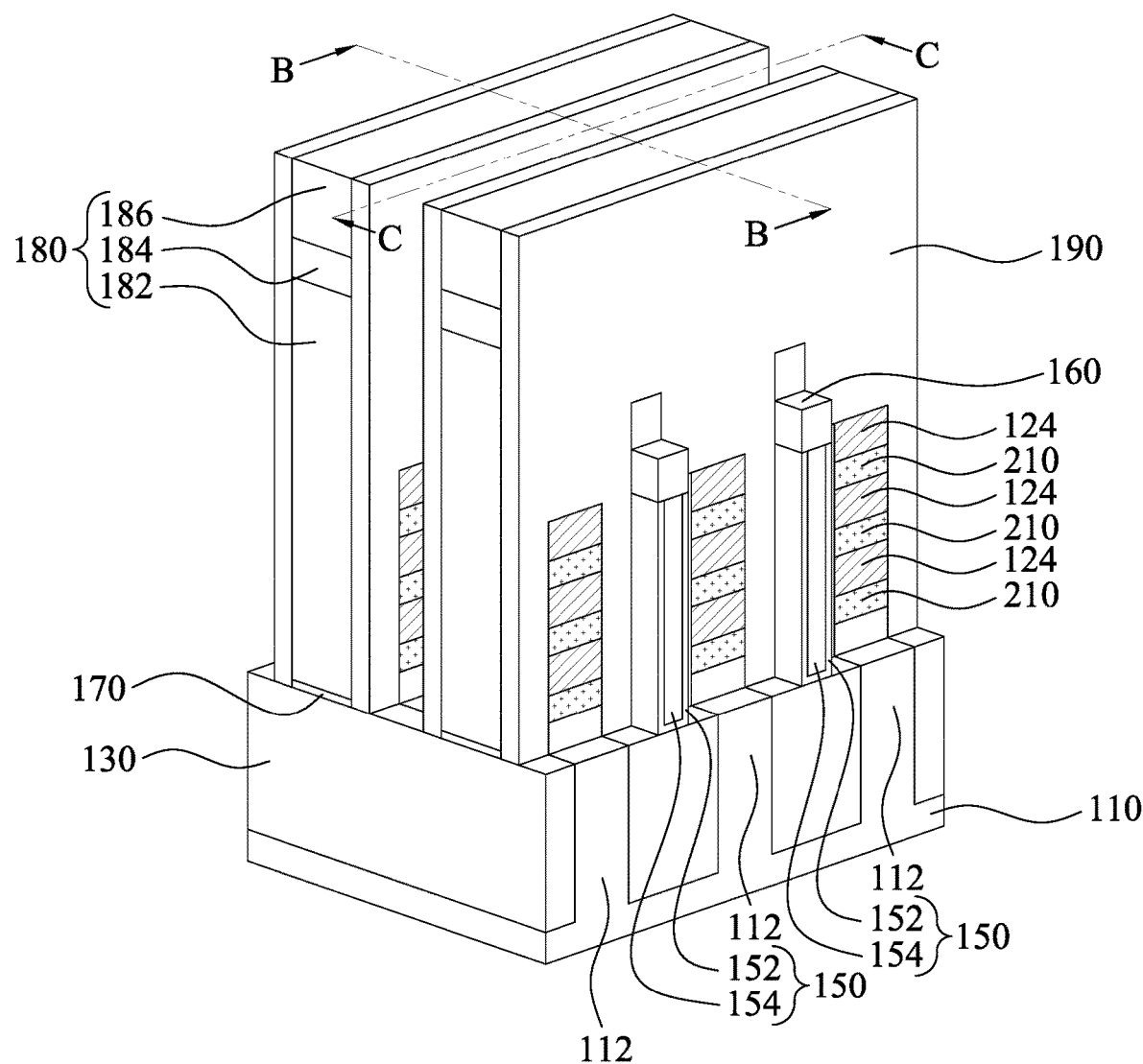
Figure 9B:
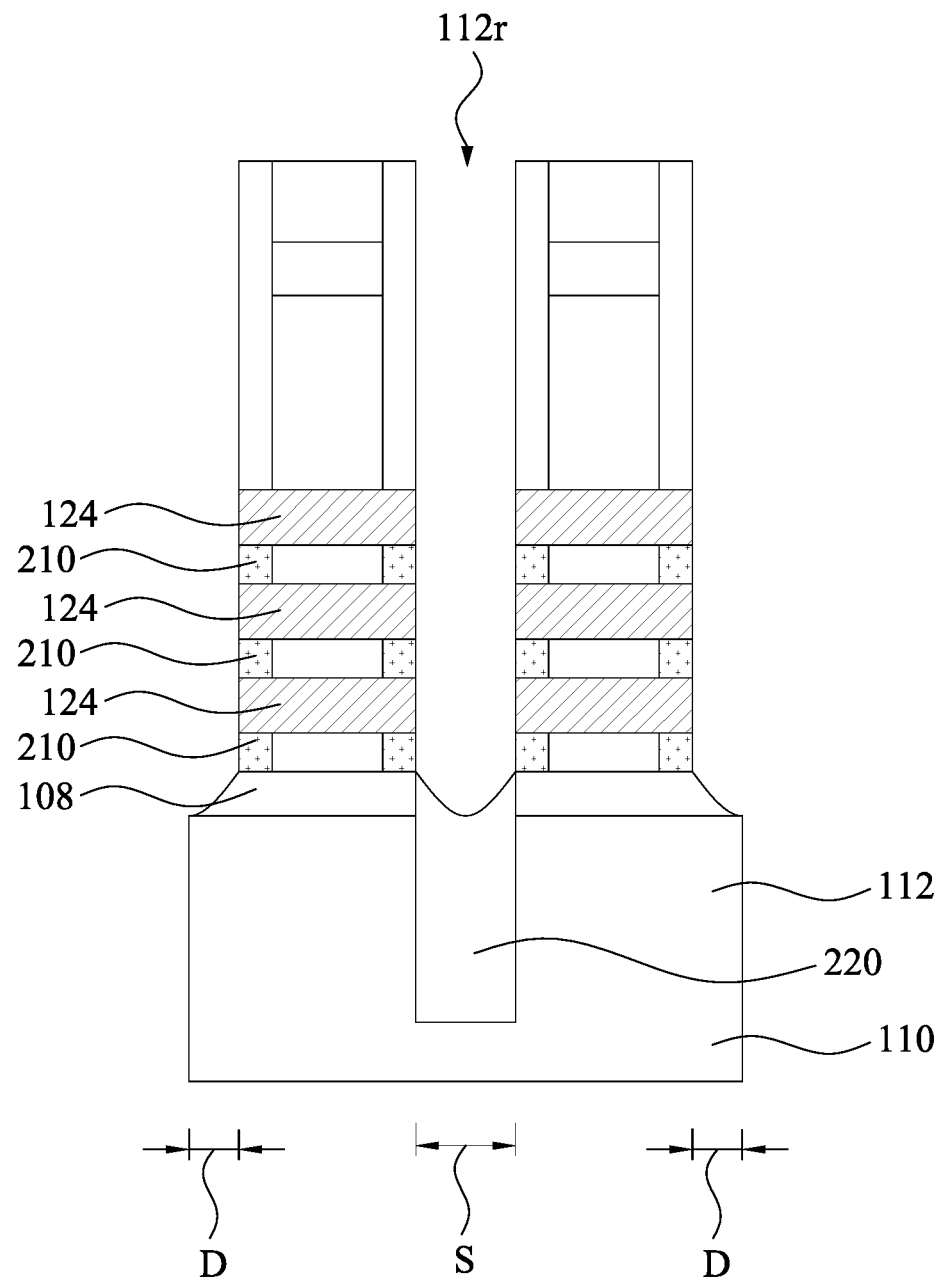
Figure 9C:
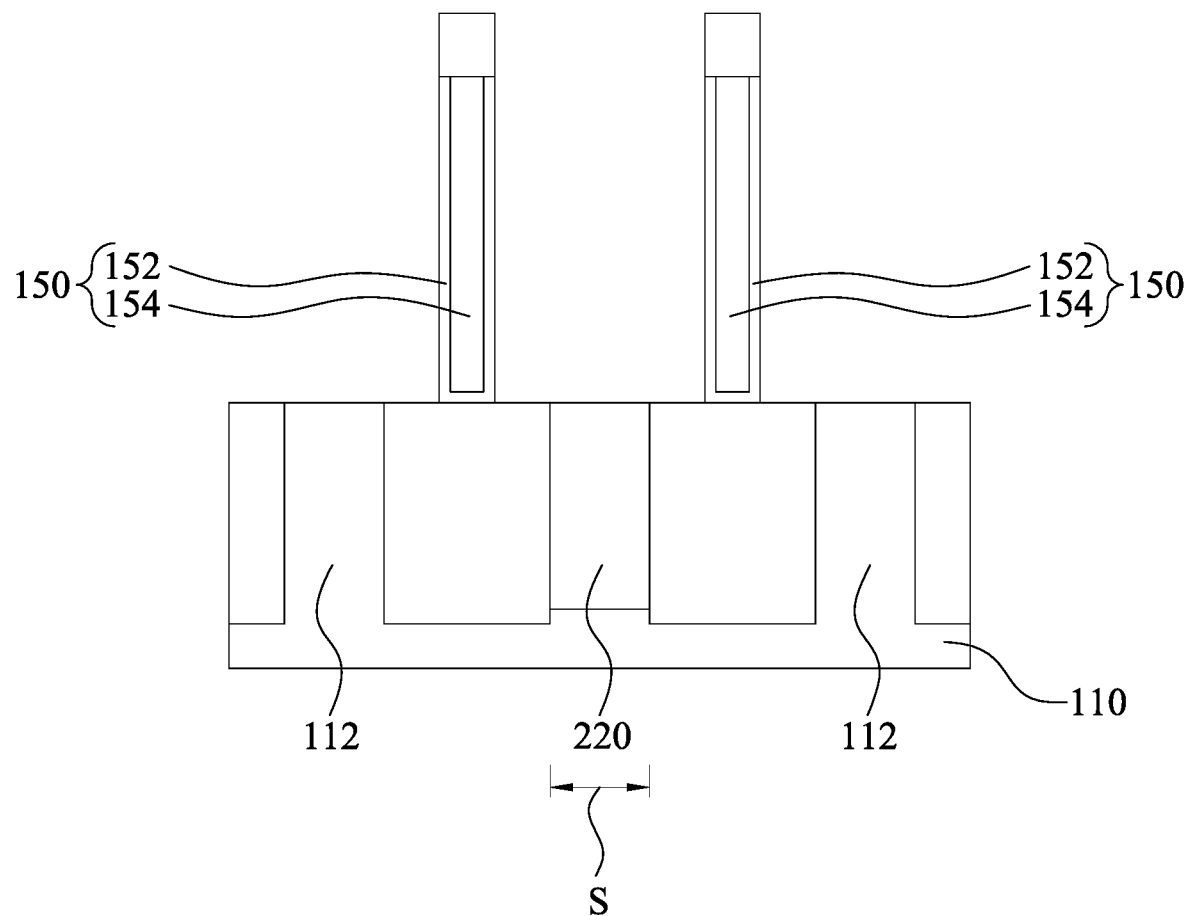

Reference is made to FIGS. 9A-9C, where FIG. 9B is a cross-sectional view taken along line B-B in FIG. 9A, and FIG. 9C is a cross-sectional view taken along line C-C in FIG. 9A. An epitaxial growth process is performed to grow an epitaxial material in the source-region recess 112r until the epitaxial material builds up sacrificial epitaxial plug 220 filling the source-region recess 112r. The epitaxial material has a different composition than the substrate 110, thus resulting in different etch selectivity between the sacrificial epitaxial plug 220 and the substrate 110. For example, the substrate 110 is Si and the sacrificial epitaxial plug 220 is SiGe. In some embodiments, the sacrificial epitaxial plug 220 are SiGe free from p-type dopants (e.g., boron) and n-type dopants (e.g., phosphorous), because the sacrificial epitaxial plug 220 will be removed in subsequent processing and not serve as source terminals of transistors in a final IC product.

Figure 10:
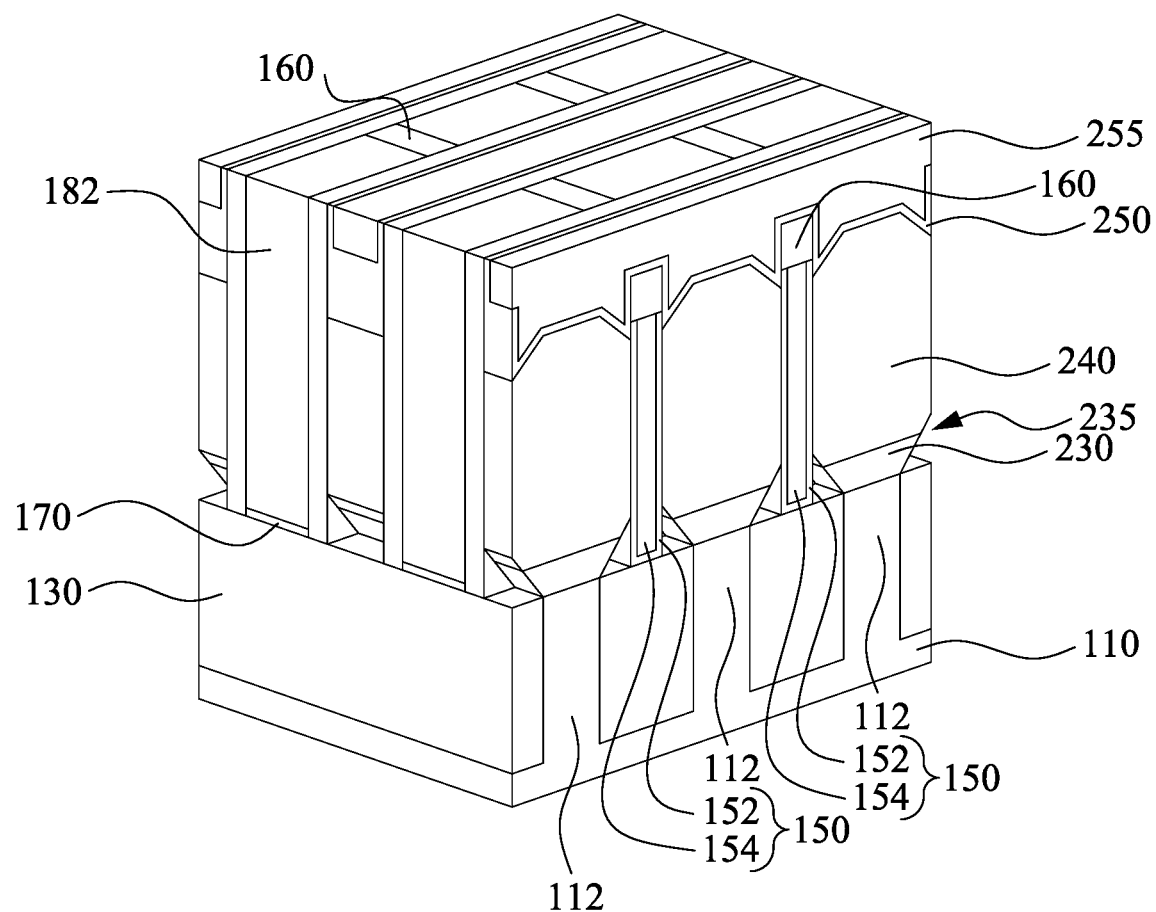

Reference is made to FIG. 10. Bottom epitaxial structures 230 are respectively formed on the base portions 112 of the substrate 110 and the sacrificial epitaxial plug 220. In some embodiments, semiconductor materials are deposited on the base portions 112 and the sacrificial epitaxial plug 220 to form the bottom epitaxial structures 230. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The bottom epitaxial structures 230 have suitable crystallographic orientations (e.g., a (100), (110), or (111) crystallographic orientation). The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the bottom epitaxial structures 230 are intrinsic. That is, the bottom epitaxial structures 230 are undoped. The undoped bottom epitaxial structures 230 are benefit for reducing current leakage from top epitaxial structures 240 to the substrate 110. The top surfaces of the bottom epitaxial structures 230 may be at an intermediate level between the bottom surface and top surface of the bottommost inner spacers 210.

Top epitaxial structures 240 are respectively formed on the bottom epitaxial structures 230. In some embodiments, semiconductor materials are deposited on the bottom epitaxial structures 230 to form the top epitaxial structures 240. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The top epitaxial structures 240 have suitable crystallographic orientations (e.g., a (100), (110), or (111) crystallographic orientation). In some embodiments, the top epitaxial structures 240 include source/drain epitaxial structures. In some embodiments, where an N-type device is desired, the top epitaxial structures 240 may include an epitaxially grown silicon phosphorus (SiP) or silicon carbon (SiC). In some embodiments, where a P-type device is desired, the top epitaxial structures 240 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

The dummy fin structures 150 are configured to limit the space for epitaxially growing the top epitaxial structures 240. As a result, the top epitaxial structures 240 are confined between the dummy fin structures 150. This can be used to produce any desirable size of the top epitaxial structures 240, particularly small top epitaxial structures 240 for reducing parasitic capacitances. For example, a width of the top epitaxial structures 240 (i.e., the space between adjacent two dummy fin structures 150) is in a range of about 3 nm to about 100 nm. Further, air gaps 235 may be formed under the top epitaxial structures 240. For example, the air gap 235 is defined by the top epitaxial structure 240, the bottom epitaxial structure 230, the dummy fin structure 150, and the isolation structure 130. In some embodiments, the top epitaxial structures 240 are in contact with the dummy fin structures 150, and the bottom epitaxial structures 230 are spaced apart from the dummy fin structures 150.

A front-side contact etch stop layer (CESL) 250 is conformally formed over the dummy fin structures 150 and the top epitaxial structures 240. In some embodiments, the front-side CESL 250 can be a stressed layer or layers. In some embodiments, the front-side CESL 250 has a tensile stress and is formed of $Si_3N_4$. In some other embodiments, the front-side CESL 250 includes materials such as oxynitrides. In yet some other embodiments, the front-side CESL 250 may have a composite structure including a plurality of layers, such as a silicon nitride layer overlying a silicon oxide layer. The front-side CESL 250 can be formed using plasma enhanced CVD (PECVD), however, other suitable methods, such as low pressure CVD (LPCVD), atomic layer deposition (ALD), and the like, can also be used.

A front-side interlayer dielectric (ILD) 255 is then formed on the front-side CESL 250. The front-side ILD 255 may be formed by chemical vapor deposition (CVD), high-density plasma CVD, spin-on, sputtering, or other suitable methods. In some embodiments, the front-side ILD 255 includes silicon oxide. In some other embodiments, the front-side ILD 255 may include silicon oxy-nitride, silicon nitride, compounds including Si, O, C and/or H (e.g., silicon oxide, SiCOH and SiOC), a low-k material, or organic materials (e.g., polymers). After the front-side ILD 255 is formed, a planarization operation, such as CMP, is performed, so that the pad layer 184 and the mask layer 186 (see FIG. 9A) are removed and the dummy gate layers 182 and the mask layers 160 are exposed.

Figure 11A:
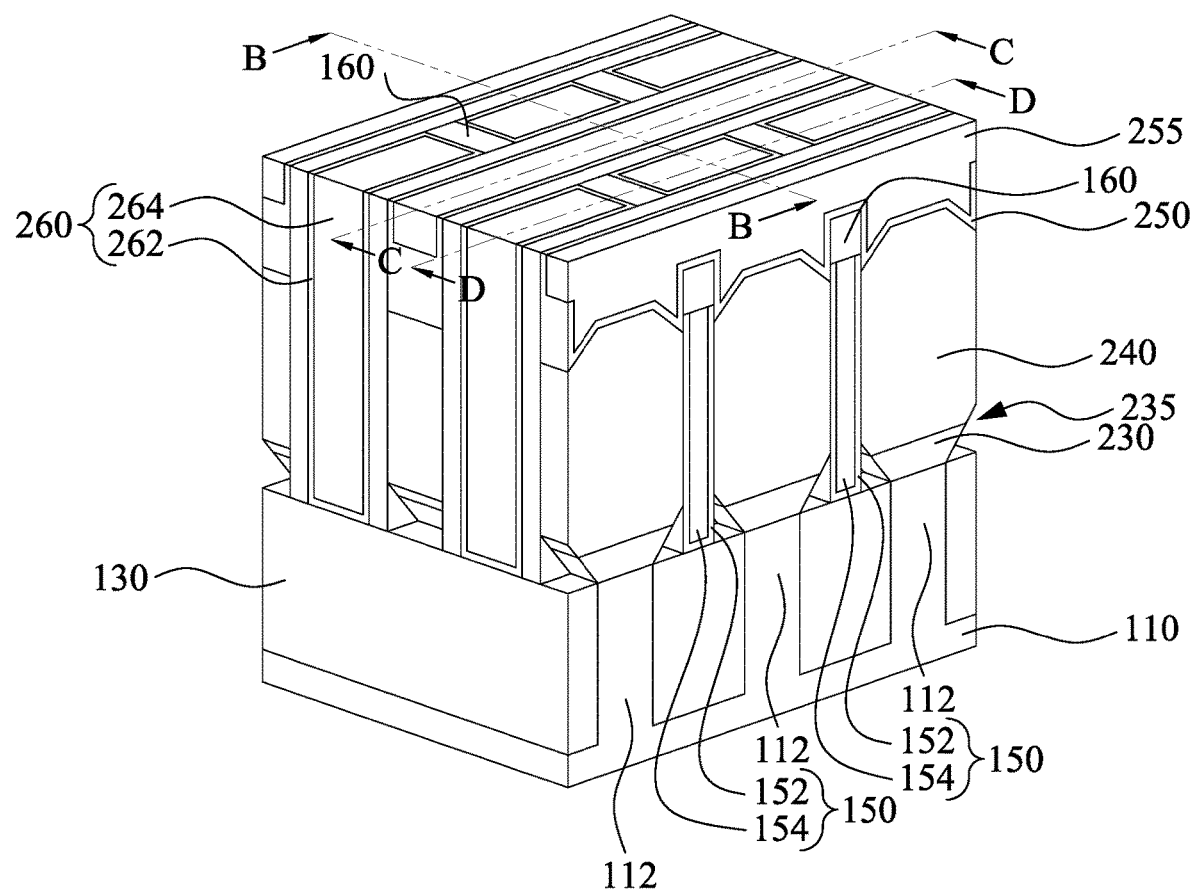
Figure 11B:
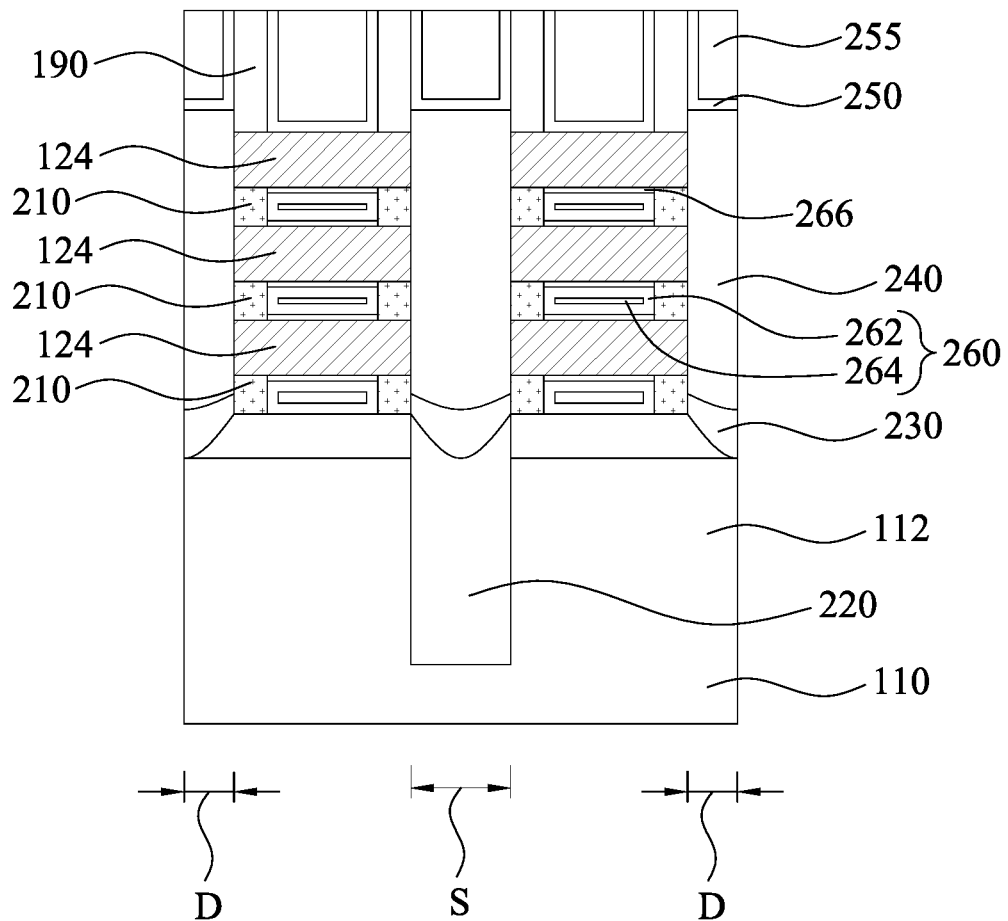
Figure 11C:
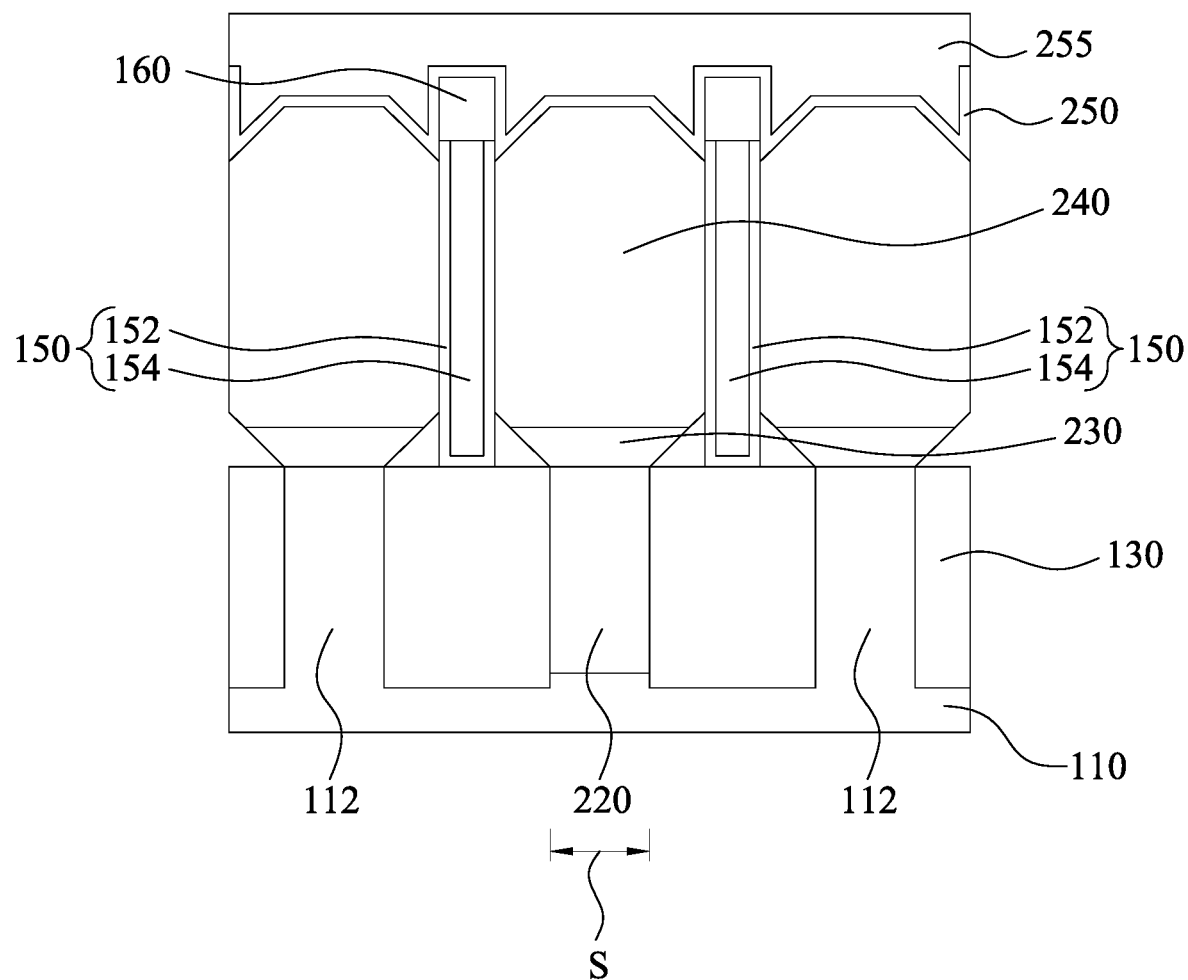
Figure 11D:
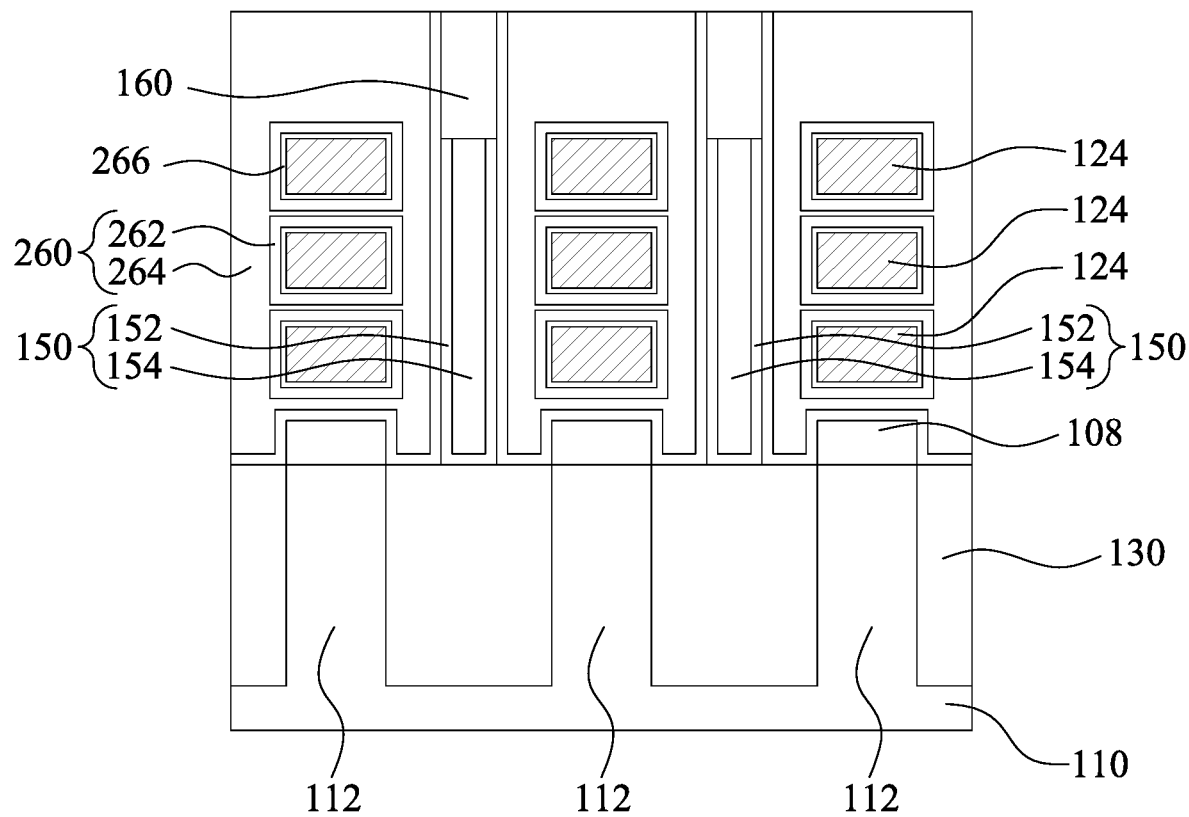

Reference is made to FIGS. 11A-11D, where FIG. 11B is a cross-sectional view taken along line B-B in FIG. 11A, FIG. 11C is a cross-sectional view taken along line C-C in FIG. 11A, and FIG. 11D is a cross-sectional view taken along line D-D in FIG. 11A. The dummy gate layers 182 and the sacrificial gate dielectric layers 170 (see FIG. 10) are then removed, thereby exposing the second semiconductor layers 124. The front-side ILD 255 protects the top epitaxial structures 240 during the removal of the dummy gate layers 182. The dummy gate layers 182 can be removed using plasma dry etching and/or wet etching. When the dummy gate layers 182 is polysilicon and the front-side ILD 255 is silicon oxide, a wet etchant such as a TMAH solution can be used to selectively remove the dummy gate layer 182. The dummy gate layer 182 is thereafter removed using plasma dry etching and/or wet etching. Subsequently, the sacrificial gate dielectric layers 170 are removed as well. As such, the topmost semiconductor layers 124 are exposed.

After the dummy gate layers 182 (see FIG. 10) are removed, the remaining first semiconductor layers 122 (see FIG. 9A) are removed, thereby forming sheets (or wires or rods or columns) of the second semiconductor layers 124. The first semiconductor layers 122 can be removed or etched using an etchant that can selectively etch the first semiconductor layers 122.

In some embodiments, interfacial layers 266 are optionally formed to surround exposed surfaces of the second semiconductor layers 124 and exposed surfaces of the base portions 112 of the substrate 110. In various embodiments, the interfacial layer 266 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

Gate structures 260 are formed and/or filled between the gate spacers 190 or the inner spacers 210. That is, the gate structures 260 encircle (wrap) the semiconductor layers 124. The gate spacers 190 are disposed on opposite sides of the gate structures 260. Each of the gate structures 260 includes a gate dielectric layer 262 and a gate electrode 264. The gate electrode 264 includes one or more work function metal layer (s) and a filling metal. The gate dielectric layer 262 is conformally formed. The second semiconductor layers 124 are referred to as channels of the semiconductor device. The gate dielectric layer 262 surrounds the second semiconductor layers 124, and spaces between the second semiconductor layers 124 are still left after the deposition of the gate dielectric layer 262. In some embodiments, the gate dielectric layer 262 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 262 may be formed by performing an ALD process or other suitable process.

The work function metal layer of the gate electrode 264 is conformally formed on the gate dielectric layer 262, and the work function metal layer surrounds the second semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The filling metal of the gate electrode 264 fills the remained space between the gate spacers 190 and between the inner spacers 210. That is, the work function metal layer(s) is in contact with and between the gate dielectric layer 262 and the filling metal. The filling metal may include material such as tungsten or aluminum. After the deposition of the gate dielectric layer 262 and the gate electrode 264, a planarization process, such as a CMP process, may be then performed to remove excess portions of the gate dielectric layer 262 and the gate electrode 264 to form the gate structure 260.

Figure 12:
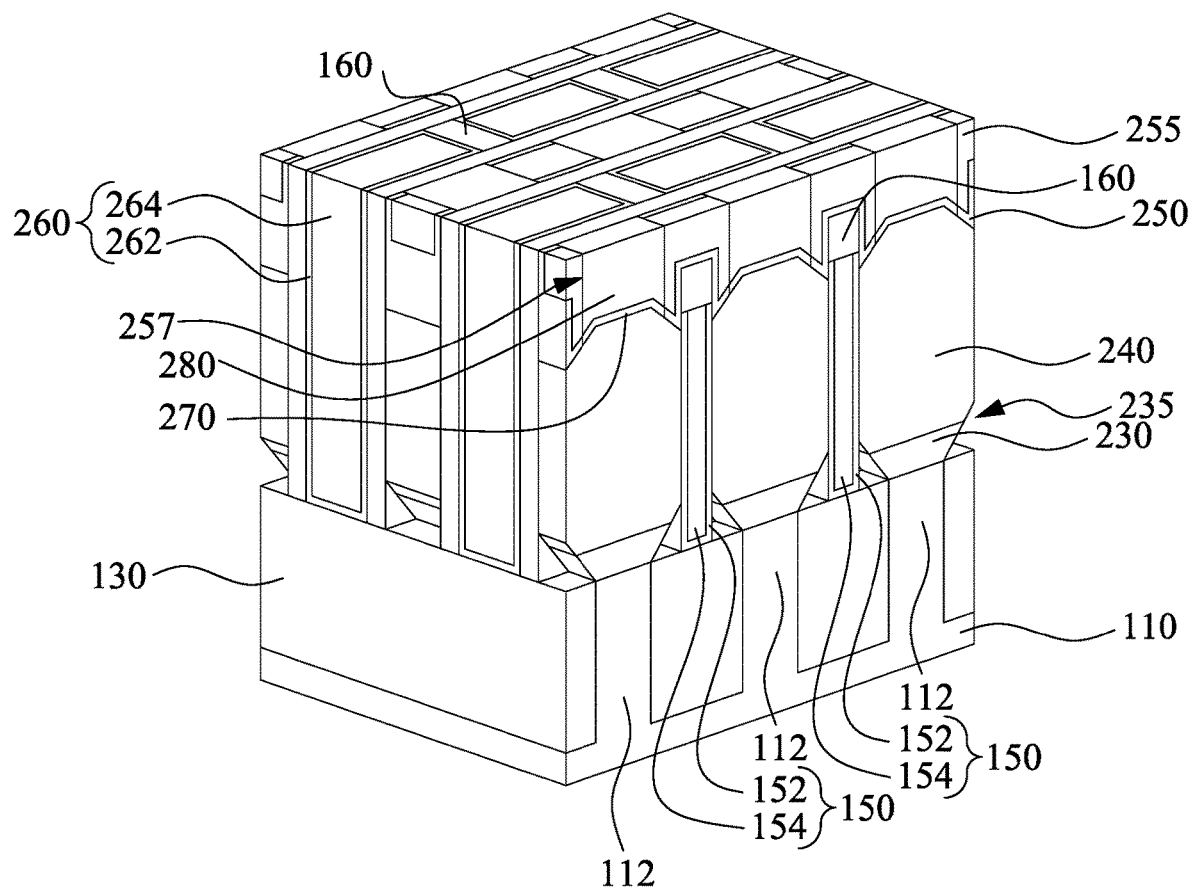

Reference is made to FIG. 12. The front-side ILD 255 is patterned to form trenches 257 on opposite sides of the gate structures 260, and then the front-side CESL 250 is patterned to expose the top epitaxial structures 240. In some embodiments, multiple etching processes are performed to pattern the front-side ILD 255 and the front-side CESL 250. The etching processes include dry etching process, wet etching process, or combinations thereof.

Contacts 280 are formed in the trenches 257. As such, the contacts 280 are respectively in contact with the top epitaxial structures 240. In some embodiments, some of the contacts 280 interconnect adjacent top epitaxial structures 240. In some embodiments, the contacts 280 may be made of metal, such as W, Co, Ru, Al, Cu, or other suitable materials. After the deposition of the contacts 280, a planarization process, such as a chemical mechanical planarization (CMP) process, may be then performed. As such, a top surface of the contacts 280 and a top surface of the front-side ILD 255 are substantially coplanar. In some embodiments, front-side metal alloy layers (such as silicide) 270 may be formed between the contacts 280 and the top epitaxial structures 240. Further, barrier layers may be formed in the trenches 257 before the formation of the contacts 280 and after the formation of the front-side metal alloy layers 270. The barrier layers may be made of TiN, TaN, or combinations thereof.

Figure 13:
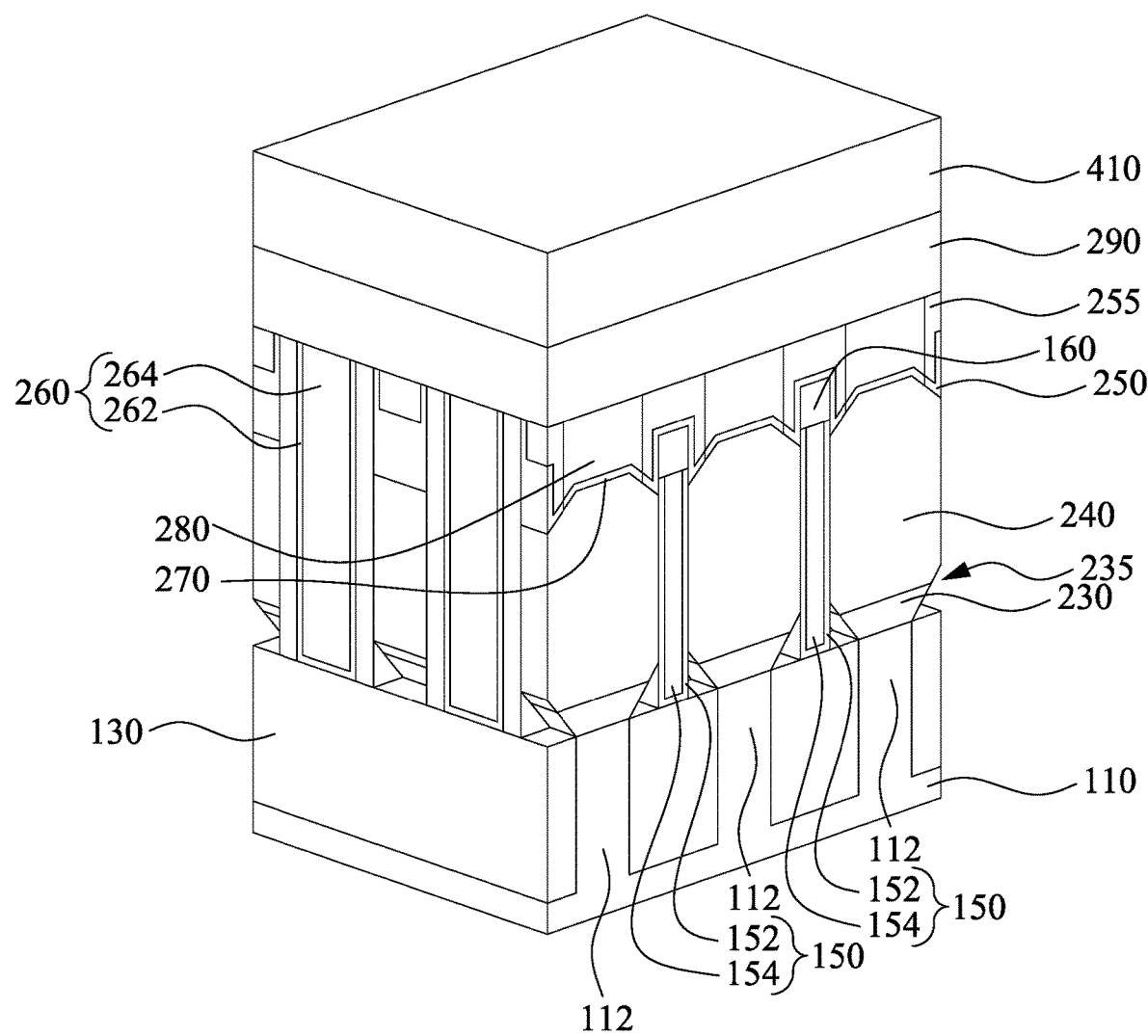

Reference is made to FIG. 13. A frond-side multilayer interconnection (MLI) 290 including metal layers and inter-metal dielectric (IMD) is formed over the substrate 110 to electrically connect various features or structures (e.g., the contacts 280 and/or the gate structures 260) of the semiconductor device. The front-side MLI 290 includes vertical interconnects, such as vias or contacts 292, and horizontal interconnects, such as metal lines 294 (see FIG. 20B). The various interconnection features may implement various conductive materials including copper, tungsten and silicide. In some examples, a damascene process is used to form copper multilayer interconnection structure.

Subsequently, a carrier substrate 410 is formed above the front-side MLI 290. For example, the carrier substrate 410 is bond to the front-side MLI 290. The carrier substrate 410 may be silicon, doped or undoped, or may include other semiconductor materials, such as germanium; a compound semiconductor; or combinations thereof. The carrier substrate 410 may provide a structural support during subsequent processing on backside of the semiconductor device and may remain in the final product in some embodiments. In some other embodiments, the carrier substrate 410 may be removed after the subsequent processing on backside of semiconductor device is complete. In some embodiments, the carrier substrate 410 is bonded to a topmost dielectric layer of the MLI structure 290 by, for example, fusion bonding.

Figure 14A:
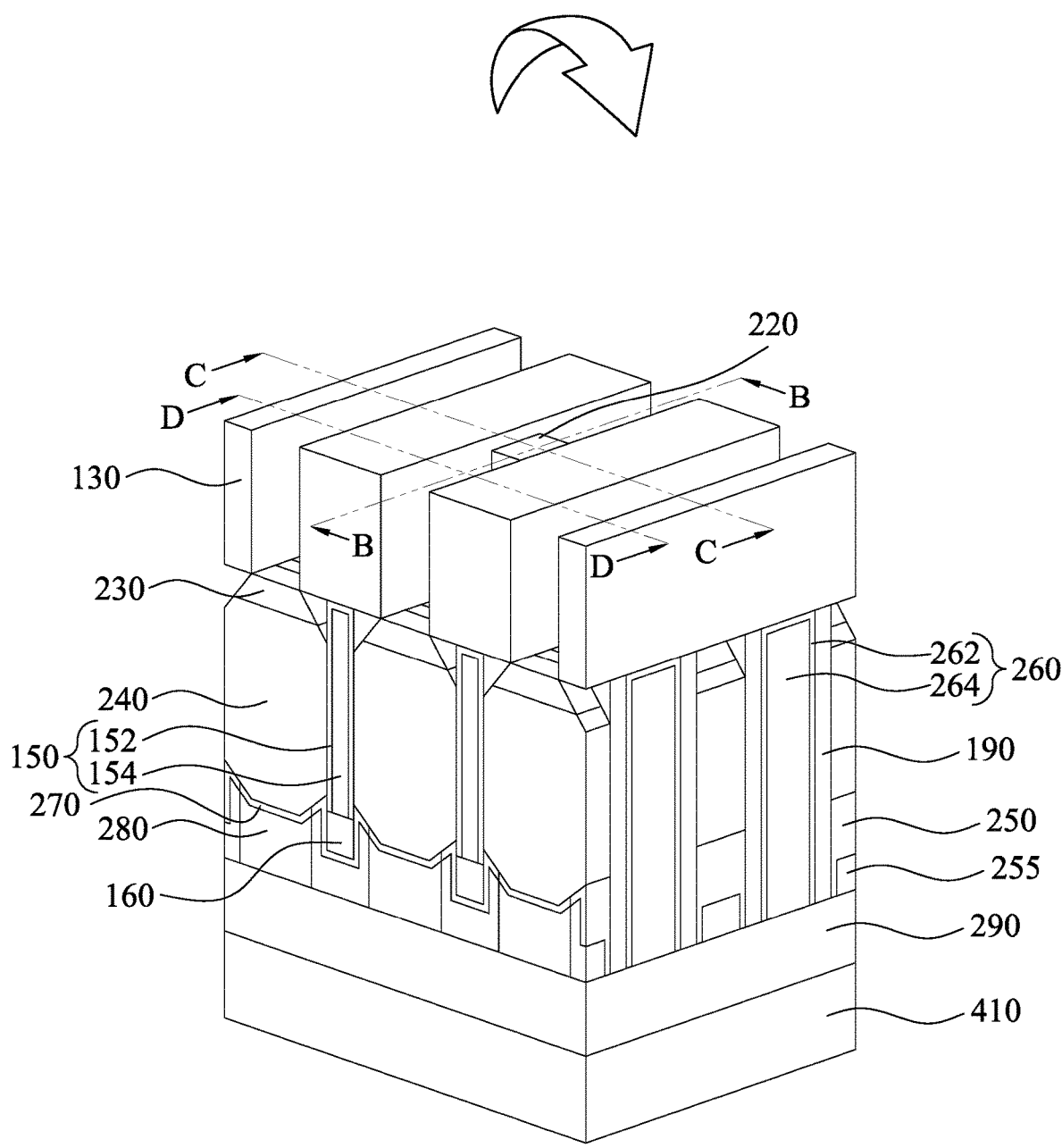
Figure 14B:
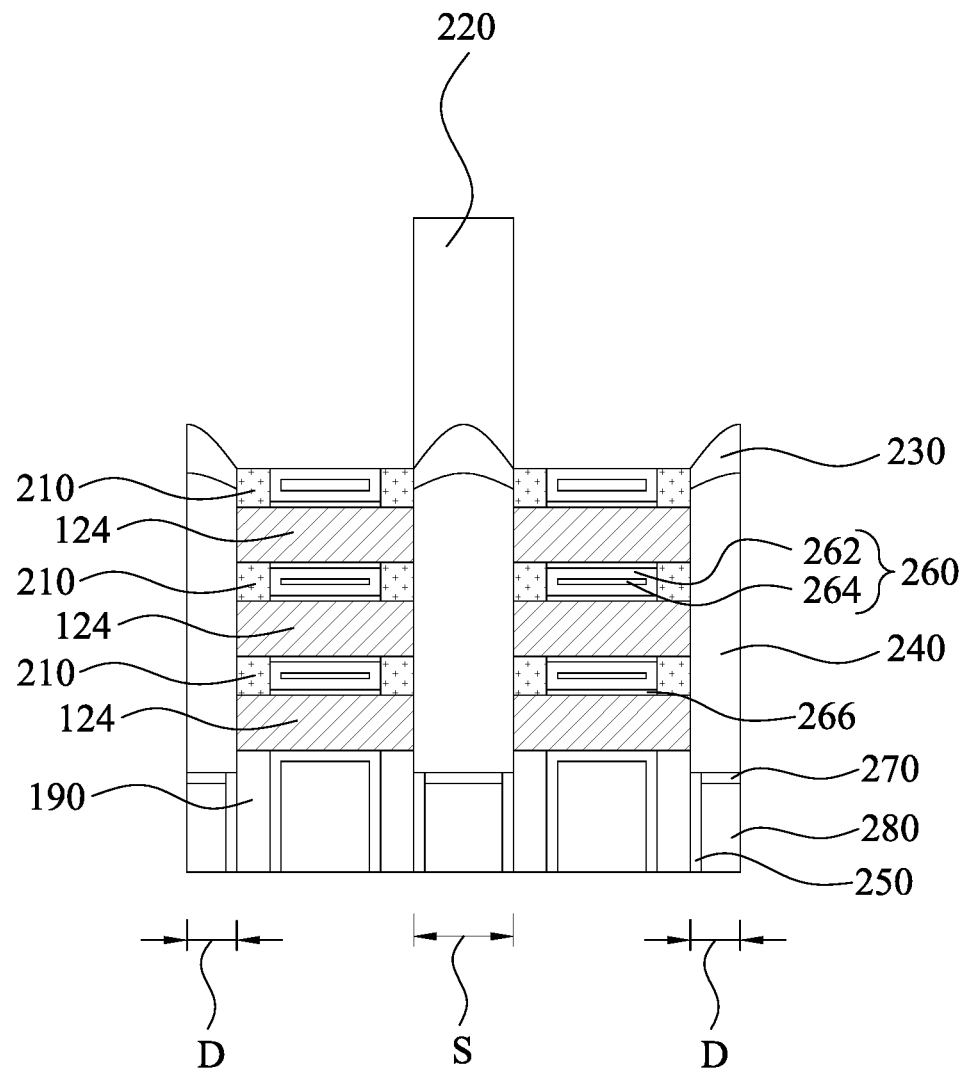
Figure 14C:
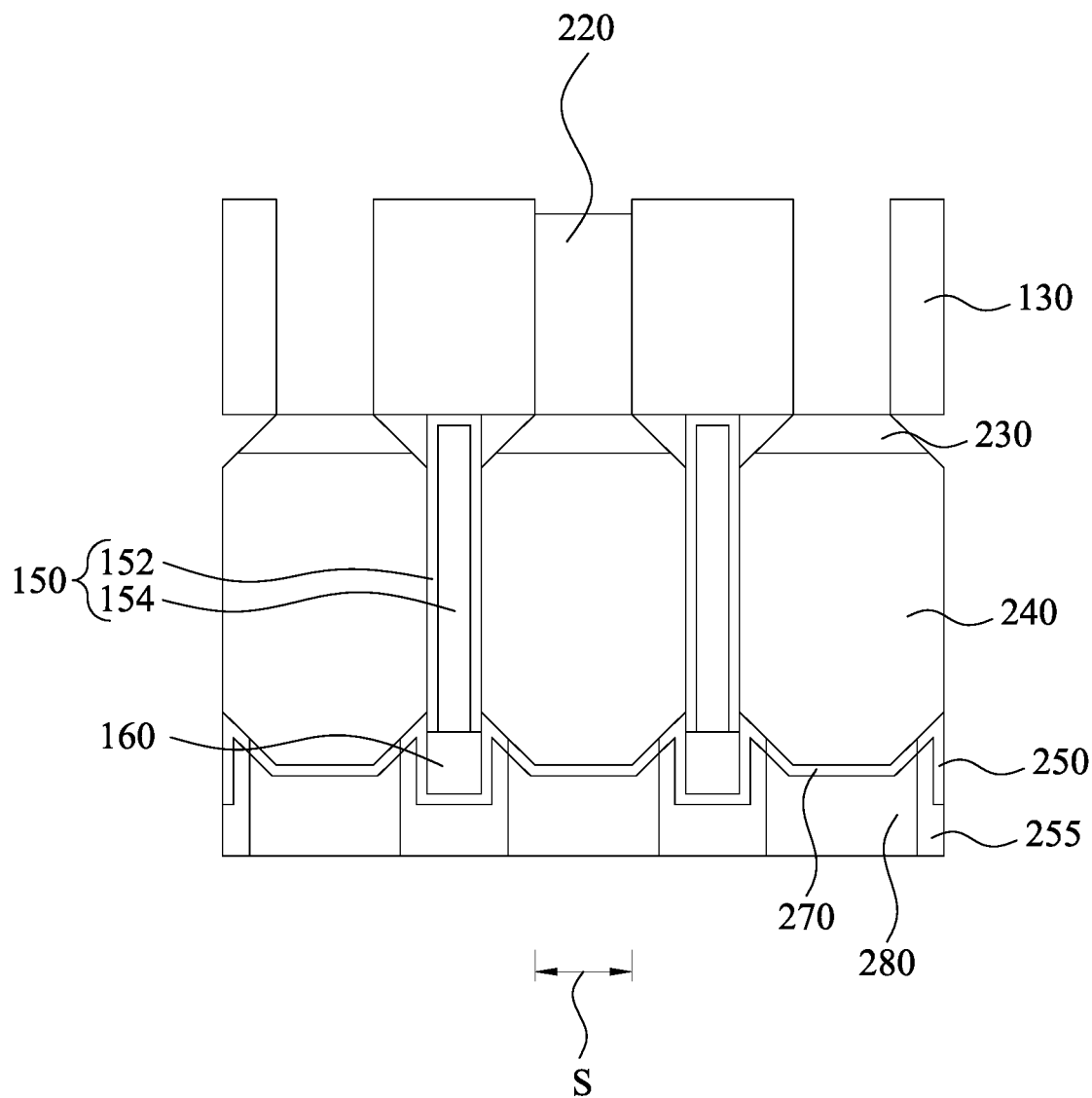
Figure 14D:
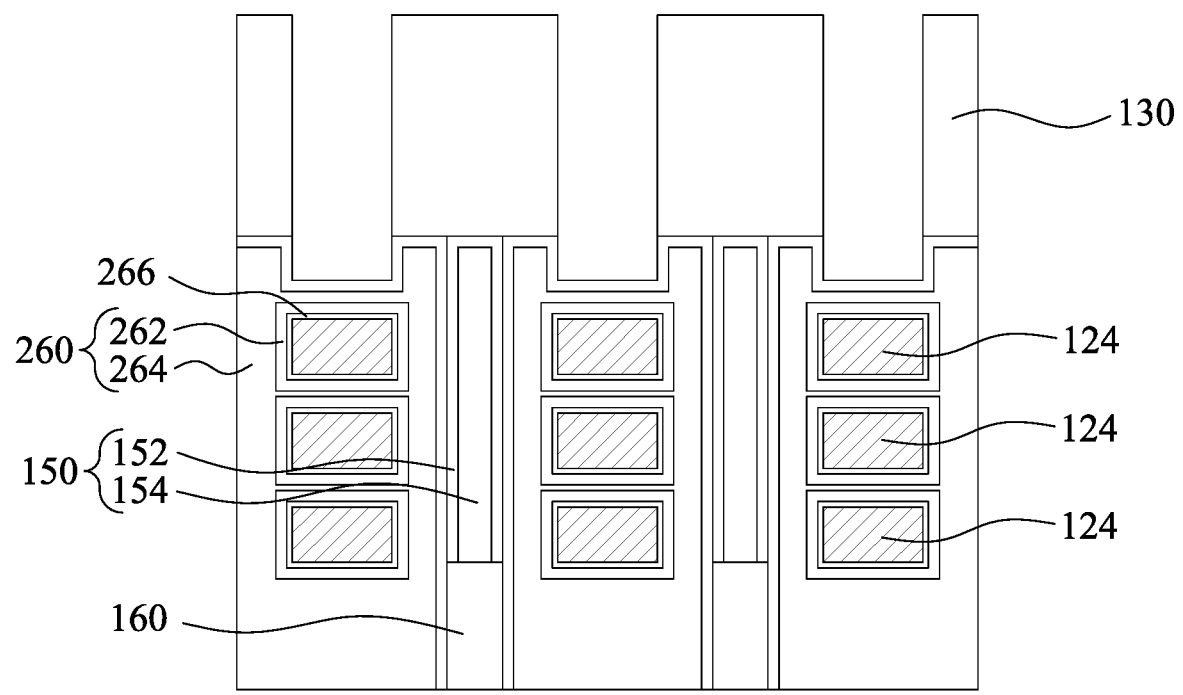

Reference is made to FIGS. 14A-14D, where FIG. 14B is a cross-sectional view taken along line B-B in FIG. 14A, FIG. 14C is a cross-sectional view taken along line C-C in FIG. 14A, and FIG. 14D is a cross-sectional view taken along line D-D in FIG. 14A. The structure of FIG. 13 is "flipped" upside down, and the substrate 110 and the first sacrificial layers 108 (see FIGS. 11D and 13) are removed. As such, the sacrificial epitaxial plug 220 and other bottom epitaxial structures 230 not in contact with the sacrificial epitaxial plug 220 are exposed. In some embodiments, the removal processes include thinning down the substrate 110 from the backside thereof until the sacrificial epitaxial plug 220 is exposed. The substrate 110 is then removed by using a selective etching process that etches the substrate 110 and the first sacrificial layer 108 (e.g., Si) at a faster etch rate that it etches the sacrificial epitaxial plug 220 (e.g., SiGe) and the isolation structure 130 (e.g., dielectric materials). In some embodiments, the selective etching process for selectively removing the substrate 110 may be a wet etching process using an wet etching solution such as tetramethylammonium hydroxide (TMAH), potassium hydroxide (KOH), $NH_4OH$, the like or combinations thereof.

Figure 15A:
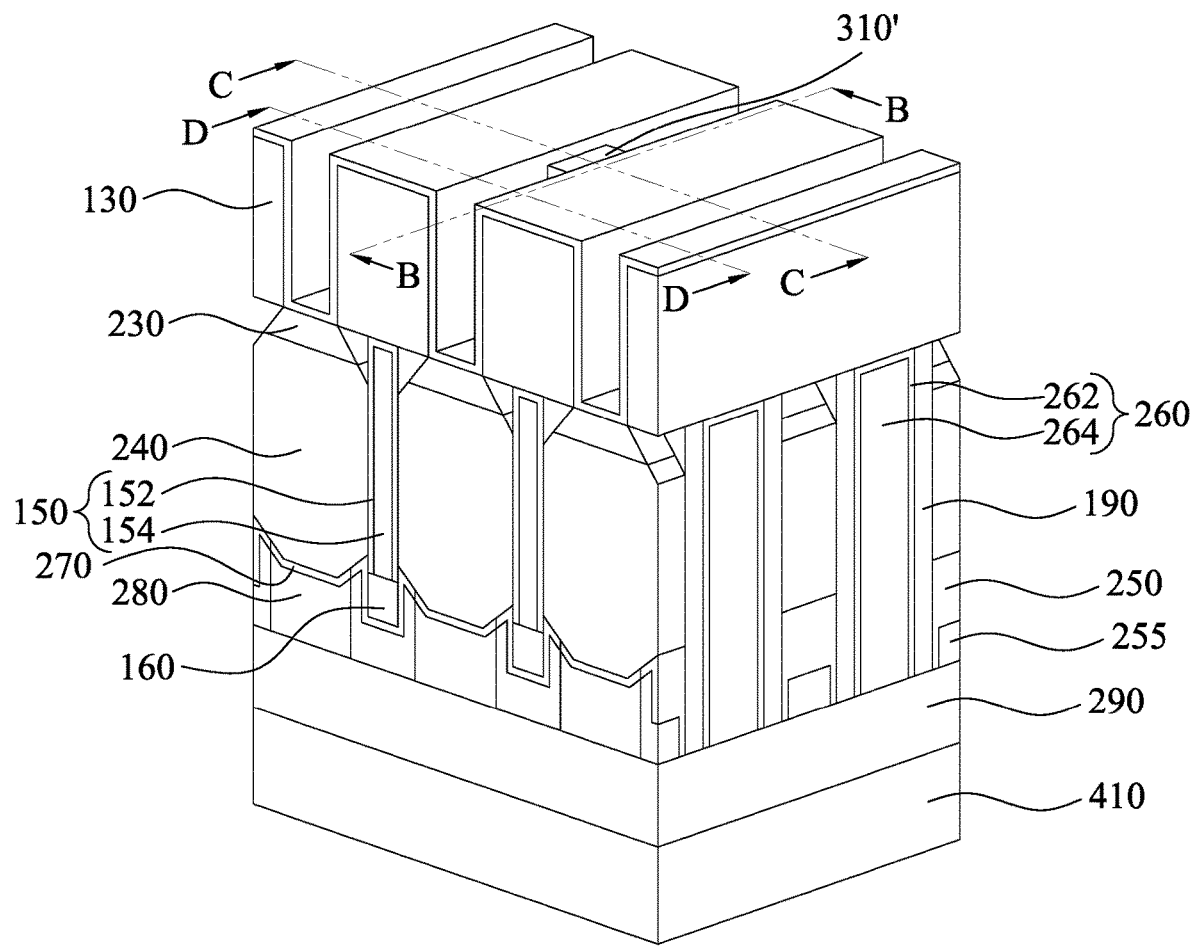
Figure 15B:
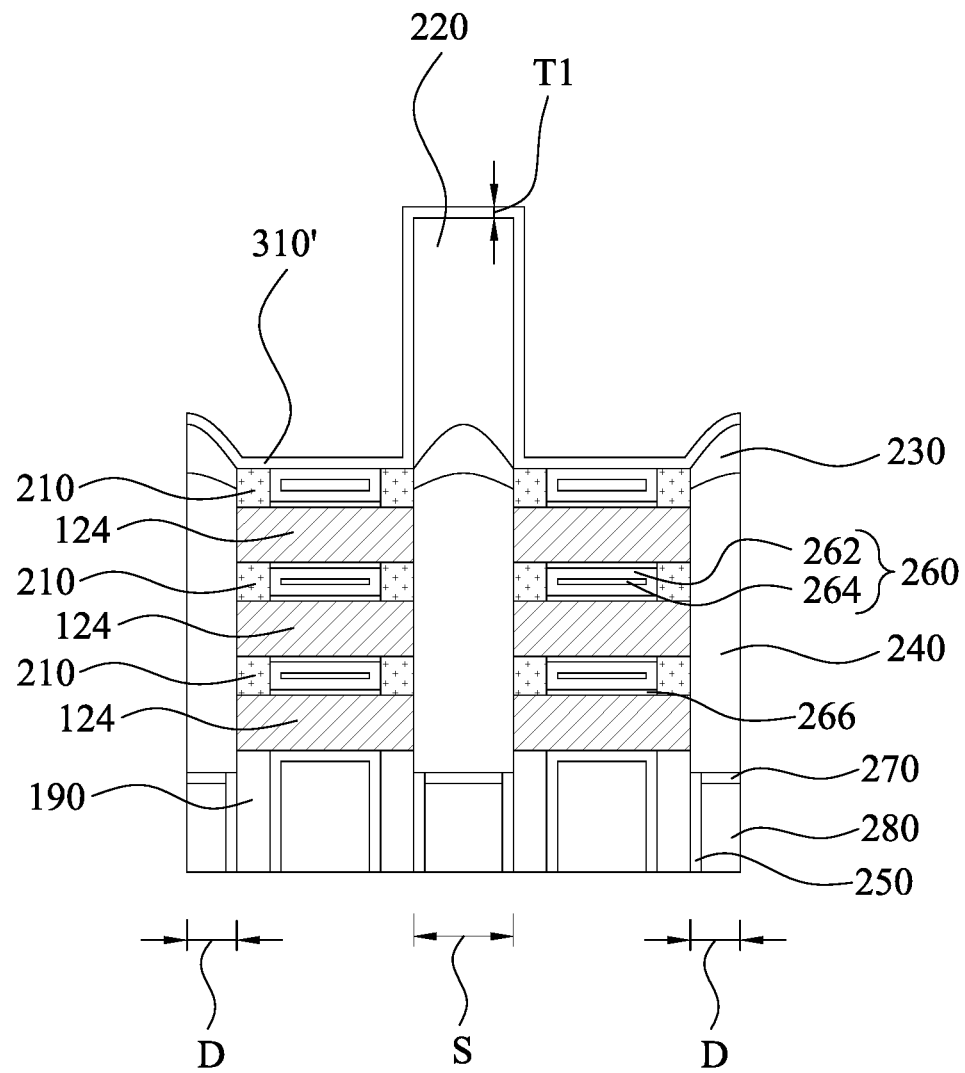
Figure 15C:
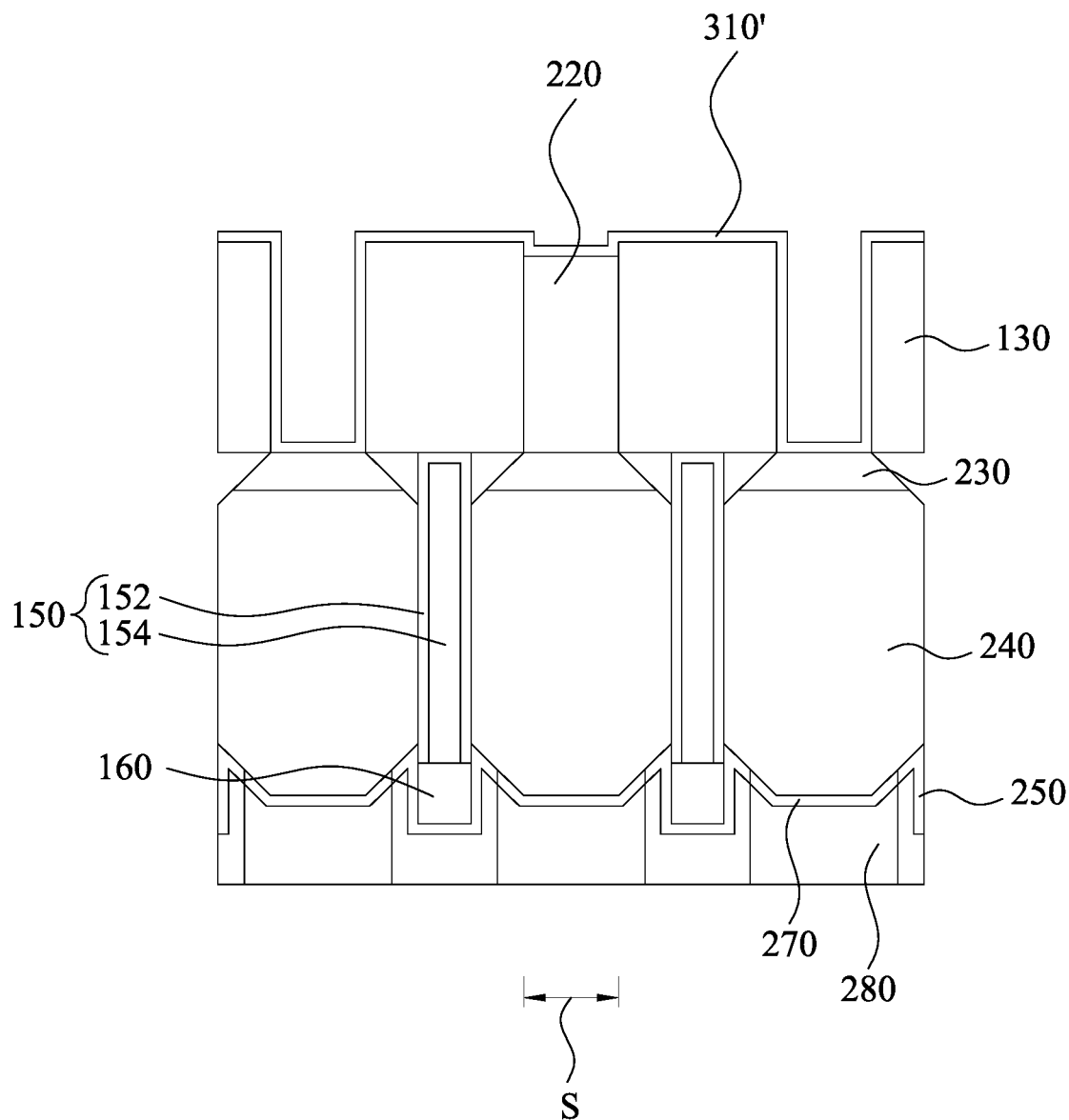
Figure 15D:
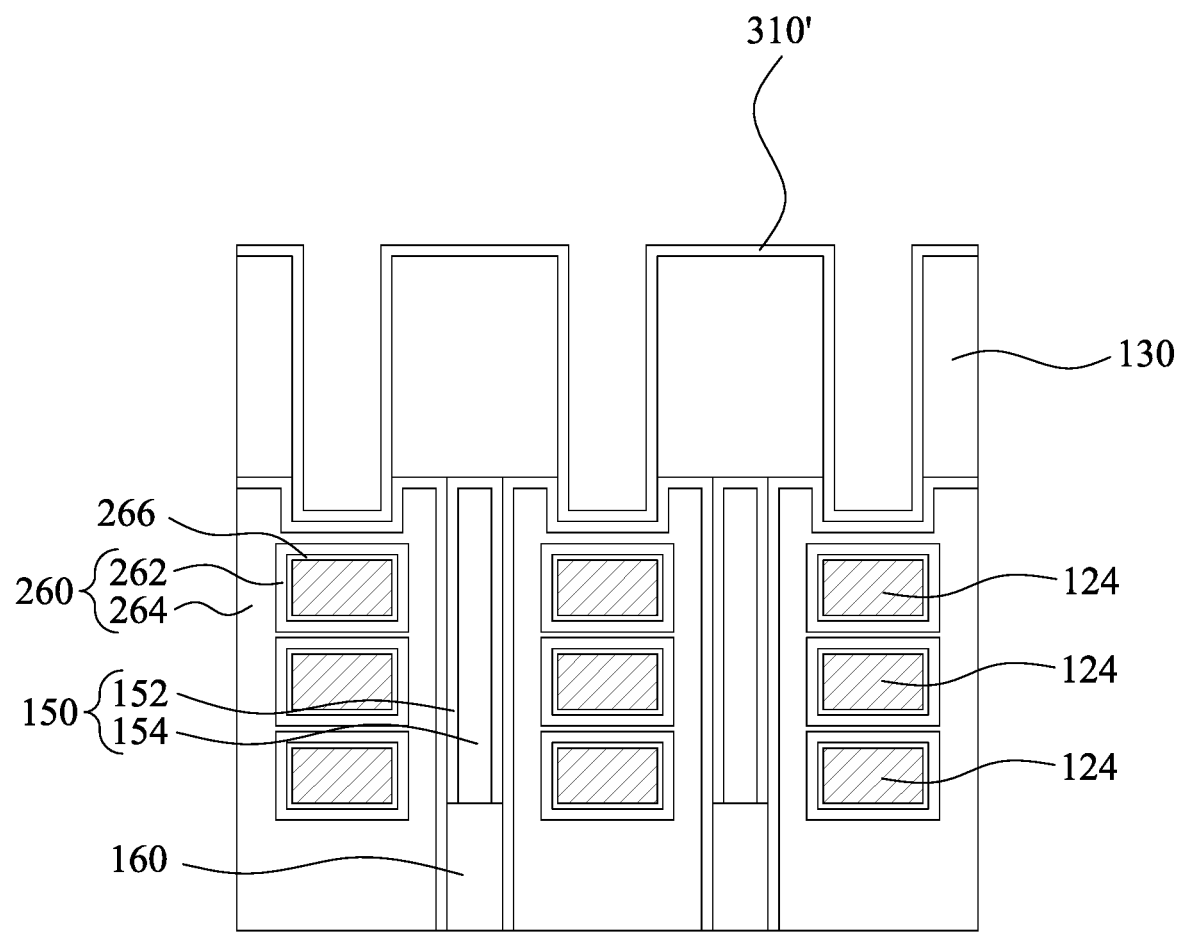

Reference is made to FIGS. 15A-15D, where FIG. 15B is a cross-sectional view taken along line B-B in FIG. 15A, FIG. 15C is a cross-sectional view taken along line C-C in FIG. 15A, and FIG. 15D is a cross-sectional view taken along line D-D in FIG. 15A. A blanket layer 310' of an insulating material for sidewall spacers is conformally formed by using CVD or other suitable methods. The blanket layer 310' is deposited in a conformal manner so that it is formed to have substantially equal thicknesses on vertical surfaces, such as the sidewalls, horizontal surfaces, and the top of the sacrificial gate structure. As shown in FIGS. 15A-15D, the blanket layer 310' is formed to cover the isolation structures 130, the backside surfaces of the gate structure 260, the backside surface of the inner spacers 210, and the sacrificial epitaxial plug 220. In some embodiments, the blanket layer 310' is deposited to a thickness T1 in a range from about 2 nm to about 10 nm. In some embodiments, the insulating material of the blanket layer 310' is a low-κ material. In some embodiments, the blanket layer 310' is a nitride-based material, such as SiN, SiON, SiOCN or SiCN and combinations thereof.

Figure 16A:
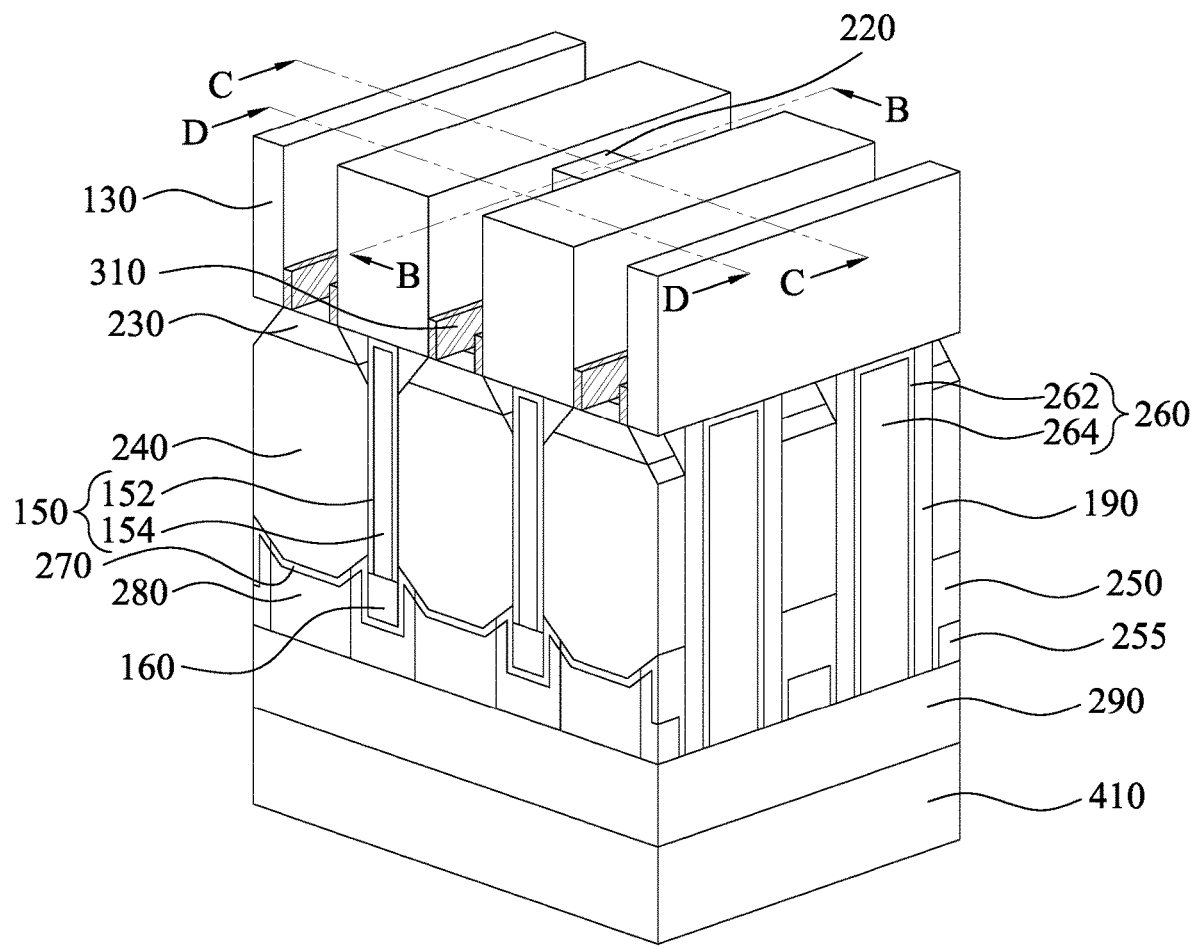
Figure 16B:
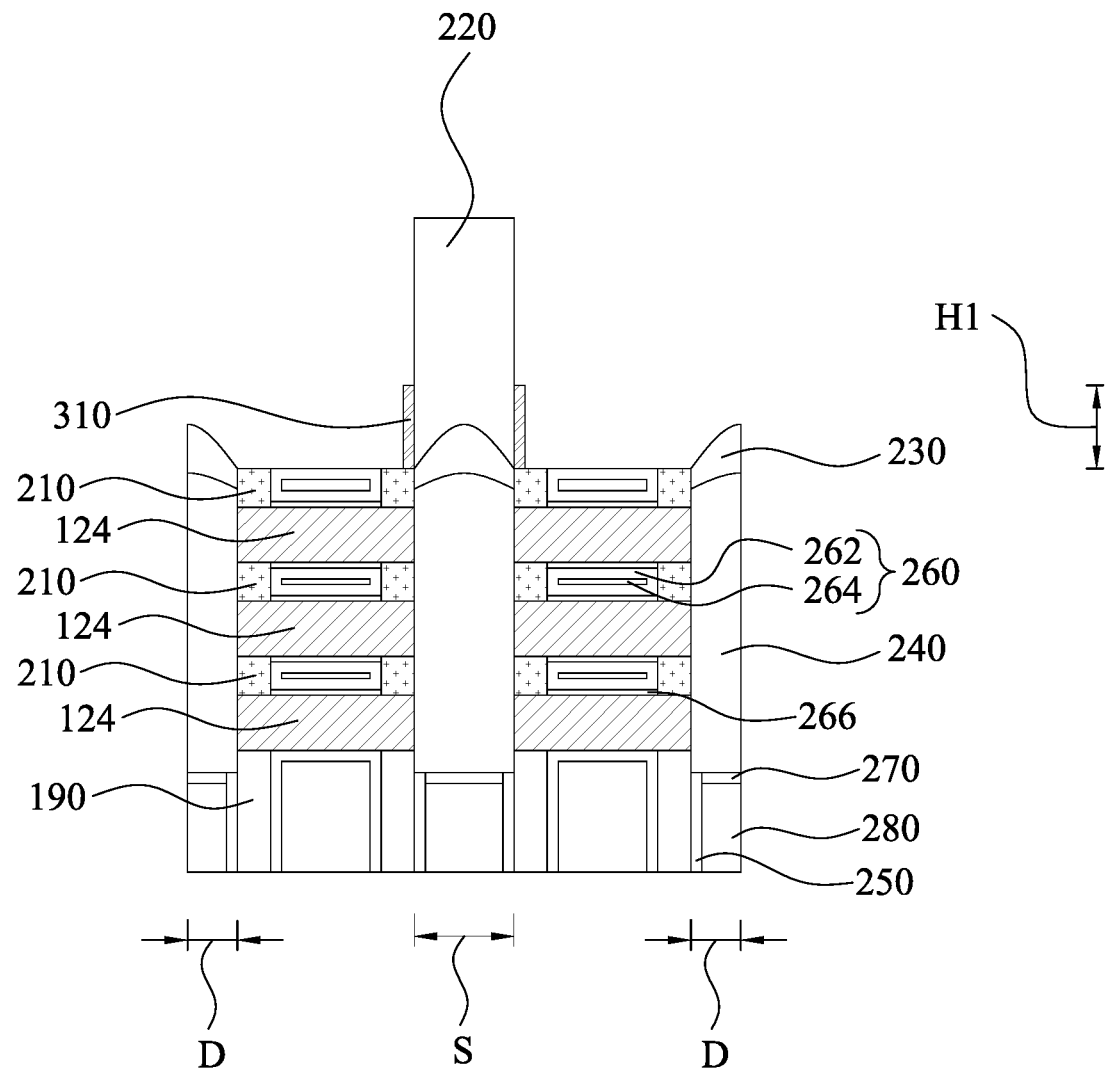
Figure 16C:
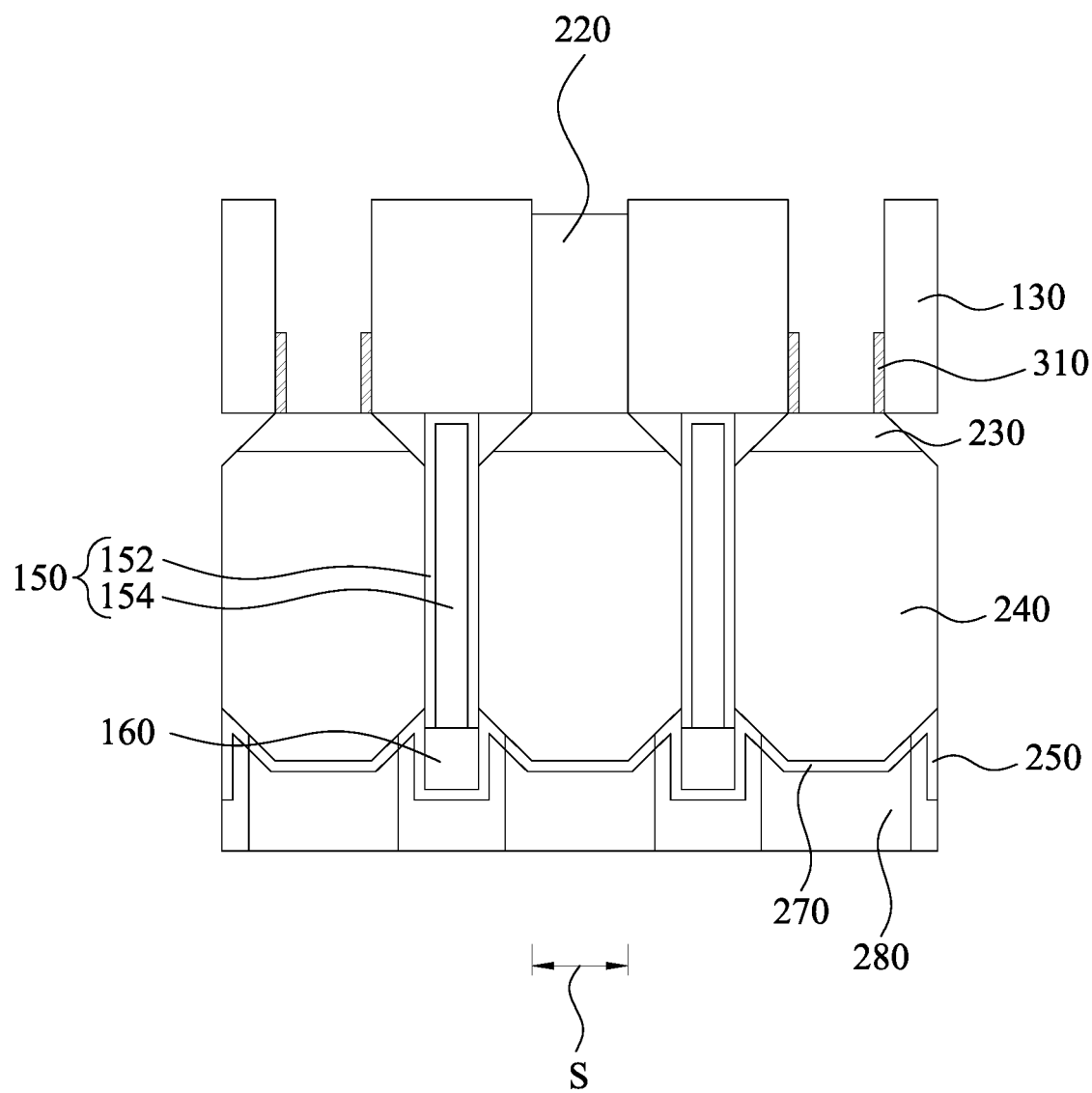
Figure 16D:
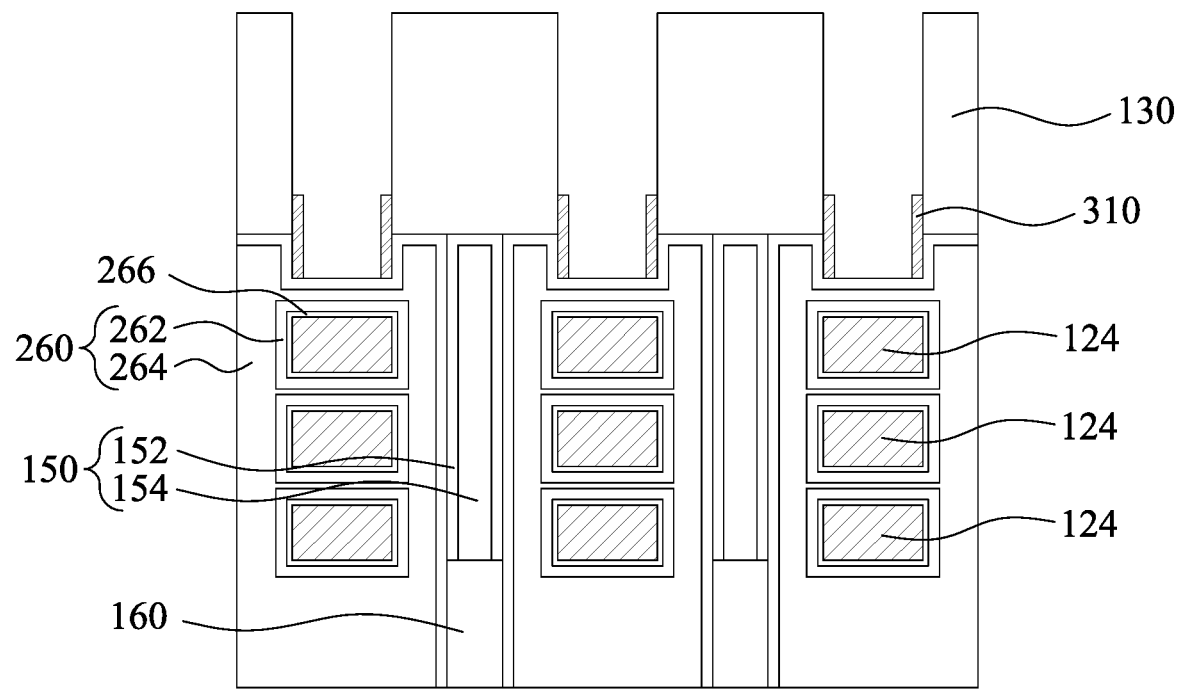

Reference is made to FIGS. 16A-16D, where FIG. 16B is a cross-sectional view taken along line B-B in FIG. 16A, FIG. 16C is a cross-sectional view taken along line C-C in FIG. 16A, and FIG. 16D is a cross-sectional view taken along line D-D in FIG. 16A. The blanket layer 310' (see FIGS. 15A-15D) is then etched using an anisotropic process to form sidewall spacers 310 on opposite sides of a base portion of the sacrificial epitaxial plug 220, such that another portion of the sacrificial epitaxial plug 220 is exposed by the sidewall spacers 310. The anisotropic etching performed on the blanket layer 310' can be, for example, reactive ion etching (RIE). During the anisotropic etching process, most of the insulating material is removed from horizontal surfaces, leaving the dielectric spacer layer on the vertical surfaces such as the sidewalls of the sacrificial epitaxial plug 220. In some embodiments, an etching back process may be performed to reduce the height of the sidewall spacers 310 such that the sidewall spacers 310 are in direct contact with the base portion of the sacrificial epitaxial plug 220 while exposes another portion of the sacrificial epitaxial plug 220. Moreover, portions of the gate structures 260 and portions of sidewalls of the isolation structures 130 are in contact with the sidewall spacers 310 as shown in FIG. 16D. As shown in FIG. 16C, some of the bottom epitaxial structures 230 not in contact with the sacrificial epitaxial plug 220 are in contact with some of the sidewall spacers 310. In some embodiments, a height H1 of the sidewall spacers 310 is lower than about 40 nm, e.g., about 0 nm to about 40 nm.

Figure 17A:
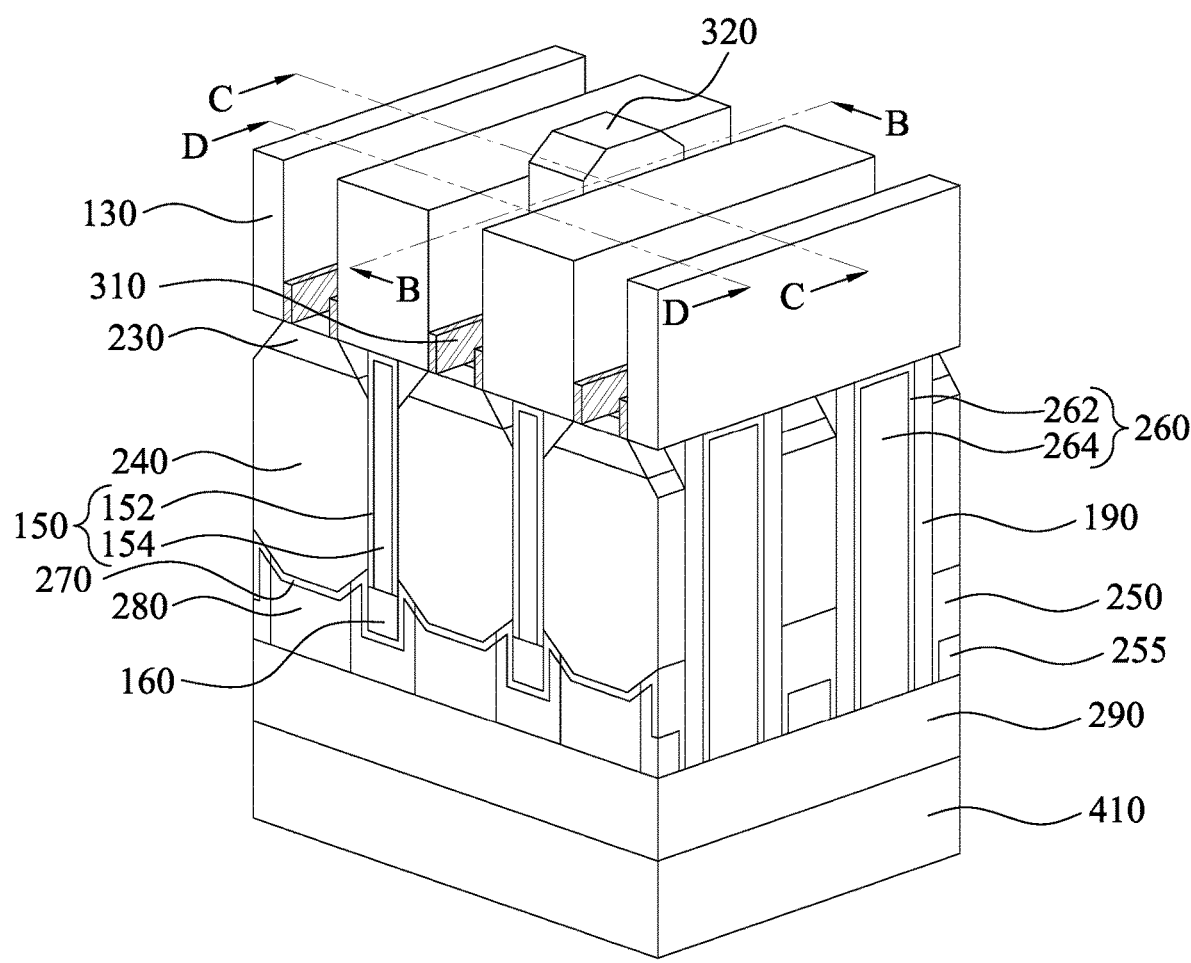
Figure 17B:
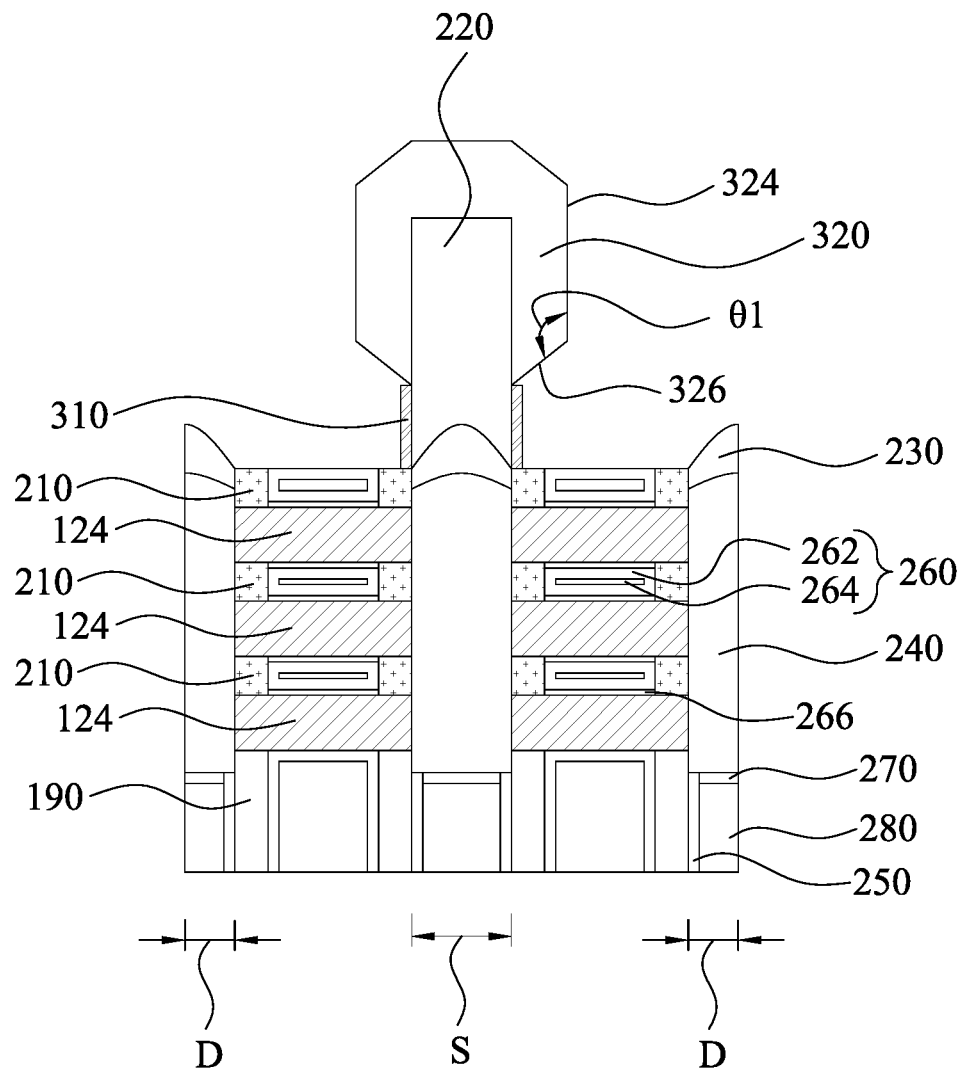
Figure 17C:
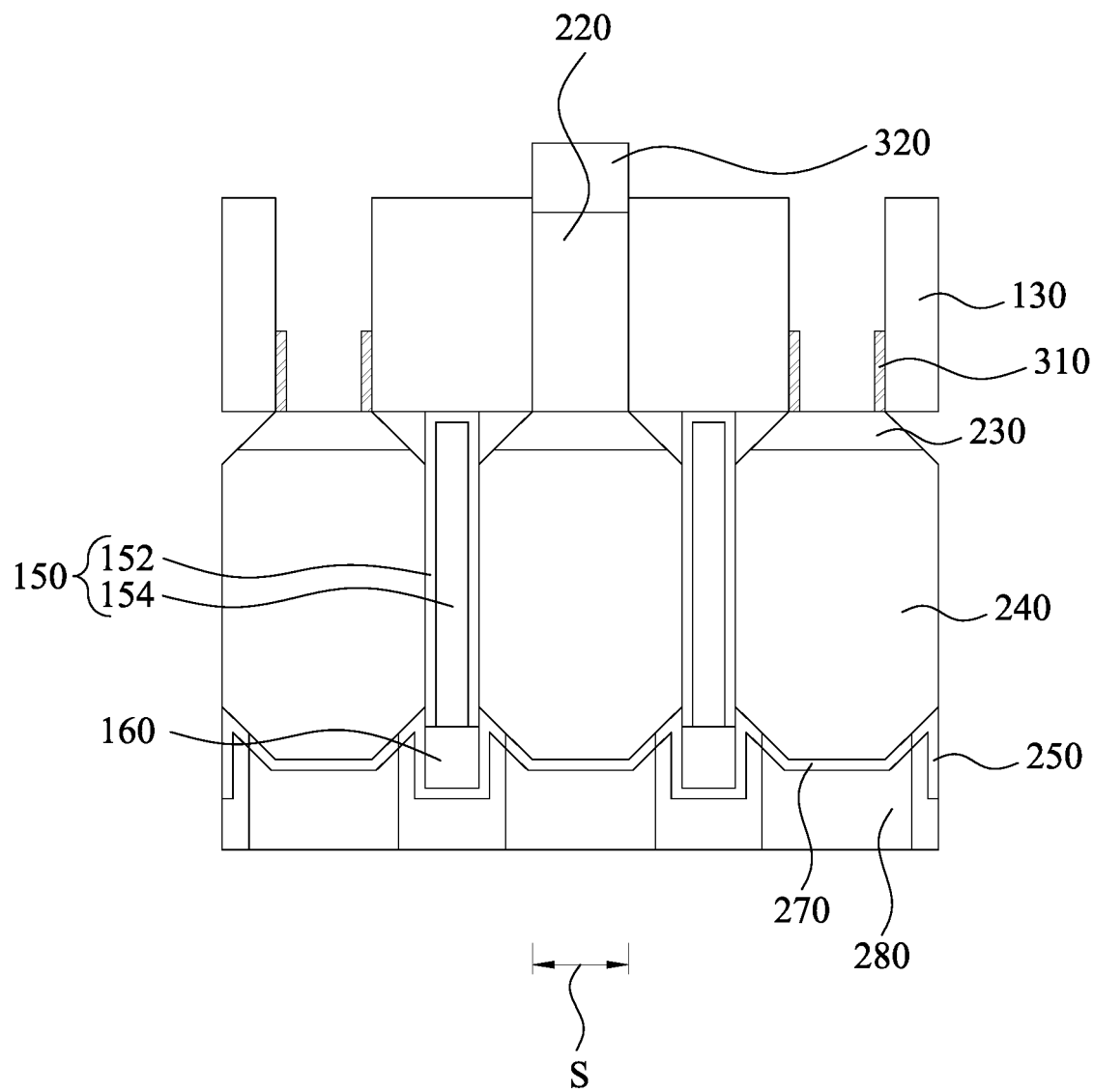
Figure 17D:
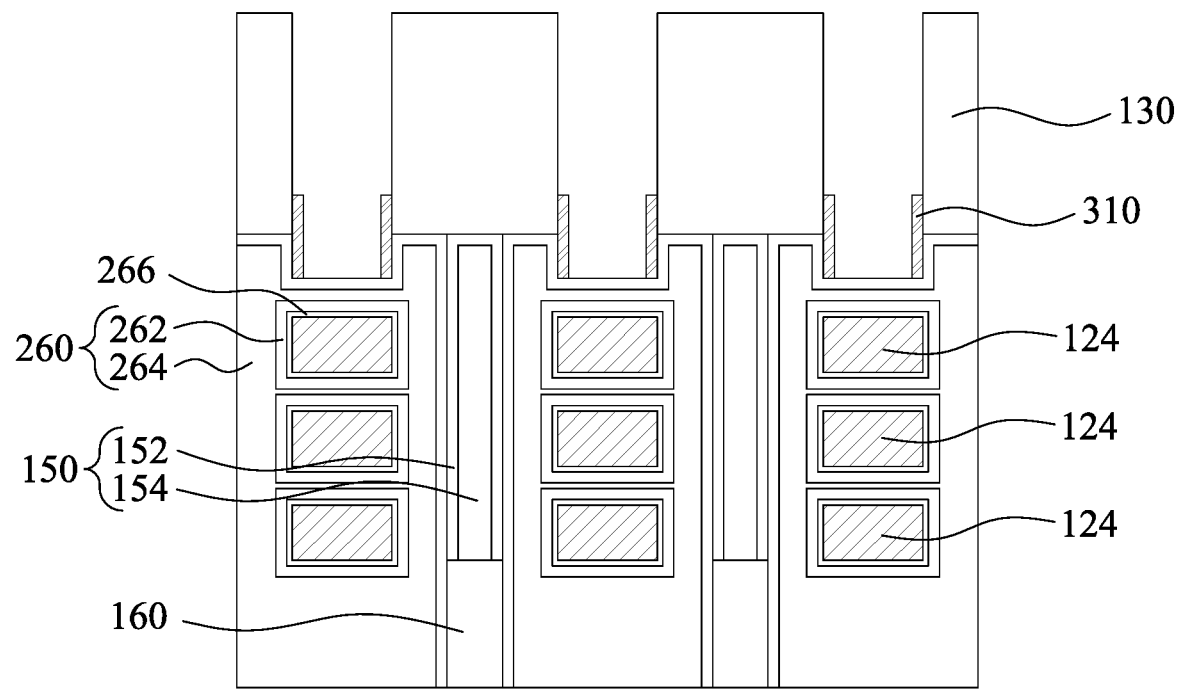

Reference is made to FIGS. 17A-17D, where FIG. 17B is a cross-sectional view taken along line B-B in FIG. 17A, FIG. 17C is a cross-sectional view taken along line C-C in FIG. 17A, and FIG. 17D is a cross-sectional view taken along line D-D in FIG. 17A. A sacrificial epitaxial structure 320 is formed on the portion of the sacrificial epitaxial plug 220 uncovered by the sidewall spacers 310 by performing, for example, a selectively growing process. For example, another mask layer is formed to cover the structure of FIG. 16A, and the mask layer is patterned to expose the sacrificial epitaxial plug 220, and the sacrificial epitaxial structure 320 is formed on the sacrificial epitaxial plug 220. The mask layer may be removed after the formation of the sacrificial epitaxial structure 320. In some embodiments, the sacrificial epitaxial structure 320 are SiGe free from p-type dopants (e.g., boron) and n-type dopants (e.g., phosphorous), because the sacrificial epitaxial structure 320 will be removed in subsequent processing and not serve as source terminals of transistors in a final IC product. A combined structure of a sacrificial epitaxial structure 320 and the sacrificial epitaxial plug 220 may be hammer-shaped in a cross-sectional view, and is thus be referred to as a sacrificial hammer-shaped via that will be replaced with a hammer-shaped backside via in subsequent processing. By way of example and not limitation, the germanium atomic percentage in the sacrificial epitaxial structure 320 is in a range from about 10% to about 50%. In some embodiments, the sacrificial epitaxial structure 320 and the sacrificial epitaxial plug 220 have the same or substantially the same material. Alternatively, the sacrificial epitaxial structure 320 and the sacrificial epitaxial plug 220 have the same or similar etching selectivity.

Due to different growth rates on different crystal planes of the different surfaces of the sacrificial epitaxial plug 220, the growth of sacrificial epitaxial structure 320 includes lateral growth and vertical growth. Facets are hence formed as being the surfaces of the sacrificial epitaxial structure 320. By way of example and not limitation, in the cross-sectional view of FIG. 17B, the sacrificial epitaxial structure 320 has suitable crystallographic orientations (e.g., (110) and (111) crystallographic orientations), such that the sacrificial epitaxial structure 320 have hexagon cross sections. For example, bottom surfaces 326 of the sacrificial epitaxial structure 320 are (111) facets (i.e., the bottom surfaces 326 are downward facing facets facing the gate structures 260), and the sidewalls 324 of the sacrificial epitaxial structure 320 are (110) facets (sidewall facets). The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, an angle θ1 is formed between the bottom surface 326 and the sidewall 324 of the sacrificial epitaxial structure 320, and the angle θ1 is in a range of about 140 degrees to about 180 degrees, e.g., about 144.7 degrees to about 180 degrees, which is determined by the material and/or crystalline orientation of the sacrificial epitaxial structure 320.

In some embodiments, the sacrificial epitaxial structure 320 can be grown by an epitaxial deposition/partial etch process, which repeats the epitaxial deposition/partial etch process at least once, to extend the lateral width thereof. Such repeated deposition/partial etch process is also called a cyclic deposition-etch (CDE) process. In some embodiments, the sacrificial epitaxial structure 320 is grown by selective epitaxial growth (SEG). For example, the sacrificial epitaxial structure 320 is epitaxially grown using reaction gases such as HCl as an etching gas, GeH$_4$ as a Ge precursor gas, DCS and/or SiH$_4$ as a Si precursor gas, H$_2$ and/or N$_2$ as a carrier gas. In some embodiments, the etching gas may be other chlorine-containing gases or bromine-containing gases such as Cl$_2$, BCl$_3$, BiCl$_3$, BiBr$_3$ or the like. The CDE process as discussed above is merely one example to explain how to form the sacrificial epitaxial structure 320 on the sacrificial epitaxial plug 220, and other suitable techniques may also be used to form the sacrificial epitaxial structure 320.

Figure 18A:
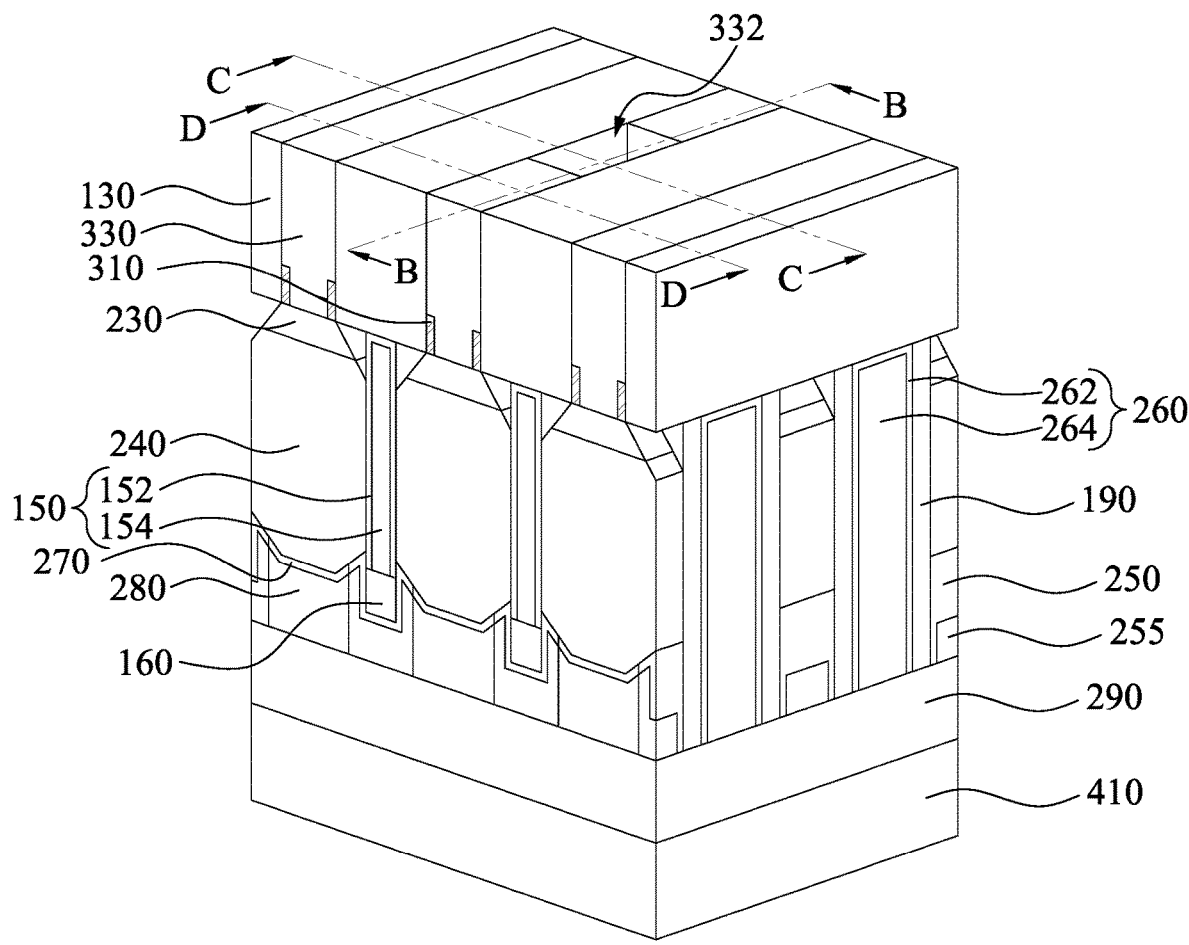
Figure 18B:
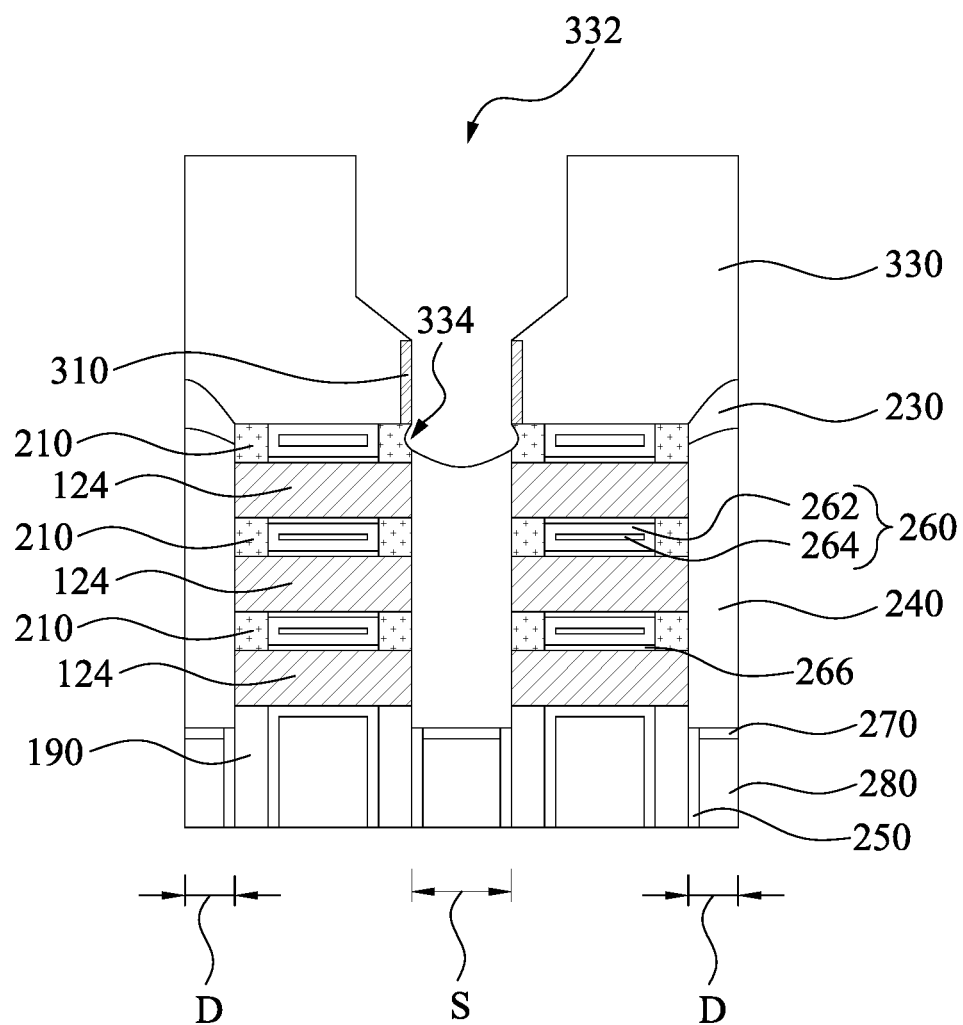
Figure 18C:
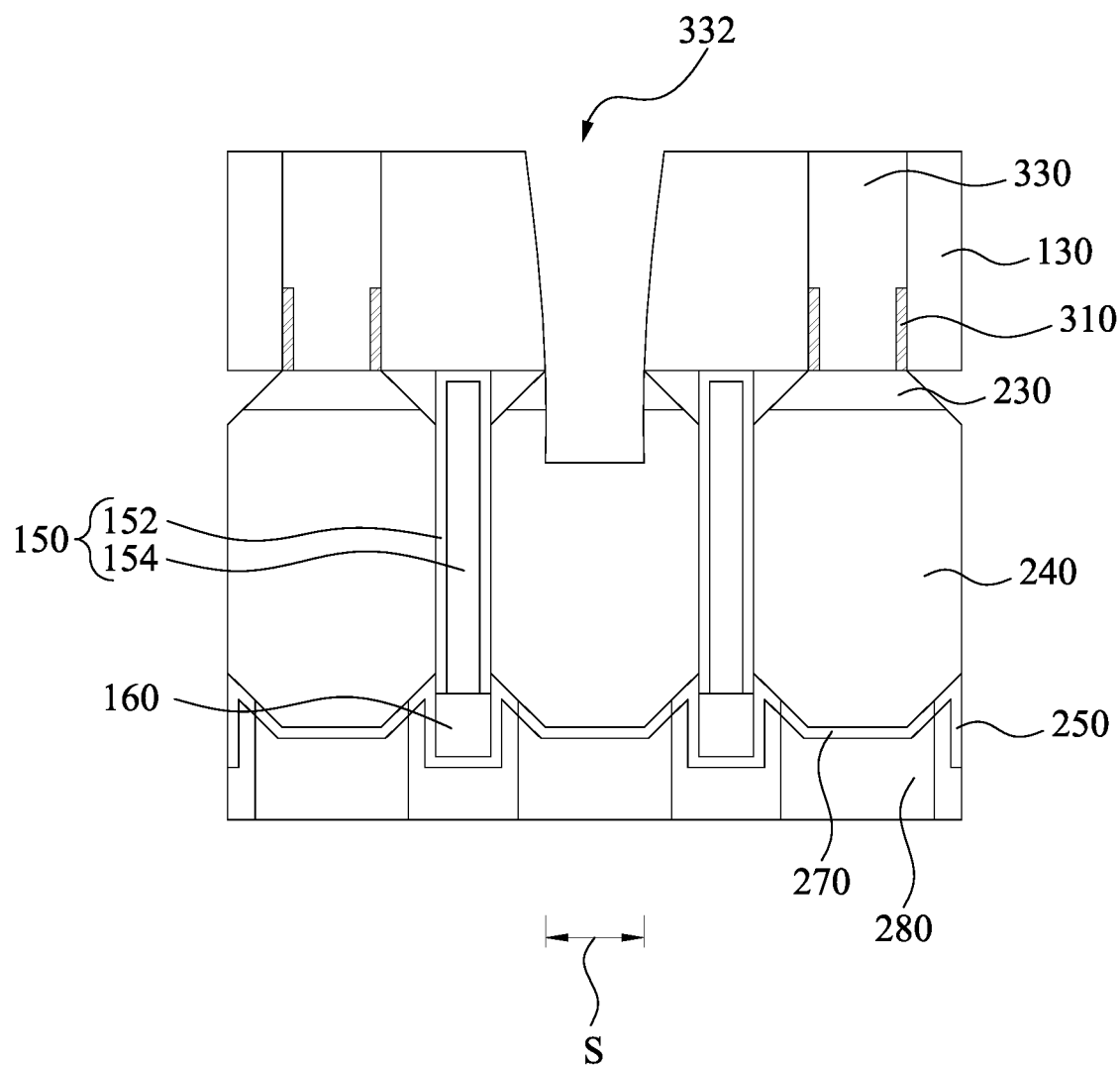
Figure 18D:
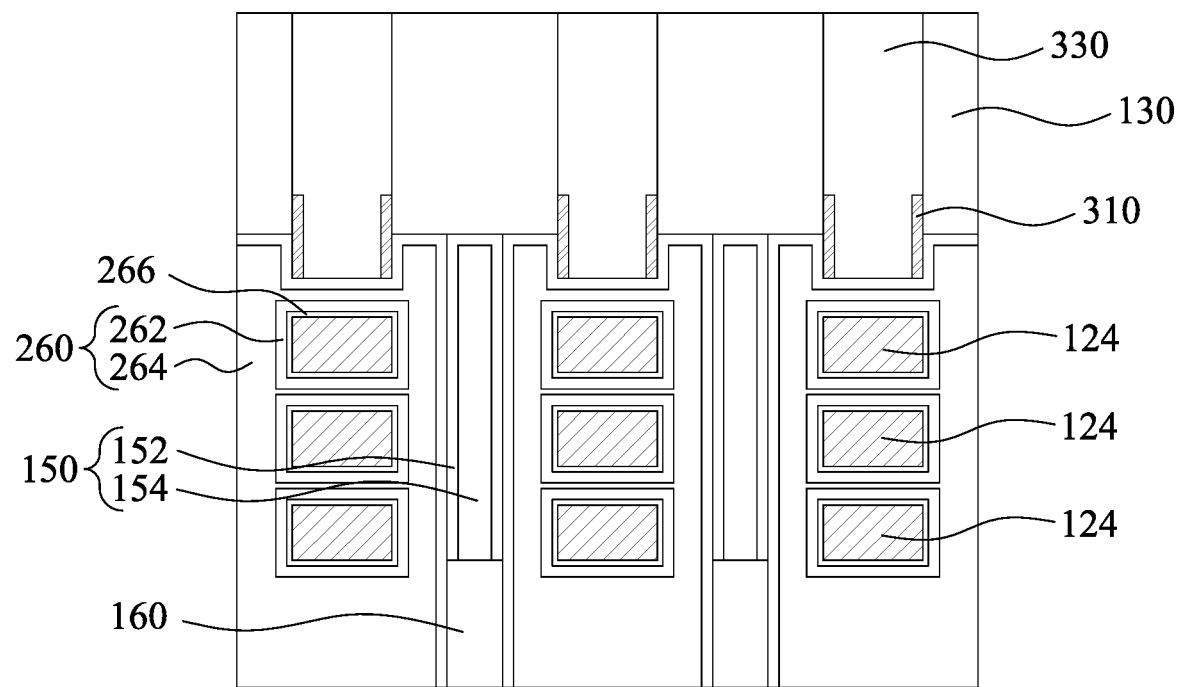

Reference is made to FIGS. 18A-18D, where FIG. 18B is a cross-sectional view taken along line B-B in FIG. 18A, FIG. 18C is a cross-sectional view taken along line C-C in FIG. 18A, and FIG. 18D is a cross-sectional view taken along line D-D in FIG. 18A. Isolation materials 330 are formed to fill the rest space between the isolation structures 130. Since the sacrificial epitaxial plug 220 is covered by the sacrificial epitaxial structure 320 and the sidewall spacers 310, the isolation materials 330 are spaced apart from the sacrificial epitaxial plug 220. In some embodiments, the isolation materials 330 may be formed, for example, of a low-κ dielectric material (materials having a dielectric constant lower than silicon dioxide), such as silicon oxynitride, phosphosilicate glass (PSG), borophosphosilicate glass (BPSG), fluorinated silicate glass (FSG), SiO$_x$C$_y$, SiO$_x$C$_y$H$_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-κ materials (e.g., having a dielectric constant less than about 2.9), such κ=2.5-2.6, may also be used. Alternatively, the isolation materials 330 and the isolation structures 130 have substantially the same materials, e.g., oxide materials. These materials and processes are provided as examples and other materials and processes may be used.

Subsequently, the sacrificial epitaxial structure 320 and the sacrificial epitaxial plug 220 are replaced with a backside via 360 (see FIGS. 19A-19D). Specifically, the sacrificial epitaxial structure 320 and the sacrificial epitaxial plug 220 are removed such that an opening 332 is formed between the isolation materials 330 and between the isolation structures 130. The removal of the sacrificial epitaxial structure 320 and the sacrificial epitaxial plug 220 are performed using, for example, CMP, HNA, and/or TMAH etching. The removal of the sacrificial epitaxial structure 320 and the sacrificial epitaxial plug 220 is a selectively etching process, which removes the sacrificial epitaxial structure 320 and the sacrificial epitaxial plug 220 at an etching rate much higher than an etching rate for etching the isolation structure 130 and the isolation materials 330. Portions of the isolation structure 130, however, may be unintentionally removed as shown in FIG. 18C.

In some embodiments, the bottom epitaxial structure 230 right under the sacrificial epitaxial plug 220 is partially removed. In still some embodiments, a portion of the top epitaxial structure 240 right under the removed bottom epitaxial structure 230 is also removed. Further, the inner spacers 210 are partially removed such that recesses 334 may be formed adjacent the inner spacers 210.

Figure 19A:
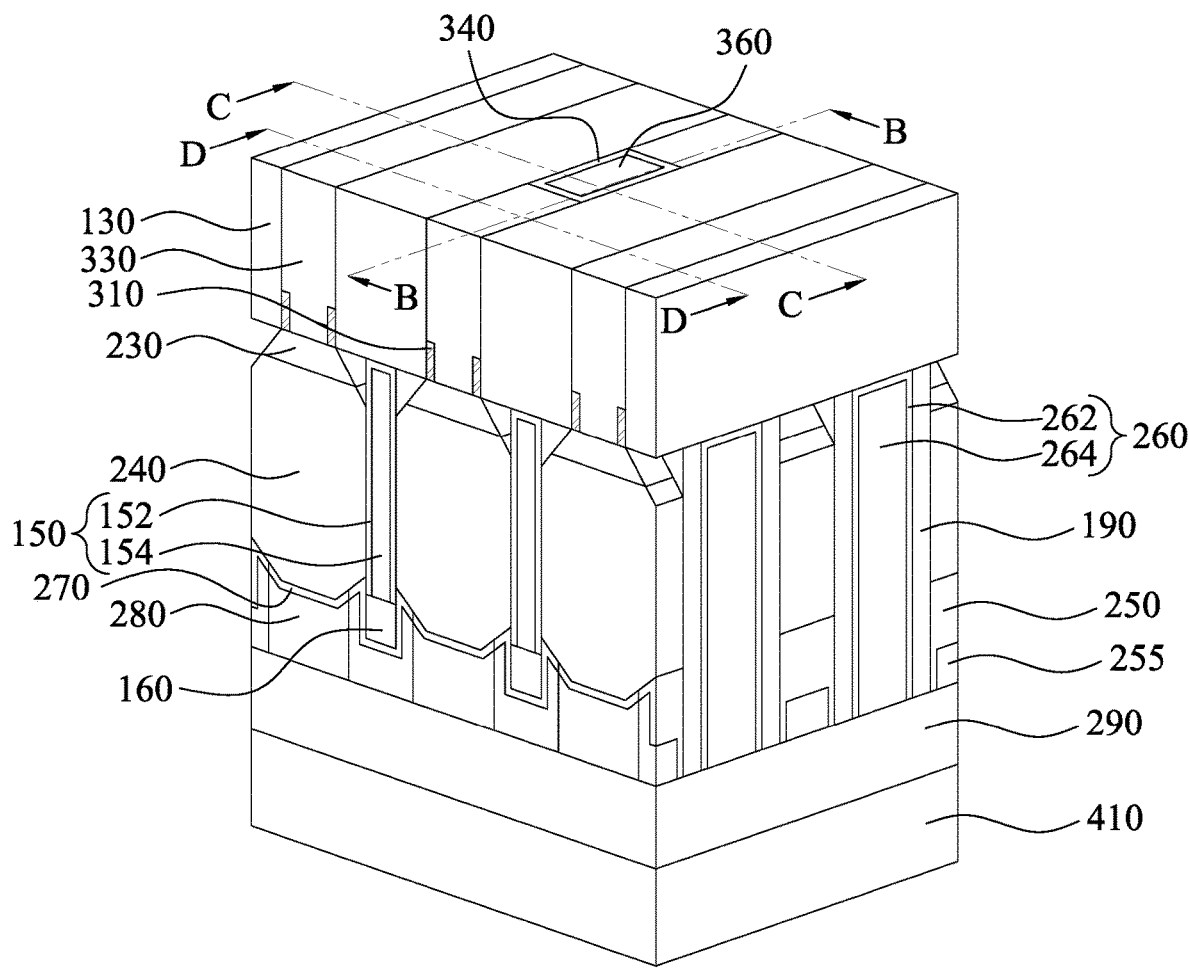
Figure 19B:
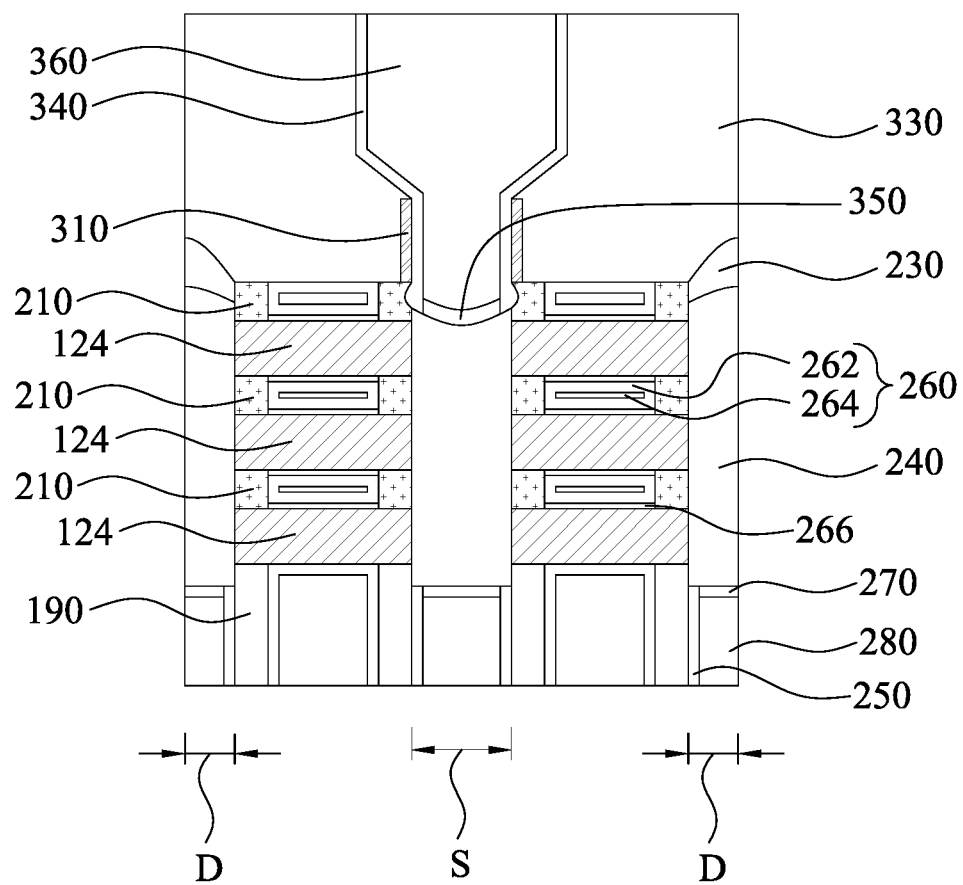
Figure 19C:
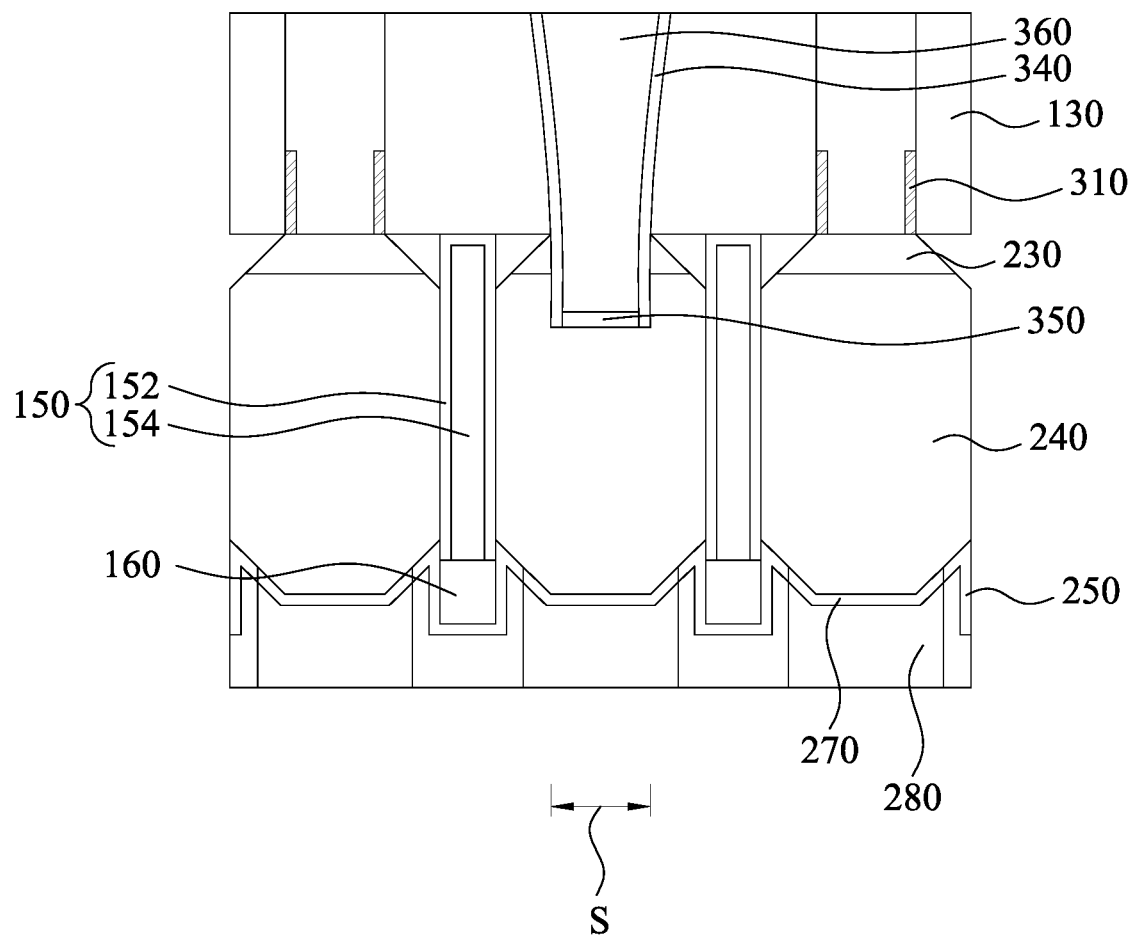
Figure 19D:
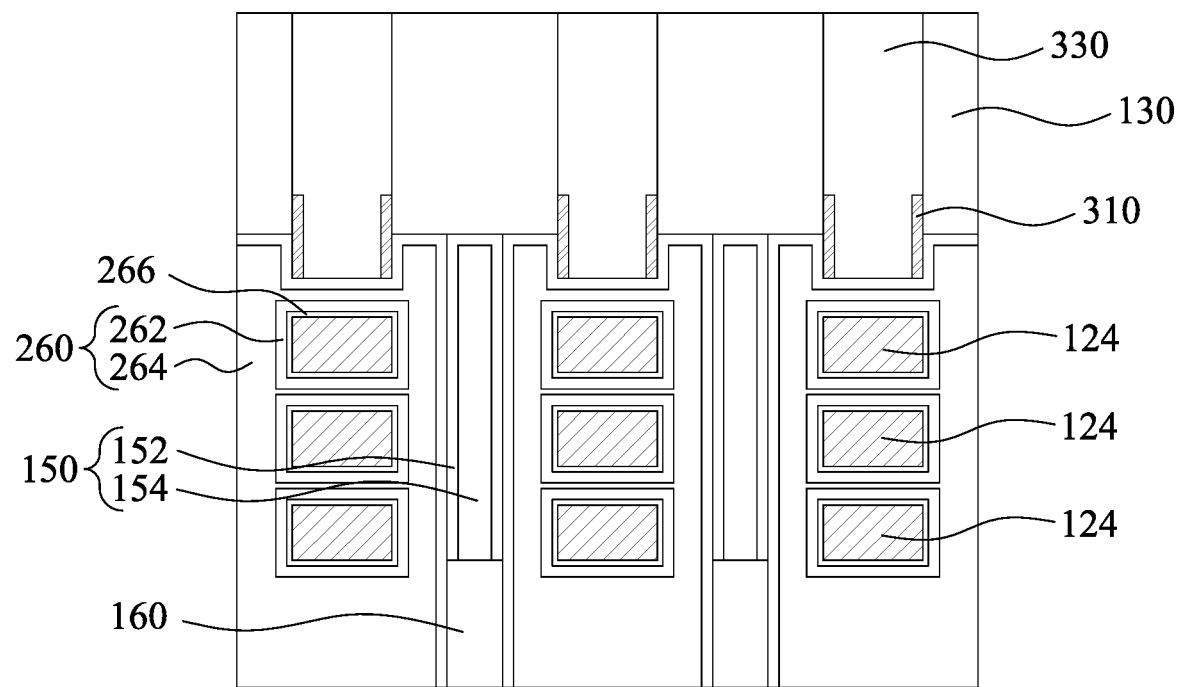

Reference is made to FIGS. 19A-19D, where FIG. 19B is a cross-sectional view taken along line B-B in FIG. 19A, FIG. 19C is a cross-sectional view taken along line C-C in FIG. 19A, and FIG. 19D is a cross-sectional view taken along line D-D in FIG. 19A. A backside CESL 340 is conformally formed in the opening 332 and the recesses 334 (see FIG. 18B). In some embodiments, the backside CESL 340 is formed of $Si_3N_4$. In some other embodiments, the backside CESL 340 includes materials such as oxynitrides. In yet some other embodiments, the backside CESL 340 may have a composite structure including a plurality of layers, such as a silicon nitride layer overlying a silicon oxide layer. The backside CESL 340 can be formed using plasma enhanced CVD (PECVD), however, other suitable methods, such as low pressure CVD (LPCVD), atomic layer deposition (ALD), and the like, can also be used.

Subsequently, a horizontal portion of the backside CESL 340 is removed to expose the etched top epitaxial structure 240, which serves as a source of the semiconductor device. In the meantime, other epitaxial structures 240 serving as drains of the semiconductor device are covered by the isolation materials 330.

At least one backside metal alloy layer 350 is formed above the etched top epitaxial structure 240. The backside metal alloy layer 350, which may be silicide layers, is formed in the opening 332 (see FIG. 18B) and over the exposed top epitaxial structure 240 by a self-aligned silicide (salicide) process. In some embodiments, the backside metal alloy layer 350 may include a material selected from titanium silicide, cobalt silicide, nickel silicide, platinum silicide, nickel platinum silicide, erbium silicide, palladium silicide, combinations thereof, or other suitable materials. In some embodiments, the backside metal alloy layer 350 may include germanium.

A backside via 360 is then formed in the opening 332 (see FIGS. 18B) and above the backside metal alloy layer 350. As such, the backside via 360 is electrically connected to the etched top epitaxial structure 240. In some embodiments, the backside via 360 may be made of metal, such as W, Co, Ru, Al, Cu, or other suitable materials. After the deposition of the backside via 360, a planarization process, such as a chemical mechanical planarization (CMP) process, may be then performed. In some embodiments, a barrier layer may be formed in the opening 322 before the formation of the backside via 360. The barrier layer may be made of TiN, TaN, or combinations thereof.

Figure 20A:
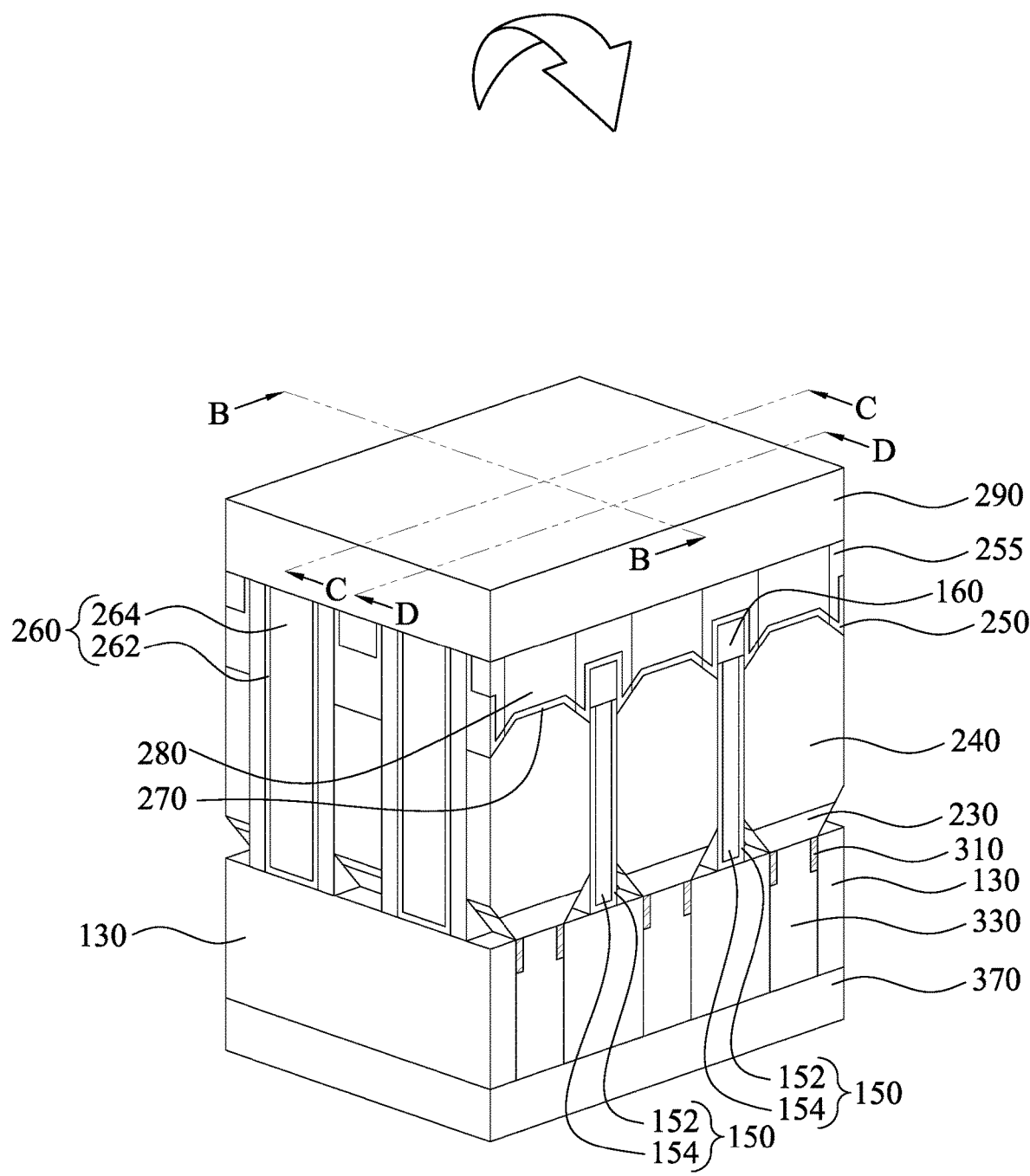
Figure 20B:
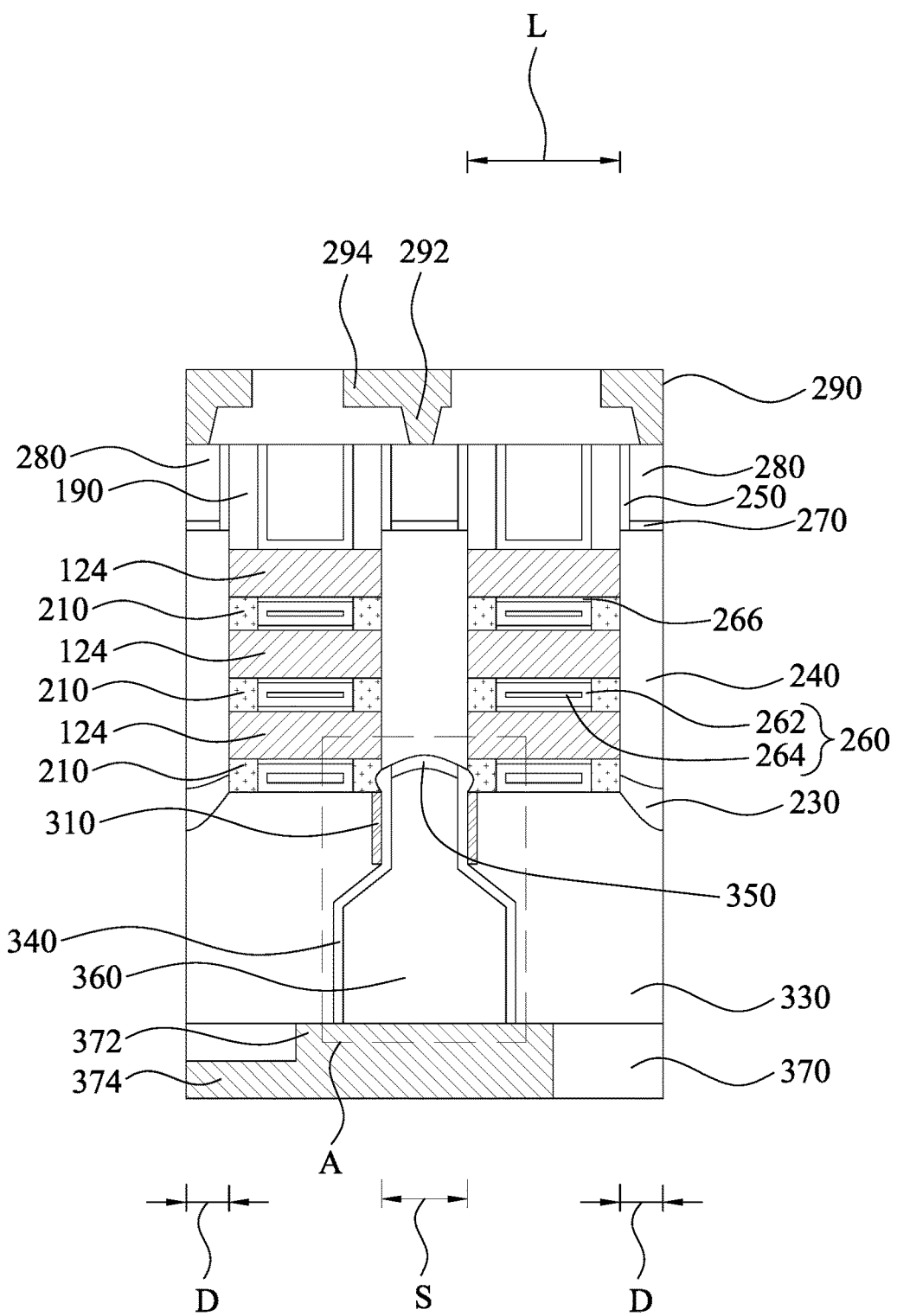
Figure 20C:
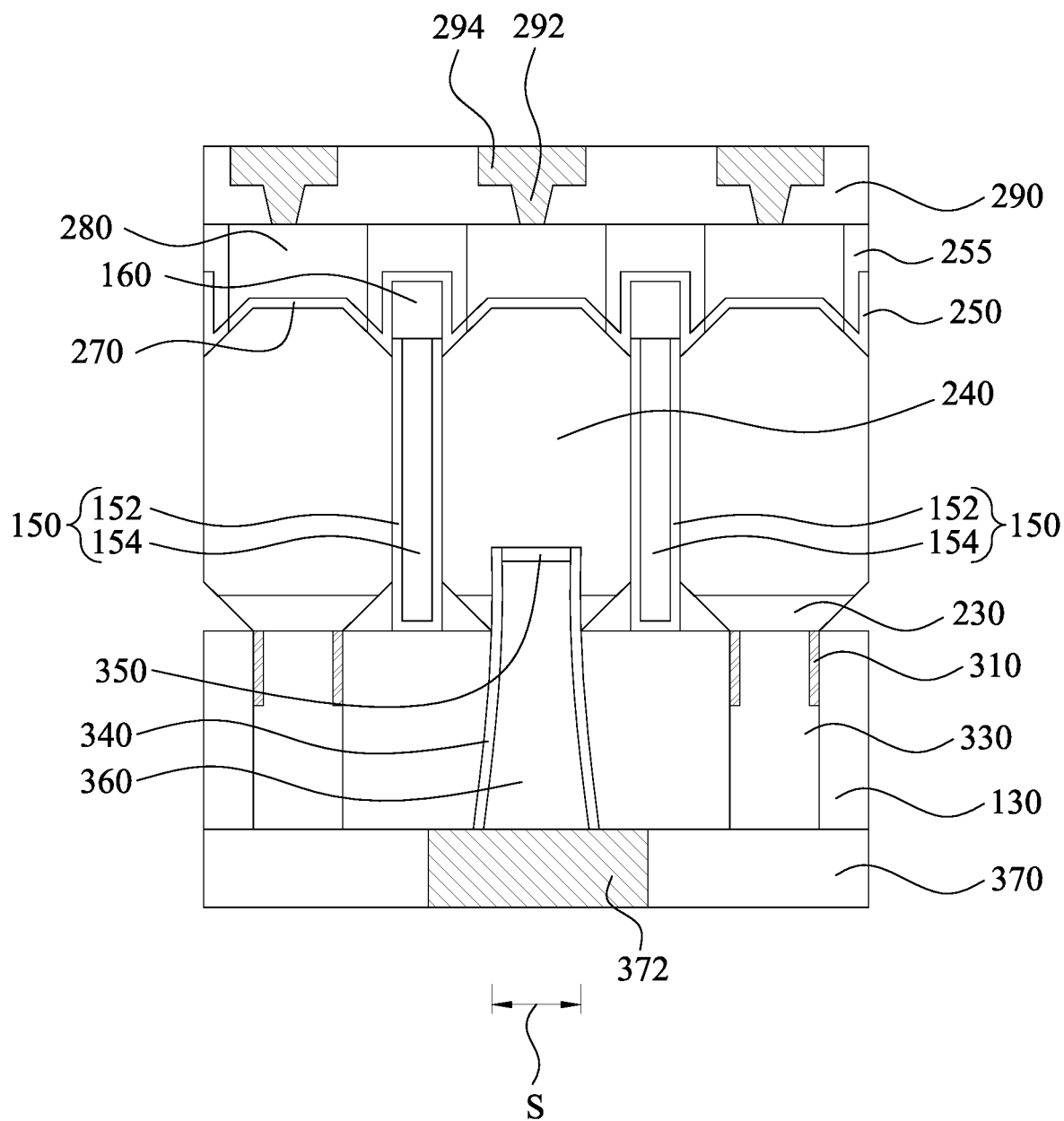
Figure 20D:
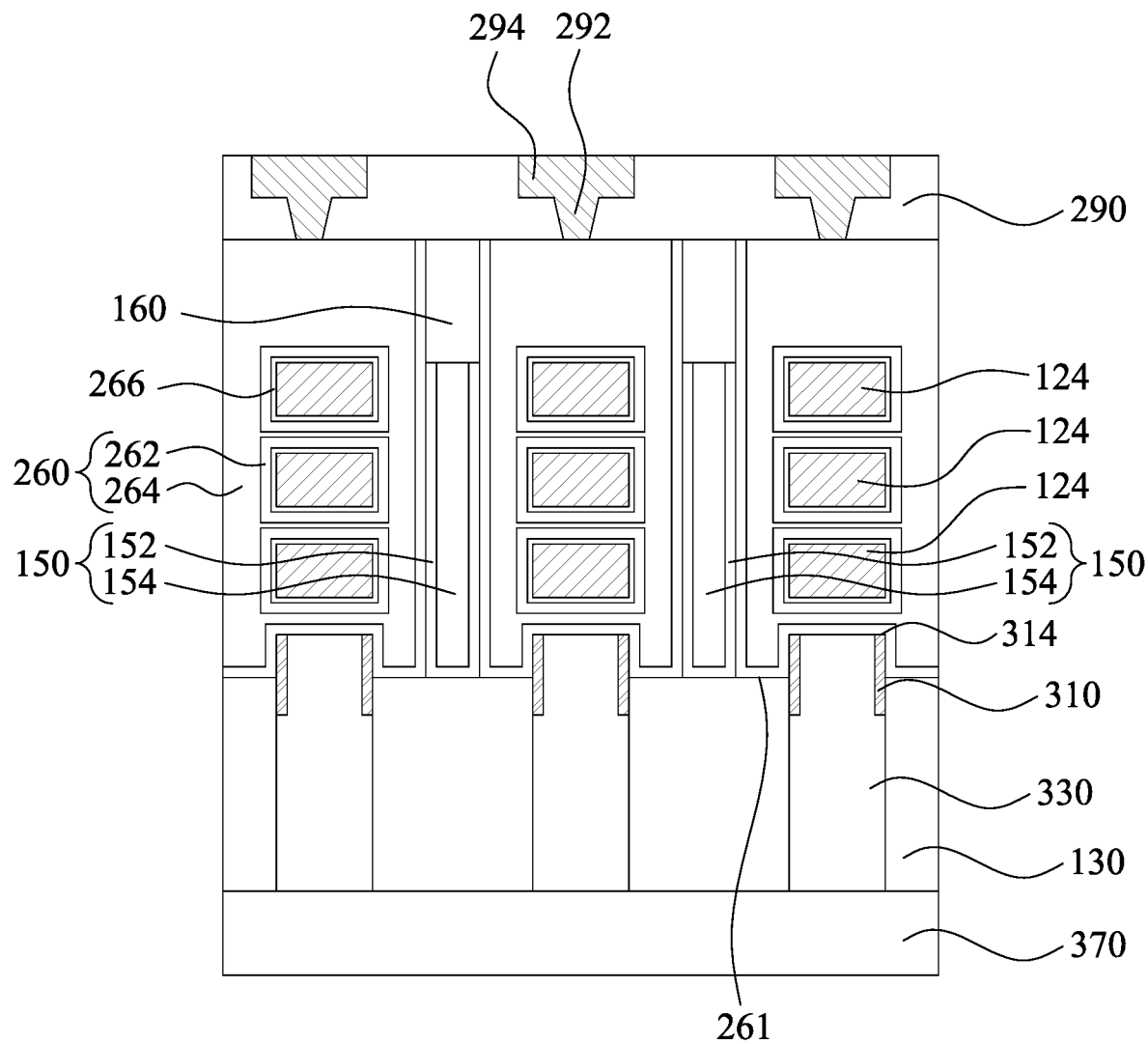

Reference is made to FIGS. 20A-20D, where FIG. 20B is a cross-sectional view taken along line B-B in FIG. 20A, FIG. 20C is a cross-sectional view taken along line C-C in FIG. 20A, and FIG. 20D is a cross-sectional view taken along line D-D in FIG. 20A. A backside multilayer interconnection (MLI) 370 including metal layers and inter-metal dielectric (IMD) is formed over the isolation structure 130 and the isolation materials 330 to electrically connect various features or structures (e.g., one or more backside via 360) of the semiconductor device. The backside MLI 370 includes vertical interconnects, such as vias or contacts 372, and horizontal interconnects, such as metal lines 374. The various interconnection features may implement various conductive materials including copper, tungsten and silicide. In some examples, a damascene process is used to form copper multilayer interconnection structure.

The carrier substrate 410 (see FIGS. 19A-19D) is then removed from the front-side MLI 290, and the structure is "flipped" upside down again. As such, a semiconductor device is formed. Specifically, the semiconductor device includes the second semiconductor layers 124 as channel layers of the semiconductor device. The second semiconductor layers 124 are arranged one above another in a spaced apart manner. The gate structures 260 surround or wrap around each of the second semiconductor layers 124. In some embodiments, the channel length L of the second semiconductor layers 124 is in a range of about 5 nm to about 150 nm. The semiconductor device further includes S/D epitaxial structures (e.g., the top epitaxial structures 240 and/or the bottom epitaxial structures 230) as sources and/or drains of the semiconductor device. The S/D epitaxial structures are electrically connected to the second semiconductor layers 124 and on opposite sides of the gate structures 260. The S/D epitaxial structures can be connected to external circuits from a front side of the semiconductor device through the contacts 280. Some of the S/D epitaxial structures, e.g., the top epitaxial structure 240 connected to the backside via 360, can be further connected to external circuits from the backside of the semiconductor device through the backside via 360. Each of the gate structures 260 and the S/D epitaxial structures has a front-side facing upward and a backside facing downward. The front-side MLI 290 is over the front-sides of the gate structures 260 and the S/D epitaxial structures, and the backside via 360 is connected to the backside of one of the S/D epitaxial structures.

Figure 20E:
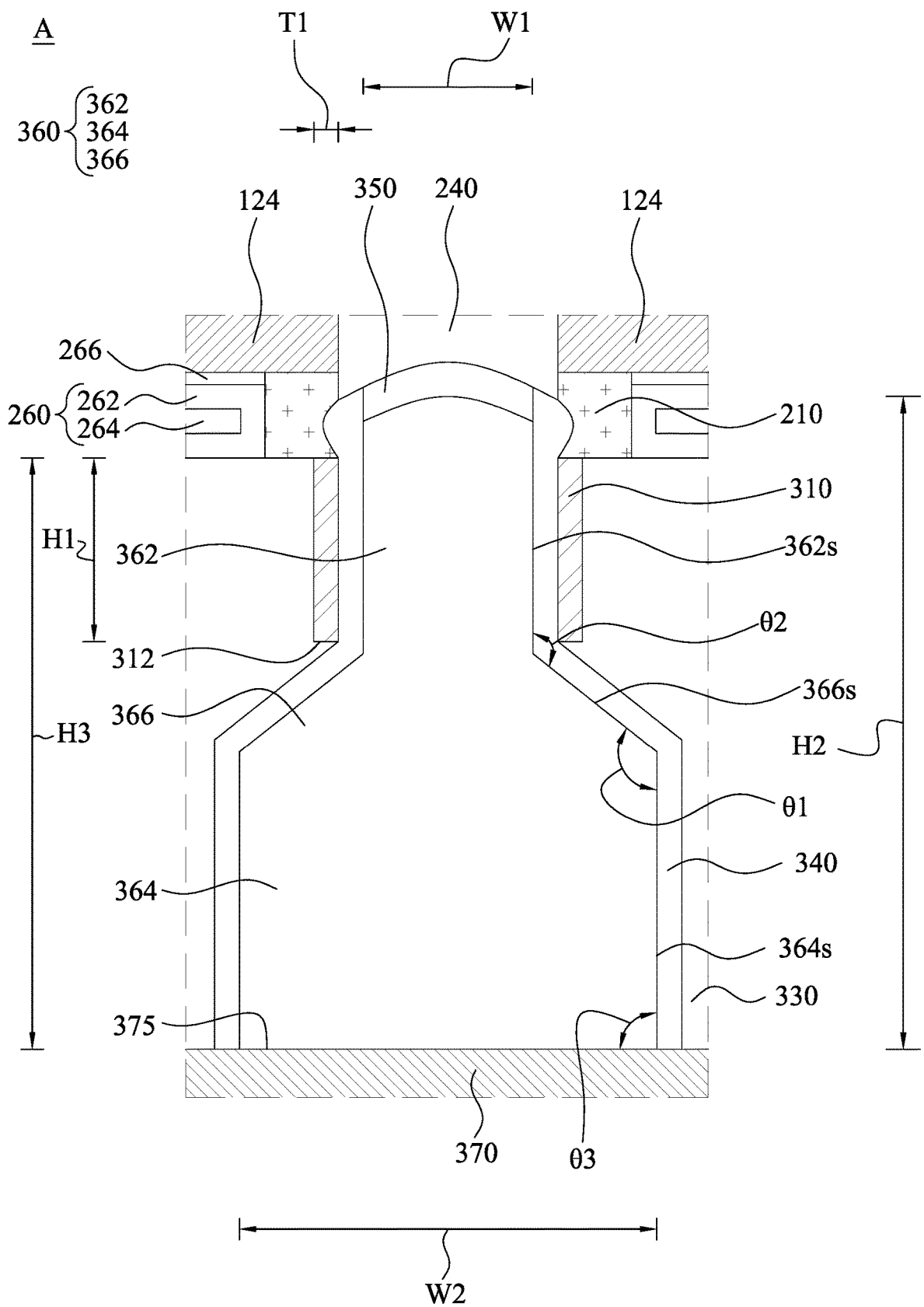

FIG. 20E is an enlarged view of area A in FIG. 20B. Referring to FIGS. 20B and 20E, the backside via 360 includes a first portion 362, a second portion 364, and a third portion 366 between the first portion 362 and the second portion 364. The first portion 362 is closer to the top epitaxial structure 240 than the second portion 364. The first portion 362 has a substantially constant width, the second portion 364 has a substantially constant width, and the third portion 366 has tapered sidewalls 366s. That is, the third portion 366 has a width variation greater than that of the first portion 362 and that of the second portion 364. A width W1 of the first portion 362 is less than a width W2 of the second portion 364, such that the third portion 366 tapers from the second portion 364 toward the first portion 362. In some embodiments, the width W1 of the first portion 362 is in a range of about 5 nm to about 25 nm. In some embodiments, the width W2 of the second portion 364 is in a range of about 10 nm to about 45 nm. Further, a height H2 of the backside via 360 is in a range of about 15 nm to about 50 nm.

In some embodiments, an angle θ1 is formed between the sidewall 366s of the third portion 366 and a sidewall 362s of the first portion 362, and the angle θ2 is greater than about 140 degrees and less than about 180 degrees, e.g., about 144.7 degrees to about 179 degrees. The angle θ2 is determined by the shape of the sacrificial epitaxial structure 320 (see FIG. 17B). In some embodiments, an angle θ2 is formed between the sidewall 366s of the third portion 366 and a sidewall 364s of the second portion 364, and the angle θ1 is greater than about 140 degrees and less than about 180 degrees, e.g., about 144.7 degrees to about 179 degrees. The angle θ2 is determined by the shape of the sacrificial epitaxial structure 320 (see FIG. 17B). In some embodiments, an angle θ3 is formed between the sidewall 364s of the second portion 364 and an interface 375 between the backside MLI 370 and the backside via 360, and the angle θ3 is in a range of about 54.7 degrees to about 90 degrees, e.g., about 90 degrees.

In some embodiments, the semiconductor device further includes sidewall spacers 310 on opposite sides of the first portion 362 of the backside via 360. The sidewall spacers 310 are offset from the second portion 364 of the backside via 360 and aligned with the first portion 362 of the backside via 360. As shown in FIG. 20A, the sidewall spacers 310 are further in contact with the bottom epitaxial structures 230. A height H1 of the sidewall spacers 310 is less than about 40 nm. If the height H1 is greater than about 40 nm, the sacrificial epitaxial plug 220 (see FIG. 17B) may not have sufficient surface area for growing the sacrificial epitaxial structure 320 (see FIG. 17B). The height H2 of the backside via 360 is greater than the height H1 of the sidewall spacers 310 such that the width W2 of the second portion 364 is greater than the width W1 of the first portion 362. In some embodiments, each of the sidewall spacers 310 has a thickness T1 is less than about 15 nm. If the thickness T1 is greater than about 15 nm, the sidewall spacers 310 may not be conformally formed and is merged between the isolation structures 130. Further, the sidewall spacers 310 are spaced apart from the dummy fin structures 150. A topmost surface 314 of the sidewall spacers 310 is higher than a bottommost surface 261 of the gate structure 260. Further, the sidewall spacers 310 are spaced apart from the dummy fin structures 150.

In some embodiments, the semiconductor device further includes the isolation materials 330 on opposite sides of the backside via 360. As shown in FIGS. 20B and 20E, the isolation material 330 includes a portion in contact with the backside surfaces 312 of the sidewall spacers 310. Further, as shown in FIGS. 20B and 20D, the isolation material 330 is in contact with the gate dielectric layer 262 of the gate structure 260, some of the inner spacers 210, some of the bottom epitaxial structures 230, the sidewall spacers 310, and the isolation structure 130. Further, in some embodiments, the sidewall spacers 310 are sandwiched between the isolation material 330 and the isolation structure 130 and between the isolation material and the backside via 360. The sidewall spacers 310 have a material different from that of the isolation material 330 and/or the isolation structure 130. For example, the sidewall spacers 310 are nitride layers and the isolation material 330 and/or the isolation structure 130 are oxide layers. A height H3 of the isolation materials 330 is greater than the height H1 of the sidewall spacers 310.

In some embodiments, the semiconductor device further includes the backside CESL 340 laterally surrounding the backside via 360. The backside CESL 340 is conformal to the sidewalls of the backside via 360. The backside CESL 340 is in contact with the isolation materials 330 and the sidewall spacers 310. In some embodiments, due to the formation of the recesses 334 (see FIG. 18B), the backside CESL 340 includes a portion having a greater width in contact with the inner spacer 210.

As shown in FIGS. 20B and 20E, the size of the backside via 340 is extended due to the formation of the sacrificial epitaxial structure 320 (see FIG. 17B). As such, a contact area between the backside via 340 and the via 372 of the backside MLI 370 is increased. This configuration reduces the total (parasitic) resistance including the backside via 340 itself and the interface between the backside via 340 and the via 372 of the backside MLI 370 and further boost device performance. Further, the height H1 of the sidewall spacer 310 can tune the shape of the sacrificial epitaxial structure 320 (see FIG. 17B), and desired shapes of the backside via 340 can be obtained.

Figure 21A:
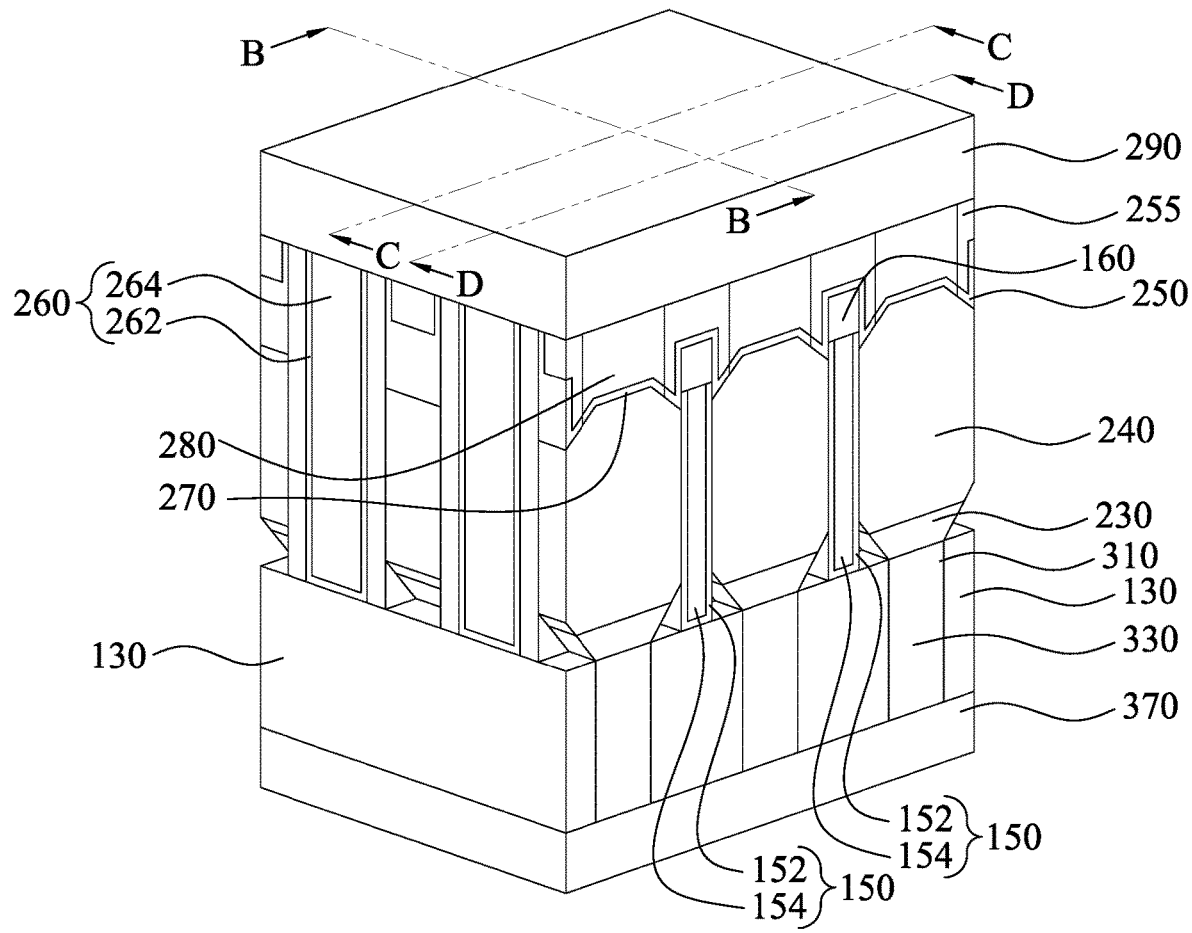
FIG. 21A is a perspective view of a semiconductor device in accordance with some embodiments of the present disclosure.
Figure 21B:
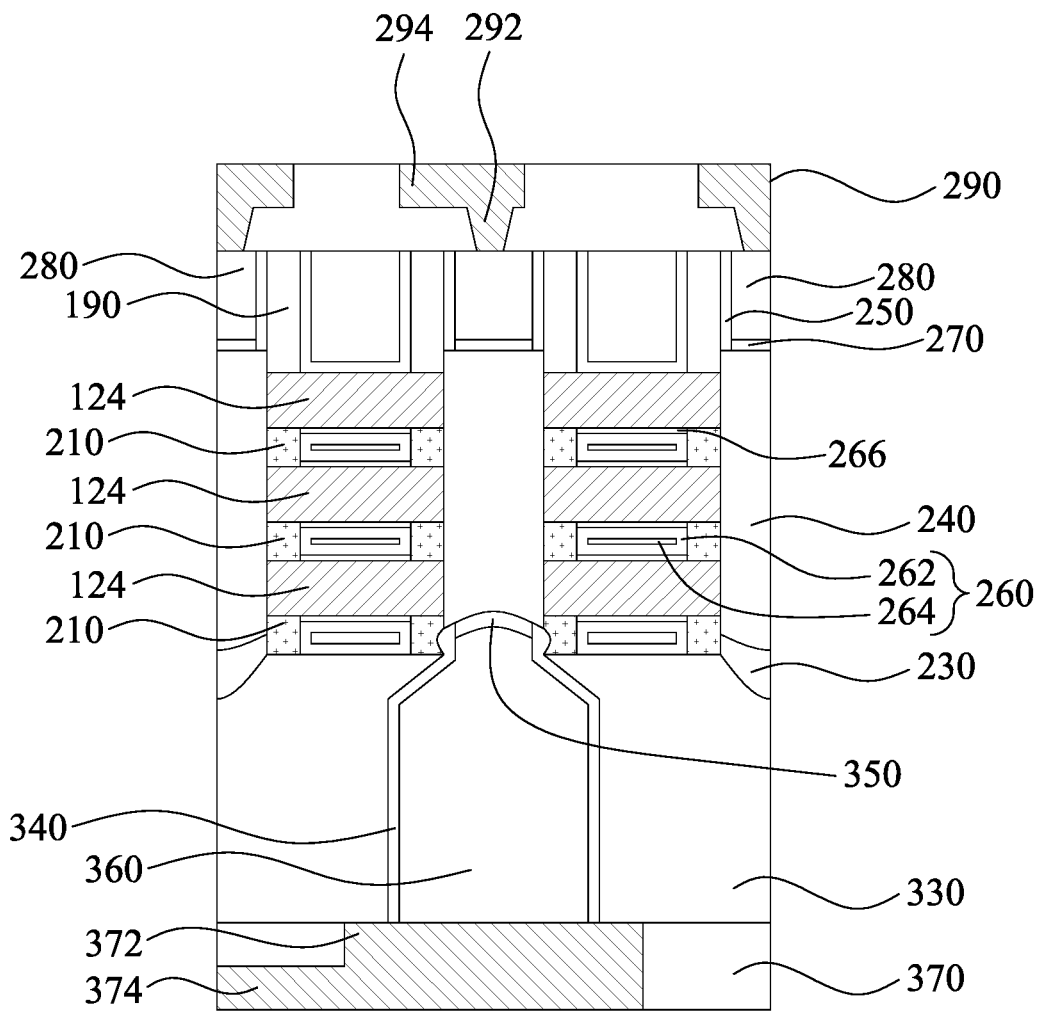
FIG. 21B is a cross-sectional view taken along line B-B in FIG. 21A.
Figure 21B:
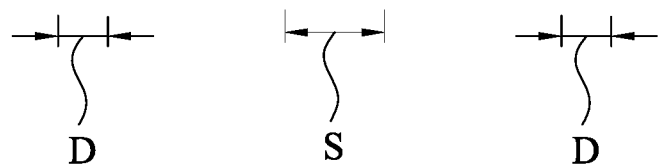
Figure 21C:
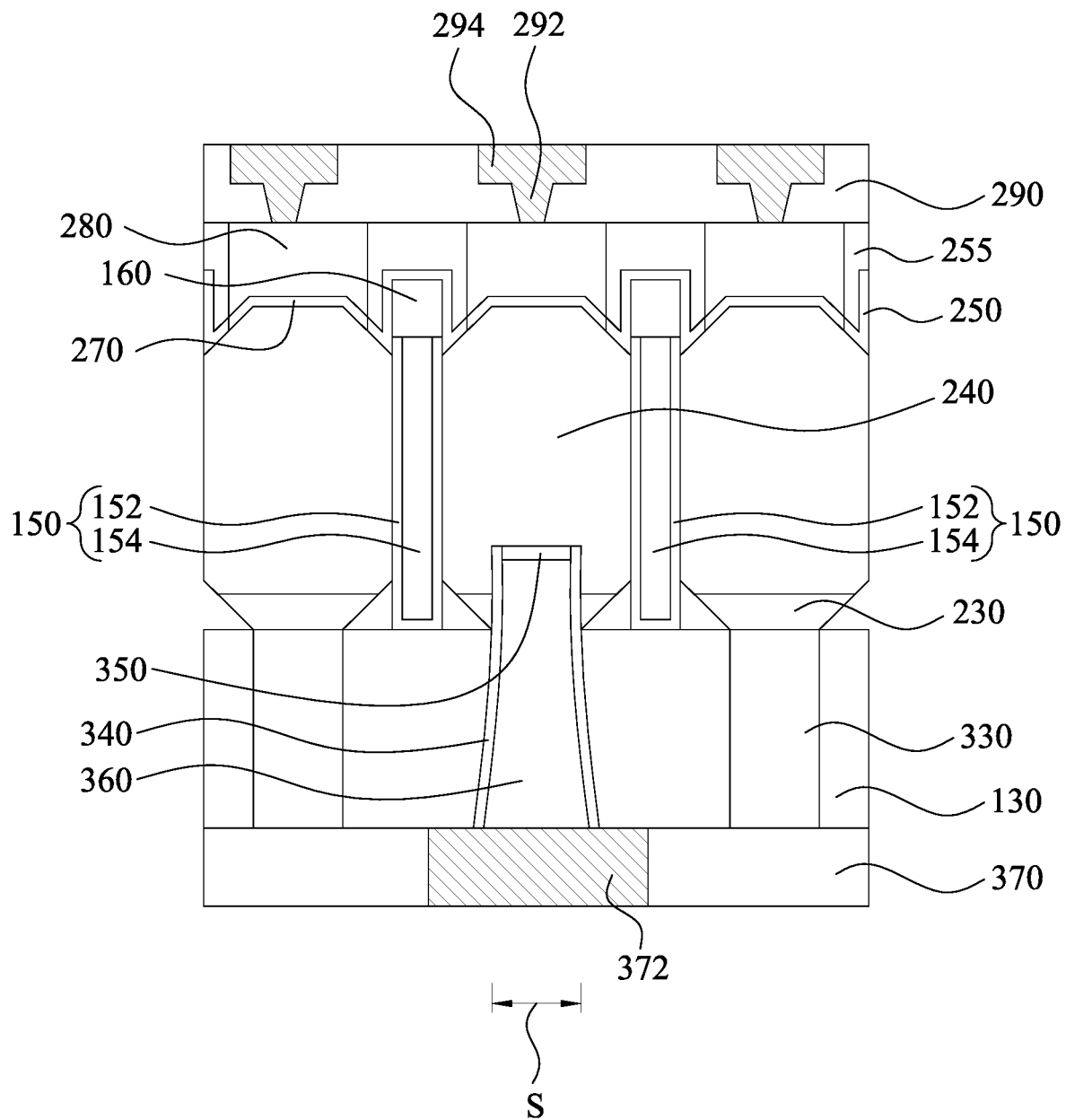
FIG. 21C is a cross-sectional view taken along line C-C in FIG. 21A.
Figure 21D:
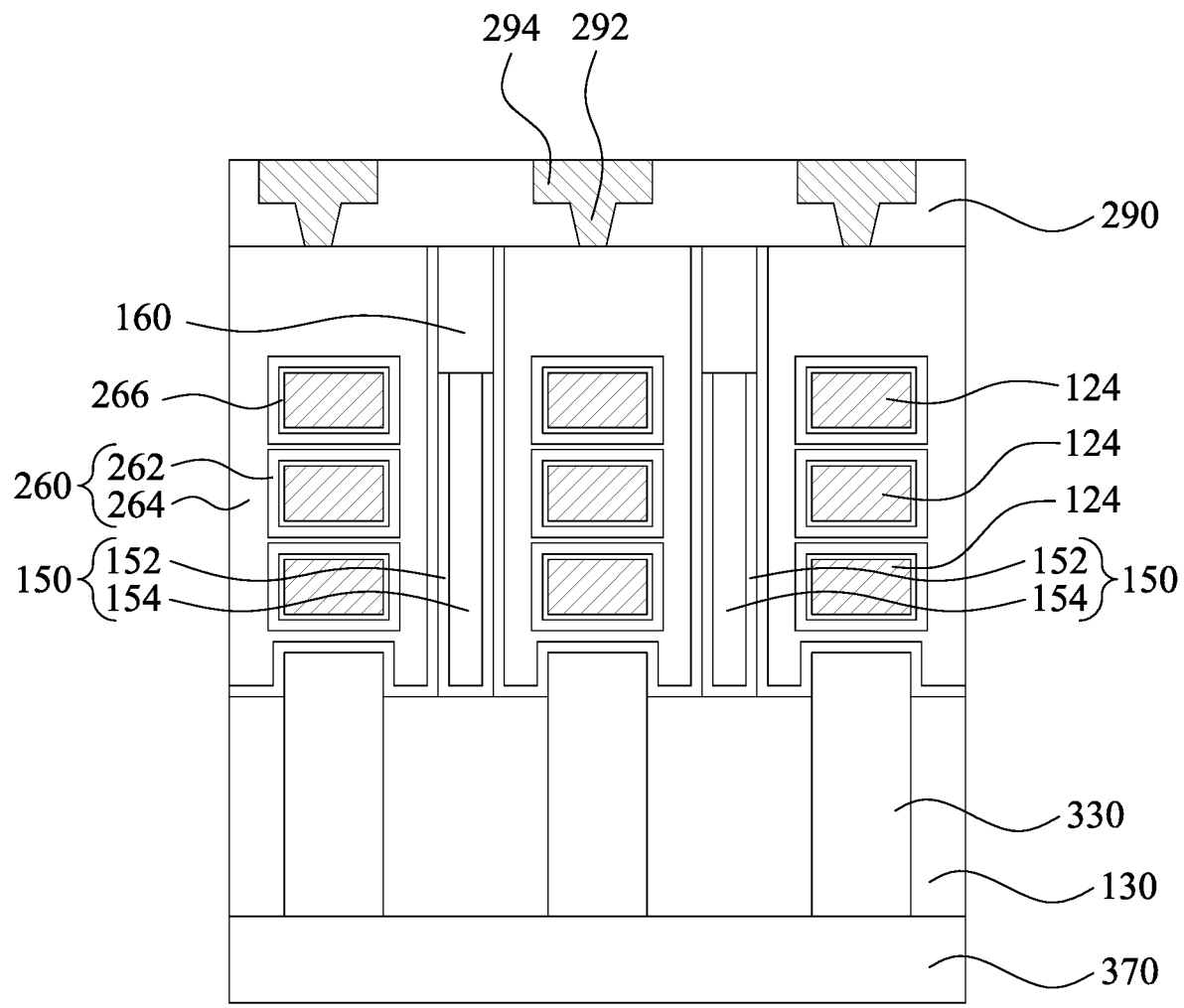
FIG. 21D is a cross-sectional view taken along line D-D in FIG. 21A.

FIG. 21A is a perspective view of a semiconductor device in accordance with some embodiments of the present disclosure, FIG. 21B is a cross-sectional view taken along line B-B in FIG. 21A, FIG. 21C is a cross-sectional view taken along line C-C in FIG. 21A, and FIG. 21D is a cross-sectional view taken along line D-D in FIG. 21A. The difference between the semiconductor devices in FIGS. 21A-21D and in FIGS. 20A-20E pertains to the presence of the sidewall spacers 310. In FIGS. 21A-21D, the sidewall spacers 310 (see FIGS. 20A-20E) are omitted. Other relevant structural details of the semiconductor devices in FIGS. 21A-21D are similar or substantially the same as the semiconductor devices in FIGS. 20A-20E, and, therefore, a description in this regard will not be repeated hereinafter.

According to some embodiments, a semiconductor device includes a gate structure, a source/drain epitaxial structure, a front-side interconnection structure, a backside via, an isolation material, and a sidewall spacer. The source/drain epitaxial structure is on a side of the gate structure. The front-side interconnection structure is on a front-side of the source/drain epitaxial structure. The backside via is connected to a backside of the source/drain epitaxial structure. The isolation material is on a side of the backside via and in contact with the gate structure. The sidewall spacer is sandwiched between the backside via and the isolation material. A height of the isolation material is greater than a height of the sidewall spacer.

According to some embodiments, a semiconductor device includes a plurality of channel layers, a gate structure, a first source/drain epitaxial structure, an inner spacer, a backside via, a sidewall spacer, and an isolation material. The channel layers are arranged one above another in a spaced apart manner. The gate structure surrounds each of the plurality of channel layers. The first source/drain epitaxial structure is on a side of the gate structure and is connected to the channel layers. The inner spacer is between the gate structure and the first source/drain epitaxial structure. The backside via is connected to a backside of the first source/drain epitaxial structure. The sidewall spacer is in contact with the gate structure and on a side of the backside via. The isolation material is on the side of the backside via and is in contact with the gate structure and the sidewall spacer.

According to some embodiments, a method includes etching a recess in a substrate. A sacrificial epitaxial plug is formed in the recess in the substrate. A source/drain epitaxial structure is formed over the sacrificial epitaxial plug. A gate structure is formed on a side of the source/drain epitaxial structure. The substrate is removed such that the sacrificial epitaxial plug protrudes from a backside of the source/drain epitaxial structure. A sidewall spacer is formed on a side of the sacrificial epitaxial plug, such that a portion of the sacrificial epitaxial plug is exposed by the sidewall spacer. A sacrificial epitaxial structure is formed on the portion of the sacrificial epitaxial plug exposed by the sidewall spacer. An isolation material is formed on a side of the sacrificial epitaxial structure and the sidewall spacer. The sacrificial epitaxial plug and the sacrificial epitaxial structure are replaced with a backside via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure;
   a source/drain epitaxial structure on a side of the gate structure;
   a front-side interconnection structure on a front-side of the source/drain epitaxial structure;
   a backside via connected to a backside of the source/drain epitaxial structure;
   an isolation material on a side of the backside via and in contact with the gate structure; and
   a sidewall spacer sandwiched between the backside via and the isolation material, wherein a height of the isolation material is greater than a height of the sidewall spacer.

2. The semiconductor device of claim 1, further comprising a backside contact etch stop layer (CESL) conformal to a sidewall of the backside via.

3. The semiconductor device of claim 2, wherein the backside CESL is in contact with the isolation material and the sidewall spacer.

4. The semiconductor device of claim 1, wherein the backside via comprises:
   a first portion; and
   a second portion wider than the first portion, wherein the first portion is between the second portion and the source/drain epitaxial structure.

5. The semiconductor device of claim 4, further comprising a metal alloy layer in contact with the first portion of the backside via and the source/drain epitaxial structure.

6. The semiconductor device of claim 4, wherein the sidewall spacer is offset from the second portion of the backside via and aligned with the first portion of the backside via.

7. The semiconductor device of claim 1, further comprising an inner spacer between the gate structure and the backside via.

8. The semiconductor device of claim 7, wherein the sidewall spacer is in contact with the inner spacer.

9. The semiconductor device of claim 8, wherein the isolation material is in contact with the inner spacer.

10. A semiconductor device, comprising:
    a plurality of channel layers arranged one above another in a spaced apart manner;
    a gate structure surrounding each of the plurality of channel layers;
    a first source/drain epitaxial structure on a side of the gate structure and connected to the channel layers;
    an inner spacer between the gate structure and the first source/drain epitaxial structure;
    a backside via connected to a backside of the first source/drain epitaxial structure;
    a sidewall spacer in contact with the gate structure and on a side of the backside via; and
    an isolation material on the side of the backside via and in contact with the gate structure and the sidewall spacer.

11. The semiconductor device of claim 10, wherein the sidewall spacer is further in contact with the inner spacer.

12. The semiconductor device of claim 10, further comprising a second source/drain epitaxial structure on another side of the gate structure and connected to the channel layers, and the sidewall spacer is further in contact with the second source/drain epitaxial structure.

13. The semiconductor device of claim 10, further comprising a second source/drain epitaxial structure on another side of the gate structure and connected to the channel layers, and the isolation material is further in contact with the second source/drain epitaxial structure.

14. The semiconductor device of claim 10, wherein a topmost surface of the sidewall spacer is higher than a bottommost surface of the gate structure.

15. The semiconductor device of claim 10, further comprising a dummy fin structure adjacent to the gate structure and the first source/drain epitaxial structure and spaced apart from the sidewall spacer.

16. A method comprising:
    etching a recess in a substrate;
    forming a sacrificial epitaxial plug in the recess in the substrate;
    forming a source/drain epitaxial structure over the sacrificial epitaxial plug;
    forming a gate structure on a side of the source/drain epitaxial structure;
    removing the substrate such that the sacrificial epitaxial plug protrudes from a backside of the source/drain epitaxial structure;
    forming a sidewall spacer on a side of the sacrificial epitaxial plug, such that a portion of the sacrificial epitaxial plug is exposed by the sidewall spacer;
    forming a sacrificial epitaxial structure on the portion of the sacrificial epitaxial plug exposed by the sidewall spacer;
    forming an isolation material on a side of the sacrificial epitaxial structure and the sidewall spacer; and
    replacing the sacrificial epitaxial plug and the sacrificial epitaxial structure with a backside via.

17. The method of claim 16, further comprising forming an isolation structure in the substrate prior to etching the recess in the substrate.

18. The method of claim 17, wherein forming the sidewall spacer is such that the sidewall spacer is in contact with the isolation structure.

19. The method of claim 16, wherein forming the sidewall spacer comprises:
    forming a blanket dielectric layer over and conformal to sidewalls of the sacrificial epitaxial plug; and
    etching back the blanket dielectric layer to form the sidewall spacer.

20. The method of claim 16, wherein forming the isolation material is such that the isolation material is spaced apart from the sacrificial epitaxial plug.

\* \* \* \* \*